(12) United States Patent
Okuyama et al.

(10) Patent No.: US 6,870,190 B2
(45) Date of Patent: Mar. 22, 2005

(54) DISPLAY UNIT AND SEMICONDUCTOR LIGHT EMITTING DEVICE

(75) Inventors: Hiroyuki Okuyama, Kanagawa (JP); Masato Doi, Kanagawa (JP); Goshi Biwa, Kanagawa (JP); Toyoharu Oohata, Kanagawa (JP); Masaru Minami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/092,687

(22) Filed: Mar. 6, 2002

(65) Prior Publication Data

US 2002/0171089 A1 Nov. 21, 2002

(30) Foreign Application Priority Data

Mar. 6, 2001 (JP) .................................. P2001-062206
Nov. 28, 2001 (JP) .................................. P2001-362444

(51) Int. Cl.⁷ .............................................. H01L 27/15
(52) U.S. Cl. ......................................... 257/79; 257/89
(58) Field of Search ............................ 257/79, 88, 89, 257/95, 96, 98

(56) References Cited

U.S. PATENT DOCUMENTS

| | | | |
|---|---|---|---|
| 5,177,405 A | | 1/1993 | Kusuda et al. |
| 5,981,977 A | | 11/1999 | Furukawa et al. |
| 6,348,096 B1 | | 2/2002 | Kunakawa et al. |
| 6,515,304 B1 | * | 2/2003 | Kash et al. .................... 257/79 |
| 6,555,845 B2 | | 4/2003 | Sunakawa et al. |
| 2002/0066403 A1 | | 6/2002 | Sunakawa et al. |
| 2002/0145150 A1 | * | 10/2002 | Okuyama et al. ............. 257/91 |

FOREIGN PATENT DOCUMENTS

| | | |
|---|---|---|
| JP | 56-92577 | 7/1981 |
| JP | 57-45583 | 3/1982 |
| JP | 57-52071 | 3/1982 |
| JP | 57-52072 | 3/1982 |
| JP | 57-52073 | 3/1982 |
| JP | 58-50577 | 3/1983 |

(List continued on next page.)

OTHER PUBLICATIONS

English language translation of Nakamura (Japanese Kokai 9–162444). Jan. 2004.*

Zheleva et al., *Pendeo–epitaxy—a new approach for lateral growth of gallium nitride structures*, MRS Internet J. Nitride Semicond. Res. 4S1, G3.38 (1999).

(List continued on next page.)

*Primary Examiner*—Mark V. Prenty
(74) *Attorney, Agent, or Firm*—Bell, Boyd & Lloyd LLC

(57) ABSTRACT

A display unit and semiconductor light emitting devices are provided. The display unit includes a number of the semiconductor light emitting devices arrayed on a base body, wherein each of the semiconductor light emitting devices is formed together with dummy devices for setting an emission wavelength of the semiconductor light emitting device, and the semiconductor light emitting device is formed by selective growth, and one conductive layer is formed in self-alignment on planes grown from tilt planes formed by selective growth. Such a display unit has a structure suitable for multi-colors without increasing the number of production steps.

24 Claims, 28 Drawing Sheets

FOREIGN PATENT DOCUMENTS

| | | |
|---|---|---|
| JP | 61-156780 | 7/1986 |
| JP | 63-188938 | 8/1988 |
| JP | 01-149491 | 6/1989 |
| JP | 2-263668 | 10/1990 |
| JP | 03-035568 | 2/1991 |
| JP | 6-45648 | 2/1994 |
| JP | 06-067044 | 3/1994 |
| JP | 07-199829 | 4/1995 |
| JP | 07-283438 | 10/1995 |
| JP | 08-008217 | 1/1996 |
| JP | 08/274376 | 10/1996 |
| JP | 9-92881 | 4/1997 |
| JP | 9-129974 | 5/1997 |
| JP | 9-162444 | 6/1997 |
| JP | 09-274455 | 10/1997 |
| JP | 10-125929 | 5/1998 |
| JP | 10-270801 | 10/1998 |
| JP | 10-312971 | 11/1998 |
| JP | 11-26883 | 1/1999 |
| JP | 11-075019 | 3/1999 |
| JP | 11-177138 | 7/1999 |
| JP | 11-251253 | 9/1999 |
| JP | 11-312840 | 11/1999 |
| JP | 11-329745 | 11/1999 |
| JP | 11-514136 | 11/1999 |
| JP | 11-346004 | 12/1999 |
| JP | 2000-068593 | 3/2000 |
| JP | 2000-183451 | 6/2000 |
| JP | 2000-223417 | 8/2000 |
| JP | 2000-332343 | 11/2000 |
| JP | 2001-085738 | 3/2001 |
| JP | 2001-184921 | 7/2001 |
| JP | 2001-217503 | 8/2001 |
| JP | 2002-185660 | 12/2002 |
| WO | WO 97/44612 | 11/1997 |

OTHER PUBLICATIONS

Kapolnek et al., *Spatial control of InGaN luminescence by MOCVD selective epitaxy*, Journal of Crystal Growth, 189/190 (1998) pp. 83–86.

Journal of Crystal Growth 189/190 (1998), "Spatial Control Of InGaN Luminescence By MOCVD Selective Epitaxy", D. Kapolnek, S. Keller, R.D. Underwood, S.P. DenBaars, U.K. Mishra, pp. 83–86.

* cited by examiner

LASER

DISPLAY UNIT AND SEMICONDUCTOR LIGHT EMITTING DEVICE

BACKGROUND OF THE INVENTION

The present invention relates to a display unit and a semiconductor light emitting device. More particularly, the present invention relates to a display unit and a semiconductor light emitting device, which are fabricated using wurtzite type compound semiconductor layers such as GaN based semiconductor layers.

Conventionally, a semiconductor light emitting device of this type has been fabricated by forming a low temperature buffer layer overall on a sapphire substrate, forming an n-side contact layer made from Si-doped GaN thereon, and stacking, on the n-side contact layer, an n-side cladding layer made from Si-doped GaN, an active layer made from Si-doped InGaN, a p-side cladding layer made from Mg-doped AlGaN, and a p-side contact layer made from Mg-doped GaN. Commercial products of semiconductor light emitting devices having the above-described structure have been fabricated on a large scale. Examples of these commercial products are light emitting diodes and semiconductor lasers allowing emission of light of blue and green in a wavelength range of 450 nm to 530 nm.

A sapphire substrate has often been used for growing gallium nitride thereon. However, dislocations may occur in the crystal, at a high density, due to mismatches between the crystal lattices of the sapphire substrate and gallium nitride. A technique for forming a low temperature buffer layer on a substrate is one way of suppressing such defects occurring during crystal growth. In a method disclosed in Japanese Patent Laid-open No. Hei 10-312971, general crystal growth is combined with selective crystal growth in the lateral direction (ELO: Epitaxial Lateral Overgrowth) for reducing crystal defects. The method of fabricating a semiconductor light emitting device disclosed in Japanese Patent Laid-open No. Hei 10-312971 has also described that through-dislocations propagated in the direction perpendicular to a principal plane of a substrate are bent in the lateral direction by a facet structure formed in a growth region during fabrication and are thereby prevented from being further propagated, thereby reducing crystal defects.

A light emitting unit, used as an image display unit, can be configured such that pixels, each of which is composed of a combination of light emitting diodes or semiconductor laser devices allowing emission of light of blue, green and red, are arrayed in a matrix, wherein the pixels are independently driven. Such a light emitting unit is also capable of being used as a white light emitting unit or an illumination unit by allowing all of the light emitting devices to simultaneously emit light of blue, green, and red. In particular, since a light emitting device using a nitride semiconductor has a band gap energy ranging from about 1.9 eV to about 6.2 eV, a full-color display unit can be realized by using semiconductor light emitting layers made from only one kind of material. For this reason, research on a multi-color light emitting device using a nitride semiconductor has been actively pursued.

A technique of forming a multi-color light emitting device on the same substrate is also known. Using this technique, a number of active layers having different band gap energies corresponding to different emission wavelengths are stacked, and electrodes on the substrate side are made as a common electrode and electrodes on the other side are individually provided for light of different colors. In particular, it is known that a multi-color light emitting device having a structure with respective steps, which are stepwise formed on the surface side of a substrate for extraction of electrodes, are provided for light of respective colors. However, such a multi-color light emitting device in which a number of pn-junction layers are stacked has a disadvantage in that the light emission regions in the same device may act as a thyristor. To prevent this thyristor action, a multi-color light emitting device has been disclosed, for example, in Japanese Patent Laid-open No. Hei 9-162444, wherein grooves are formed between one and another of stepwise light emission regions for isolating the light emission regions from each other. On the other hand, a light emitting device disclosed in Japanese Patent Laid-open No. Hei 9-92881 is configured such that an InGaN layer is formed on an alumina substrate via an AlN buffer layer, wherein a portion of the InGaN layer is doped with Al to form a blue light emission region, another portion of the InGaN layer is doped with P to form a red light emission region, and a non-doped portion of the InGaN layer is taken as a green light emission region, thereby realizing multi-color light emission.

The above-described methods, however, have the following problems. Namely, the method using selective crystal growth in the lateral direction and the crystal growth method for forming a facet structure in a growth region in order to reduce through-dislocations propagated from a substrate are disadvantageous in that, in a subsequent step, the selective crystal growth in the lateral direction is sufficiently performed or the facet structure is buried in order to form a light emission region such as an active layer. As a result, the number of processing steps is increased and a time required for fabricating the device is prolonged.

The above-described semiconductor light emitting devices for emission of light of multi-colors have the following problems. Namely, since the processing steps become complicated, the light emitting device cannot be accurately formed, and since the crystallinity is degraded, a light emitting device with desirable light emission characteristics cannot be obtained. To be more specific, in the multi-color light emitting device in which grooves are formed between one and another of the stepwise light emission regions for isolating the active layer regions from each other, anisotropic etching must be repeated several times to isolate the active layer regions from each other. Such repeated anisotropic etching is undesirable because the crystallinity of each of the substrate and the semiconductor layer may be generally degraded by dry etching. As a result, it is difficult to keep good crystallinity. Also, the number of steps required for mask alignment and etching is increased. In the multi-color light emitting device in which impurities are selectively doped in the single active layer formed on the substrate, since a margin must be provided for forming an opening portion in the mask layer, a sufficient distance must be set between one and another of the different light emission regions, particularly, in the case of previously estimating a fabrication error, so that it is difficult to form a micro-size light emitting device, and the number of steps is increased by selective doping.

On the other hand, a method is known for fabricating a semiconductor light emitting device in a fine region by forming a layer of a nitride based semiconductor such as GaN into a pyramid shape by selective growth. In particular, a method of fabricating a light emitting device by forming a hexagonal pyramid shaped nitride based semiconductor layer by selective growth has been disclosed, for example, in "Spatial Control of InGaN Luminescence by MOCVD Selective Epitaxy, D. Kapolnek et al., Journal of Crystal Growth, 189/190 (1998) 83–86". According to the selective growth technique described in this document, a number of nitride based semiconductor light emitting devices, each of which is composed of a fine hexagonal pyramid shaped GaN/InGaN layer structure, can be formed. In a process disclosed in this document, it has been described that an emission wavelength is controlled on the basis of a spacing factor. The document, however, does not describe a definite method for fabricating an image display unit configured such that devices, which allow emission of light of different colors, for example, red, green and blue, are arrayed so as to realize emission of light of multi-colors.

SUMMARY OF THE INVENTION

An object of the present invention is, therefore, to provide a display unit having a structure suitable for emission of light of multi-colors without increasing the number of fabrication steps, and a semiconductor light emitting device used therefor.

According to an embodiment of the present invention a display unit is provided. The display unit includes a number of semiconductor light emitting devices arrayed on a base body. Each of the number of semiconductor light emitting devices is formed by selective growth and has a structure such that at least a periphery thereof is surrounded by planes grown from tilt planes tilted from a principal plane of the base body. Further, one conductive layer is formed in self-alignment on the planes grown from the tilt planes.

To form the number of semiconductor light emitting devices on a substrate, tilt planes tilted from a principal plane of the substrate are first formed by selective growth, and then planes are grown from the tilt planes, whereby at least periphery of the device is surrounded by the planes grown from the tilt planes. Accordingly, a conductive layer is formed in self-alignment on the planes grown from the tilt planes such as to be terminated on an insulating film or the like used as a mask for selective growth. As a result, device isolation is not required or easily formed at the time of formation of electrodes, thereby reducing the number of steps needed for fabricating the display unit.

According to another embodiment of the present invention, a display unit is provided. The display unit includes semiconductor light emitting devices and a dummy device, formed together with each of the semiconductor light emitting devices, for determining an emission wavelength of the semiconductor light emitting device. The dummy device is preferably disposed around each of the semiconductor light emitting devices. The dummy devices may be formed in the same fabrication step as that for fabricating the semiconductor light emitting devices. An emission wavelength of each of the semiconductor light emitting devices is preferably changed depending on a distance between the semiconductor light emitting device and the dummy device.

According yet another embodiment of the present invention, a display unit is provided. The display unit includes at least two kinds of semiconductor light emitting devices having different emission wavelengths and which are formed by the same crystal growth layer formed on the same base body. Electrodes on the base body side are taken as a common electrode. With this configuration, since the at least two kinds of semiconductor light emitting devices having different emission wavelengths are formed by the same crystal growth layer formed on the same base body, devices having different emission wavelengths can be formed on the same base body by the same crystal growth process. The emission wavelength of one of the semiconductor light emitting devices preferably is different from that of another of the semiconductor light emitting devices based on at least one of a difference between the two semiconductor light emitting devices in positional relationship between the semiconductor light emitting device and a dummy device and a difference between the two semiconductor light emitting devices in shape of the semiconductor light emitting device.

According an embodiment of the present invention, a display unit is provided. The display unit includes a number of semiconductor light emitting devices arrayed on a base body. Each semiconductor light emitting device has a light permeable region that is formed in a boundary region between two of the number of semiconductor light emitting devices. The light permeable region allows light emitted from the back surface side to pass therethrough. With this configuration, even for a display unit fabricated by overlapping the base bodies to each other, light emitted from the semiconductor light emitting devices formed on the base body on the back surface side emerges to the front surface side via the light permeable regions.

According another embodiment of the present invention, a semiconductor light emitting device is provided. The display unit includes dummy devices having a similar structure, which are formed around the semiconductor light emitting device. With this configuration, since the dummy devices are formed around the semiconductor light emitting device, an emission wavelength of the semiconductor light emitting device can be changed by the presence of the dummy devices without changing the structure of the semiconductor light emitting device. By using such dummy devices, a multi-color display unit including a number of light emitting devices having the same layer structure can be easily realized.

Additional features and advantages of the present invention are described in, and will be apparent from, the following Detailed Description of the Invention and the Figures.

DETAILED DESCRIPTION OF THE INVENTION

Figure 1:
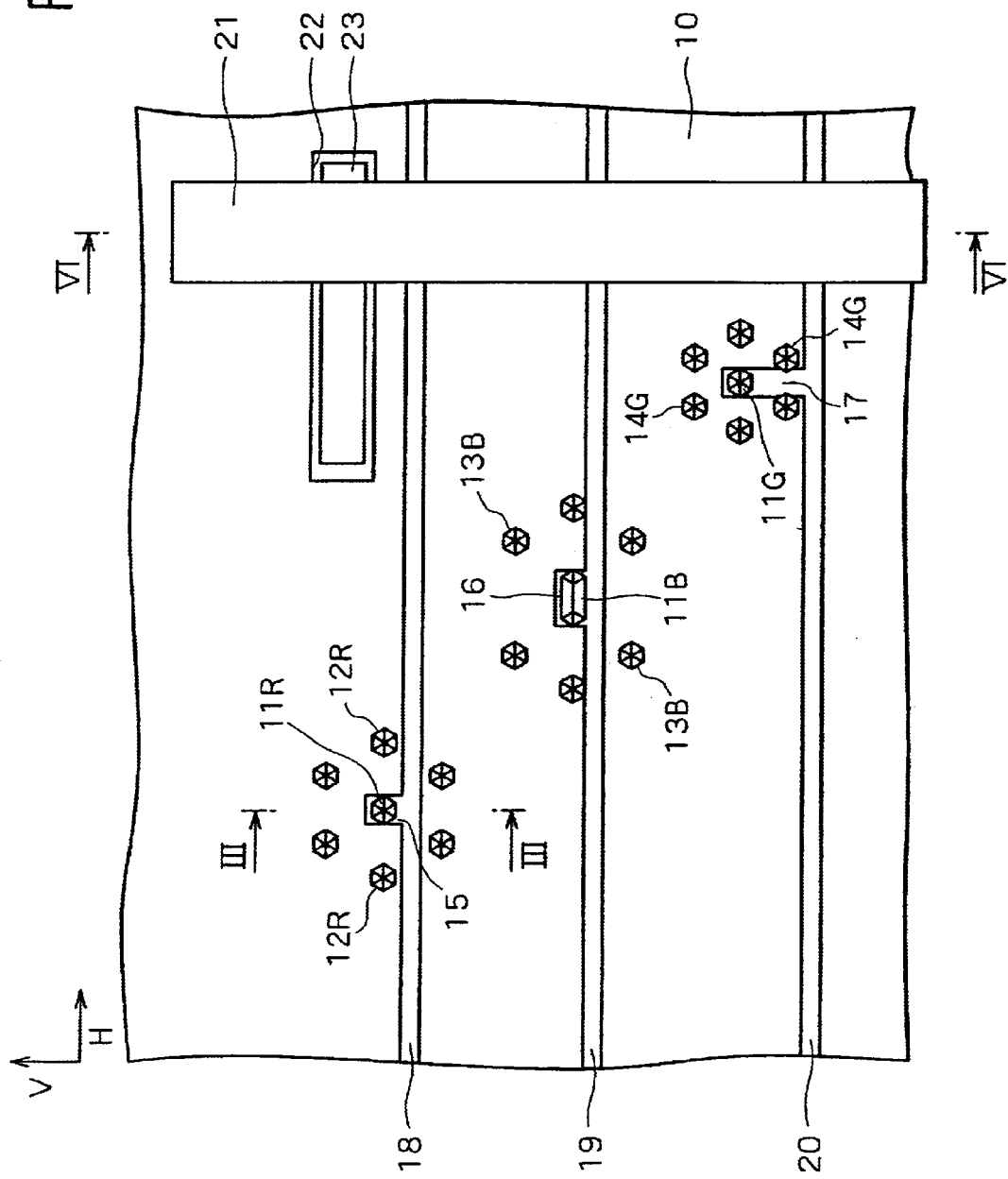
FIG. 1 is a plan view showing a device layout of one pixel portion of a display unit According to a first embodiment of the present invention.

A display unit according to an embodiment of the present invention includes a number of semiconductor light emitting devices arrayed on a base body. Each of the semiconductor light emitting devices is formed together with a dummy device for setting an emission wavelength of the semiconductor light emitting device. Preferably, each semiconductor light emitting device is formed by selective growth and at least a periphery thereof is surrounded by planes grown from tilt planes tilted from a principal plane of the base body, and one conductive layer is formed in self-alignment on the planes grown from the tilt planes.

First, each of the semiconductor light emitting devices forming the display unit according to an embodiment of the present invention will be described.

The base body used for the semiconductor light emitting device of the present invention is not particularly limited insofar as a wurtzite type compound semiconductor layer can be formed thereon. For example, as the base body, there can be used a substrate made from sapphire ($Al_2O_3$, whose desirable crystal plane is an A-plane, R-plane, or C-plane), SiC (having a structure of 6H, 4H or 3C), GaN, Si, ZnS, ZnO, AlN, LiMgO, $LiGaO_2$, GaAs, $MgAl_2O_4$, or InAlGaN. Preferably, the material used for forming the base body has a hexagonal or cubic system, and more preferably, has the hexagonal system. When using a sapphire substrate, preferably a sapphire substrate with the C-plane of sapphire taken as a principal plane thereof, which has often been used for growing a gallium nitride (GaN) based compound semiconductor thereon, is used. It is to be noted that the C-plane of sapphire taken as the principal plane of the substrate used herein may include a plane tilted from the strict C-plane by an angle ranging from about 5° to about 6°. A silicon substrate, which has been widely used for fabricating a semiconductor device, may also be used as the base body on which a semiconductor layer having tilt planes is to be formed.

It is noted that the plane terminology (e.g., S-plane, C-plane or the like) as used herein denotes crystal planes in accordance with Miller indices of a hexagonal crystal system. Where appropriate, throughout the specification, these planes are intended to include more than one plane in the hexagonal crystal system. For example, the S-plane is listed above as corresponding to the (1-101) plane, but it should be understood that, where appropriate, the S-plane is intended to include one or more of the planes relating to the family of planes making up a crystal structure having the S-plane. For example, if the crystal structure being described is a hexagonal pyramid having the S-plane, planes corresponding to each side face of the hexagonal pyramid would be included in the family of planes denoted by the S-plane. For example, in addition to the (1-101) plane, a hexagonal pyramid has side faces corresponding to the (10-11), (01-11), (−1101) and (0-111) planes.

A compound semiconductor layer is formed on the principal plane of the above-described substrate. The compound semiconductor layer is preferably made from a wurtzite type compound semiconductor such that a facet structure may be formed thereon in a subsequent step. The compound semiconductor layer may be made from a nitride semiconductor having a wurtzite type crystal structure, a BeMgZnCdS based semiconductor, a BeMgZnCdO based compound semiconductor, or the like. As the above nitride semiconductor having a wurtzite type crystal structure, a group III based compound semiconductor may be used, for example, a gallium nitride (GaN) based compound semiconductor, an aluminum nitride (AlN) based compound semiconductor, an indium nitride (InN) based compound semiconductor, an indium gallium nitride (InGaN) based compound semiconductor, an aluminum gallium nitride (AlGaN) based compound semiconductor, or the like. Preferably, a gallium nitride based compound semiconductor is used. In one embodiment, an undoped GaN layer may be formed on a sapphire substrate and a Si-doped GaN layer be formed thereon. It is to be noted that, in the present invention, InGaN, AlGaN, GaN or the like does not necessarily mean a nitride semiconductor having only a strict ternary or binary mixed crystal structure. For example, InGaN can contain an impurity such as a trace of Al in a range not changing the function of InGaN without departing from the scope of the present invention. In this specification, the term "nitride" describes a compound which contains one or more of B, Al, Ga, In, and Ta as the group III elements and N as the group V element, and which may contain impurities in an amount of about 1% of the total amount or less, or about $1 \times 10^{20}$ cm$^3$ or less.

In an embodiment, the above-described compound semiconductor layer may be grown by one of various vapor phase growth processes, for example, a metal organic chemical vapor deposition (MOCVD) (including a metal organic vapor phase epitaxial (MOVPE) growth process), a molecular beam epitaxial growth (MBE) process, a hydride vapor phase epitaxial growth (HVPE) process, or the like. The MOVPE process is advantageous in growing the compound semiconductor layer with good crystallinity at a high processing rate. In the MOVPE process, alkyl metal compounds are typically used as Ga, Al and In sources. Preferably, TMG (trimethyl gallium) or TEG (triethyl gallium) is used as the Ga source, TMA (trimethyl aluminum) or TEA (triethyl aluminum) is used as the Al source, and TMI (trimethyl indium) or TEI (triethyl indium) is used as the In source. Further, in the MOVPE process, a gas such as ammonia, hydrazine, or the like may be used as a nitrogen source while and silane gas or the like may be used as an Si (impurity) source. Also, germanium gas or the like may be used as a Ge (impurity) source, Cp2Mg (cyclopentadienyl magnesium) or the like may be used as a Mg (impurity) source, and a DEZ (diethyl zinc) gas or the like may be used as a Zn (impurity) source. According to the MOVPE process, for example, an InAlGaN based compound semiconductor layer can be formed on a substrate by epitaxial growth by supplying the above gases to a front surface of the substrate heated, for example, at 600° C. or more, to decompose the gases.

According to an embodiment of the semiconductor light emitting device of the present invention, to form a facet structure having tilt planes tilted from the principal plane of the base body by crystal growth, a mask or a difference-in-height portion is formed on or in a surface of the above-described compound semiconductor layer as the under layer for crystal growth. The mask is a growth obstruction film formed on a buffer layer or another layer as the compound semiconductor layer formed on the base body, or may be directly formed on the principal plane of the base body. The mask is preferably formed by an insulating film made from silicon oxide or silicon nitride. When forming a facet structure by making use of a difference-in-height portion, crystal may be grown by making use of the difference-in-height portion such that a growth rate of a crystal plane appearing on the base body (i.e., a crystal plane perpendicular to the principal plane of the base body) is different from a growth rate of a crystal plane parallel to the principal plane of the base body, to form a facet structure. The difference-in-height portion can be formed, after the compound semiconductor layer is formed on the overall surface, in the compound semiconductor layer by photolithography and anisotropic etching using a mask made from silicon oxide or silicon nitride. The shape of the mask pattern or the difference-in-height portion is not particularly limited insofar as the mask or the difference-in-height portion allows formation of a facet structure having tilt planes tilted from the principal plane of the base body. For example, the mask pattern or the difference-in-height may be formed into a shape selected from a stripe shape, a rectangular shape, a round shape, an elliptic shape, and a polygonal shape such as a triangular shape, a pentagonal shape or a hexagonal shape. The shape of the difference-in-height portion describes the planar shape of the difference-in-height portion. For example, according to an embodiment of the present invention, the difference-in-height portion having a triangular shape includes not only the difference-in-height portion projecting into a triangular pole but also the difference-in-height portion recessed into a triangular pole. A number of different-in-height portions may be formed overall or partially on the surface of the compound semiconductor layer. In addition, different shaped difference-in-height portions may be formed in combination.

After formation of the mask or the different-in height portion for selective growth, a crystal growth layer including a facet structure having tilted planes is formed thereon by selective crystal growth in accordance with the same manner as that for forming the above-described compound semiconductor layer. For example, one of the various vapor phase growth processes described above may be used.

According to an embodiment of the semiconductor light emitting device of the present invention, when forming a crystal growth layer having a facet structure by crystal growth, each of the tilted planes tilted from the principal plane of the base body is preferably selected from an S-plane and a plane substantially equivalent thereto, and a (11-22) plane and a plane substantially equivalent thereto. A plane substantially equivalent to the S-plane includes a plane tilted from the S-plane at an angle ranging from about 5° to about 6°. For example, if the C-plane is selected as the principal plane of the base body, the S-planes or the planes substantially equivalent thereto can easily be formed. The S-plane is a stable plane which is relatively easily, selectively grown on the (C+)-plane. It is to be noted that the S-plane is expressed by a (1-101) plane in Miller indices for the hexagonal system. The (C+)-plane and (C−)-plane are present as the C-plane, and similarly, the (S+)-plane and (S−)-plane are present as the S-plane. According to the present invention, unless otherwise specified, the (S+)-plane, which is grown on the (C+)-plane of the GaN layer, is taken as the S-plane. The (S+)-plane is more stable than the (S−)-plane. In addition, the (C+)-plane is expressed by a (0001) plane in Miller indices.

When forming a crystal layer by growing a gallium nitride based compound semiconductor, the number of bonds of gallium (Ga), which are to be bonded to nitrogen (N), on the S-plane is two or three. The number of bonds of Ga to N on the S-plane is smaller than the number of bonds of Ga to N on the (C−)-plane but is larger than the number of bonds of Ga to N on any other crystal plane. Here, since the (C−)-plane cannot be actually formed on the (C+)-plane, the number of bonds of Ga to N on the S-plane becomes the largest. For example, when growing a wurtzite type nitride on a sapphire substrate with the (C+)-plane taken as the principal plane, a surface of the nitride generally becomes the (C+)-plane. However, the S-plane of the nitride can be stably formed by making use of selective growth. Nitrogen (N) is likely to be desorbed on a plane parallel to the (C+)-plane, and therefore, N is bonded to Ga by way of only one bond of Ga. On the other hand, on the tilted S-plane, N is bonded to Ga via at least one or more bonds of Ga. As a result, a V/III ratio of the stacked structure selectively grown on the S-plane is effectively increased to improve the crystallinity of the stacked structure selectively grown on the S-plane. Further, when growing a crystal growth layer along the direction different from the orientation of the principal plane of a substrate, since dislocations propagated upwardly from the substrate are bent, it is possible to reduce the occurrence of crystal defects.

The kind of tilt planes of a facet structure formed on the crystal growth layer is controlled by a growth condition at the time of crystal growth, and a shape of a difference-in-height portion. For example, where a difference-in-height portion extending in a stripe shape is formed in a surface of a gallium nitride based semiconductor layer, if the longitudinal direction of the stripe is a (11-20) direction, a facet structure having the S-planes as tilt planes is formed. In this case, the facet structure has an inverse V-shape in cross-section as viewed in the direction perpendicular to the longitudinal direction of the stripe. Since the shape of the difference-in-height portion is not limited to the stripe shape, the cross-section of the crystal growth layer can have any other shape than the stripe shape, for example, a rectangular shape, a round shape, a triangular shape, or a hexagonal shape. The crystal growth layer is grown depending on the shape of the difference-in-height portion. If the extending direction of an end portion of the difference-in-height portion is set to be approximately perpendicular to a (1-100) direction or the (11-20) direction, then a difference in growth rate between growth in the lateral direction and growth in the vertical direction appears, to obtain a facet structure.

A first conductive type cladding layer, an active layer, and a second conductive type cladding layer are stacked on the crystal growth layer having the facet structure such as to be located in a region extending in parallel to the tilt planes of the facet structure. As a result of observing a facet structure grown on a crystal growth layer by using cathode luminescence in an experiment performed by the present inventors, it was revealed that the S-plane as the tilt plane of the facet structure has desirable crystallinity and exhibits a higher luminous efficiency when compared with the (C+)-plane. In particular, a growth temperature for growing an InGaN active layer is set in a range of about 700° C. to about 800° C. At this temperature, a decomposition efficiency of ammonia is low, thereby requiring a large amount of an N source. As a result of observation of the surface of the tilt plane by AFM, it was found that the tilt plane has regular crystal steps and is thus suitable for incorporation of InGaN. Furthermore, the state of a growth surface of a Mg-doped layer at the AFM level is generally poor. However, it was found that the growth of the S-plane allows the Mg-doped layer to be grown in a desirable surface state and makes a doping condition for the Mg-doped layer very different from a doping condition for the Mg-doped layer on the (C+)-plane. When using microscopic photoluminescence mapping it was revealed that the surface of the layer doped with Mg formed on the (C+)-plane by the usual manner has an unevenness of a pitch of about 1 $\mu$m. However, when examining the surface of the Mg-doped layer formed on the S-plane obtained by selective growth, it was found to be even and measured at a resolution of about 0.5 $\mu$m to about 1 $\mu$m. Further, as a result of observation by SEM, it was revealed that the flatness of the tilted plane (i.e., the S-plane) is superior to that of the (C+)-plane.

With respect to the first conductive type cladding layer, the active layer, and the second conductive type cladding layer, which are stacked in the region extending in parallel to the tilt planes, the conductive type of the first conductive type cladding layer is a p-type or an n-type, and the conductive type of the second conductive type cladding layer is the n-type or the p-type. For example, in the case where a crystal growth layer having the S-planes is made from a silicon-doped gallium nitride based compound semiconductor, an n-type cladding layer may be made from the same silicon-doped gallium nitride based compound semiconductor, an InGaN layer be formed as an active layer thereon, and a magnesium-doped gallium nitride based compound semiconductor layer be formed as a p-type cladding layer thereon. Thus, a double hetero structure is formed. The active layer may have a structure in which an InGaN layer is held between AlGaN layers or an AlGaN layer is provided on one side of the InGan layer. The active layer may be a single bulk active layer. However, it may be of a quantum well structure such as a single quantum well (SQW) structure, a double quantum well (DQW) structure, or a multi-quantum well (MQW) structure. In the case of adopting the quantum well structure, one or more barrier layers are used for separating quantum wells from each other. The use of the InGaN layer as the active layer is advantageous in facilitating the fabricating process and enhancing a light emission characteristic of the device. Another advantage of the use of the InGaN layer is that the InGaN layer can be easily crystallized with desirable crystallinity on the S-plane having the structure from which nitrogen atoms are less adsorbed. As a result, the luminous efficiency can be enhanced. In addition, even in a state that a nitride semiconductor is not doped with an impurity, the conductive type of the nitride semiconductor becomes the n-type because of holes of nitrogen generated in crystal. However, the nitride semiconductor is generally doped with a doner impurity such as Si, Ge, or Se during crystal growth, to obtain an n-type nitride semiconductor having a desirable carrier concentration. On the other hand, a p-type nitride semiconductor is obtained by doping an acceptor impurity such as Mg, Zn, C, Be, Ca, or Ba in crystal. In this case, to obtain a p-type nitride semiconductor having a high carrier concentration, the nitride semiconductor having been doped with an acceptor impurity may be annealed in an inert gas atmosphere such as nitrogen or argon at a temperature or 400° C. or more, or activated by irradiation of electron beams, microwaves, or light.

The first conductive type cladding layer, the active layer, and the second conductive type cladding layer extend within planes parallel to the tilt planes. The formation of these layers within the planes parallel to the tilt planes can be easily performed by continuing the crystal growth after formation of a crystal layer having the tilt planes. The first conductive type cladding layer can be made from the same material having the same conductive type as that of a crystal layer having the S-planes. In this case, after formation of the crystal layer having the S-planes, the first conductive cladding layer may be formed by depositing the same material while continuously adjusting a concentration of source gases for depositing the material. Alternatively, the first conductive cladding layer may be configured as part of the crystal layer having the S-planes.

Electrodes are directly or indirectly connected to the first and second conductive type cladding layers with the active layer put therebetween. Each electrode is formed for each device. However, one of a p-type electrode and an n-type electrode is made common to a number of devices. To reduce a contact resistance, a specific contact layer may be formed and then an electrode may be formed on the contact layer. In general, respective electrodes are obtained by forming a multi-layer metal film by vapor-deposition, and then finely dividing the multi-layer metal film into electrode parts belonging to respective device regions by photolithography and lift-off. Each electrode can be formed on one side of a selective crystal growth layer or a substrate, or may be on each of both sides of a selective crystal growth layer or a substrate in order to realize higher density wiring of the electrodes. In addition, electrodes independently driven can be obtained by forming the same material film and finely patterning the film into electrode parts, or may be obtained by forming different electrode parts made from different materials in respective device regions.

According to an embodiment of the semiconductor light emitting device of the present invention, luminous efficiency can be enhanced by making use of the desirable crystallinity of the tilt planes (S-planes) formed by selective growth. In particular, in the case of injecting a current only in the S-plane with good crystallinity formed by a layer of a group III nitride based semiconductor, since the S-plane is excellent in incorporation of In and has good crystallinity, it is possible to enhance the luminous efficiency. To fabricate a multi-color light emitting device by using an InGaN layer as an active layer, indium (In) is required to be sufficiently incorporated as crystal. From this viewpoint, by forming the above InGaN active layer on the S-plane, the luminous efficiency of the device can be enhanced by making use of good crystallinity of the S-plane. The structure that the InGaN active layer is formed on the S-plane is also advantageous for emission of light of multi-colors. To be more specific, in the case of crystal growth on the (C+)-plane, gallium has only one bond, which is bonded to nitrogen that is likely to be desorbed. As a result, it is impossible to increase an effective V/III ratio by crystal growth of InGaN performed by using ammonia whose decomposition efficiency is low. Accordingly, many measures are required to form the InGaN layer with desirable crystallinity by crystal growth. Meanwhile, in the case of crystal growth on the S-plane, since the number of bonds of gallium to nitrogen on the S-plane is as large as two or three, the desorption of nitrogen becomes small and thereby the effective V/III ratio becomes high. In general, the quality of crystal grown on not only the S-plane but also any other plane than the (C+)-plane becomes high because the number of bonds of gallium to nitrogen tends to be increased for growth on any other crystal growth than the (C+)-plane. The growth of crystal on the S-plane is thus advantageous in that the amount of In incorporated in the crystal grown on the S-plane becomes high. The increased amount of In incorporated in crystal grown on the S-plane is effective for fabricating a multi-color light emitting device because a band gap energy is determined on the basis of the amount of In incorporated in crystal.

In an embodiment of the semiconductor light emitting device of the present invention, at least a periphery of the device is surrounded by tilt planes of a facet structure formed by selective growth, and one conductive layer is formed in self-alignment on planes grown from the tilt planes. Since the periphery of the device is surrounded by the tilt planes of the facet structure, the conductive layer is formed while being tiled with respect to the principal plane of the base body, and an end portion of the conductive layer is terminated on a mask or a difference-in-height portion used for selective growth. Accordingly, the conductive layer in each device region is formed in self-alignment only on the tilt plane portions. For example, for a device structure that a first conductive type cladding layer, an active layer, and a second conductive type cladding layer are formed in this order from the base body side, the second conductive type cladding layer is equivalent to the one conductive layer formed in self-alignment. The one conductive layer is, therefore, not required to be divided into parts belonging to respective device regions by etching. As a result, the light emitting devices can be arrayed at a high density.

According to an embodiment of the semiconductor light emitting device of the present invention, as will be described later, an emission wavelength of the semiconductor light emitting device can be controlled by disposing a specific dummy device. On the other hand, the emission wavelength of the semiconductor light emitting device can be controlled by changing at least one of a composition and a thickness of an active layer forming a light emission region of the semiconductor light emitting device. Only the composition or the thickness of the active layer may be changed, or both the composition and the thickness of active layer may be changed. The change in composition and/or thickness of an active layer can be used in combination with a dummy device (which will be described later) or may be caused by the use of a dummy device. The composition of an active layer of a semiconductor light emitting device can be adjusted by changing a mixing ratio of elements of a ternary or binary mixed crystal constituting the active layer. When using an InGaN layer as the active layer, a semiconductor light emitting device for emitting light of a long-wavelength can be obtained by increasing the amount of In contained in the active layer. In crystal growth of an InGaN layer, a migration length of InGaN, particularly, indium (In) is estimated to be about 1 μm to about 2 μm at about 700° C. optimum for crystal growth of the InGaN layer having a relatively large amount of In. This is because InGaN precipitated on a mask is grown from a selective growth portion only by about 1 μm to about 2 μm. The migration length of In may be thus regarded as about 1 μm to about 2 μm. Since the migration length of In in InGaN in a region from the mask portion to the growth portion is relatively short (i.e., about 1 μm to about 2 μm), the content of In or the thickness of InGaN may differ in such a region.

In an embodiment of the semiconductor light emitting device of the present invention, as will be described later, an emission wavelength of the semiconductor light emitting device can be controlled by changing a layout of dummy device. On the other hand, an emission wavelength of the semiconductor light emitting device can be also controlled by changing a shape of the light emitting device. The change of the shape of the light emitting device can be realized by changing a shape of an opening portion formed in a mask for selective growth. For example, a semiconductor light emitting device having a first emission wavelength may be formed by selective growth from a circular or regular hexagonal shaped opening portion, and a semiconductor light emitting device having a second emission wavelength different from the first emission wavelength be formed by selective growth from a band or stripe shaped opening portion. The change of the opening portion formed in a mask for selective growth can be used in combination with a dummy device (which will be described later). When forming a facet structure having tilt planes (S-planes) by selective growth from a stripe-shaped opening portion formed in a mask, a light emission region formed on the tilt planes is taken as a long-wavelength region, and a light emission region formed on the C-plane is taken as a short-wavelength region. This may be reversed depending on a growth condition.

In particular, according to an embodiment of the semiconductor light emitting device of the present invention, the semiconductor light emitting device can be formed together with a dummy device. The dummy device is formed on the same base body as that on which the semiconductor light emitting device is formed, by the same fabrication method used for fabricating the semiconductor light emitting device. The dummy device is disposed around the semiconductor light emitting device for setting a spacing factor of the semiconductor light emitting device. As described above, when fabricating a semiconductor light emitting device by forming a hexagonal pyramid shaped nitride based semiconductor layer by selective growth, as described in "Spatial Control of InGaN Luminescence by MOCVD Selective Epitaxy", D. Kapolnek et al., Journal of Crystal Growth, 189/190 (1998) 83–86", an emission wavelength of the semiconductor light emitting device can be controlled on the basis of the spacing factor thereof. Accordingly, the emission wavelength of the semiconductor light emitting device can be positively controlled by disposing a dummy device.

The dummy device will be more fully described below. Various layouts of dummy devices can be adopted. For example, a number of pyramid shaped dummy devices may be arrayed around a semiconductor light emitting device for emission of light in such a manner as to be spaced at equal intervals, or to be continuous to each other in a closed loop shape. Various shapes of dummy devices can be adopted. For example, a long-sized rectangular or circular-arc shaped dummy device may be combined with a hexagonal pyramid shaped dummy device, or dummy devices may be concentrically arranged. The layout and shape of dummy devices formed together with a semiconductor light emitting device are not limited to those described above but may be freely set insofar as the dummy devices can control the spacing factor of the semiconductor light emitting device. In general, only one semiconductor light emitting device is disposed adjacently to dummy devices. However, a number of semiconductor light emitting devices may be disposed adjacently to the dummy devices. A layer structure of a dummy device is not necessarily required to strictly correspond to that of a semiconductor light emitting device for emission of light. A dummy device may be identical to or different from a semiconductor light emitting device in terms of thickness of each layer, constituent material, and impurity concentration. A layer or an impurity may be added just to a dummy device. A stacked layer of a dummy device having a height different from that of a stacked layer of a semiconductor light emitting device may be formed by forming a difference-in-height portion just for the dummy device in order to control the spacing factor of the semiconductor light emitting device. If the layer structure of a dummy device is the same as that of a semiconductor light emitting device for emission of light, a further advantage can be obtained because the dummy device and the semiconductor light emitting device can be fabricated using the same fabrication process. A distance between a dummy device and a semiconductor light emitting device for emission of light is one spacing factor, and an emission wavelength of the semiconductor light emitting device can be controlled by adjusting the distance. In addition, the shape of a semiconductor light emitting device is used, as described above, for controlling an emission wavelength of the semiconductor light emitting device.

Formation of a semiconductor light emitting device for emission of light of red, a semiconductor light emitting device for emission of light of blue, and a semiconductor light emitting device for emission of light of green by controlling a layout of a dummy device formed together with each of the semiconductor light emitting devices will be described below. For example, if a dummy device is disposed on a loop which has a larger size (for example, 40 μm) and is located around a semiconductor light emitting device, the semiconductor light emitting device allows emission of light of red. If a dummy device is disposed on a loop which has a smaller size (for example, 20 μm) and is located around a semiconductor light emitting device, the semiconductor light emitting device allows emission of light of green. If a dummy device is disposed on a loop which has a larger size and is located around an elongated rectangular shaped semiconductor light emitting device, the semiconductor light emitting device allows emission of light of blue.

A display unit according to an embodiment of the present invention will be described below. The display unit of the present invention has a structure including an array of a number of semiconductor light emitting devices. In particular, the display unit of the present invention can be configured as a multi-color display unit by arraying semiconductor light emitting devices having different emission wavelengths on the same substrate (or base body), or arraying semiconductor light emitting devices of each of different emission wavelengths on one of separate substrates (or base bodies) and stacking the substrates (or base bodies) to each other.

In the case of realizing a full-color (multi-color) image display unit by arraying semiconductor light emitting devices of different emission wavelengths on the same substrate, since it is difficult to directly array semiconductor light emitting devices of the multi-colors on the same substrate, semiconductor light emitting devices of each of the multi-colors are previously grown on one of separate substrates, and the semiconductor light emitting devices of the multi-colors grown on the separate substrates are transferred and mounted in a matrix on a final substrate. Even if semiconductor light emitting devices of three colors can be produced on the same substrate by the above-described method, there occurs another inconvenience that a substrate on which semiconductor light emitting devices are to be grown is as small as about 5 inches, and consequently, to realize a display unit having a large screen, a number of semiconductor light emitting devices for three colors must be mounted on separate substrates.

In general, it is very difficult to mount semiconductor light emitting devices at a high density while keeping an accurate positional relationship between two of the semiconductor light emitting devices. This is because a positional deviation between a device previously mounted and an adjacent device subsequently mounted is likely to occur due to the fact that the device previously mounted is affected by heat generated at the time of subsequently mounting the adjacent device. The problem associated with such a positional deviation becomes significant as a distance between adjacent two of light emitting devices becomes smaller when realizing an image display unit having a high resolution. Another problem is that mounting heights of semiconductor light emitting devices of respective colors are likely to become uneven. The unevenness in height between semiconductor light emitting devices may cause a failure in the step of forming wiring for supplying a power to the semiconductor light emitting devices by photolithography or the like.

In view of the foregoing, according to an embodiment of the present invention, when forming a full-color image display unit by arraying semiconductor light emitting devices allowing emission of light of red, blue and green, a substrate on which only the devices allowing emission of light of red have been arrayed, a substrate on which only the devices allowing emission of light of blue have been arrayed, and a substrate on which only the devices allowing emission of light of green have been arrayed are stacked to each other in the light emergence direction, wherein light emitted from each of the light emitting devices arrayed on the substrate located on the back side in the light emergence direction is allowed to pass through a light permeable region formed on the substrate located on the front side. At this time, the semiconductor light emitting devices are preferably not overlapped to each other in the light emergence direction, but wiring portions for supplying a power or a signal to the semiconductor devices may be overlapped to each other in the light emergence direction. If the semiconductor light emitting devices are overlapped to each other in the light emergence direction, colors of light emitted from the semiconductor light emitting devices may be mixed with each other, failing to obtain a desired image, and accordingly, it may be desired that the semiconductor light emitting devices be not overlapped to each other in the light emergence direction. Each region between two of a number of semiconductor light emitting devices may have a light permeable region having a size of at least about 1 $\mu$m or more. If the size of the light permeable region is less than about 1 $\mu$m, light emitted from each semiconductor light emitting device formed on the back side substrate may be reflected from a region other than the light permeable region of the front side substrate by the effect of a distance between the substrates stacked to each other and extension of a beam, to thereby degrade the lighting intensity. When using a metal thin film as a wiring material for lowering the resistance of a wiring portion, the wiring portion may cut off transmission of light therethrough. However, according to an embodiment of the present invention, since the wiring portions for supplying powers or signals to the semiconductor light emitting devices, which are regions cutting off transmission of light, are overlapped to each other in the light emergence direction, it is possible to make use of light permeable regions other than the overlapped wiring portions and hence to keep a good light permeability, and also to improve the degree of freedom of layout of the devices. With respect to the improved layout of the devices, a region cutting off transmission of light, located between the stacked substrates, can be used as a space for arrangement of a circuit portion such as a driver (driver circuit), thereby miniaturizing the entire display unit and increasing the degree of integration of the entire display unit. Also, since the semiconductor light emitting devices of respective colors are arrayed on the separate substrates and then the substrates are stacked to each other, it is possible to two-dimensionally array the semiconductor light emitting devices, and to extend a gap between two of the devices at the time of producing the display unit and hence to suppress occurrence of the above-described problem associated with the positional deviation likely to occur at the time of producing a display unit having a high resolution. Further, the above-described problem associated with a wiring failure occurring in the subsequent step due to the unevenness in mounting height between the semiconductor light emitting devices of respective colors can be solved because the devices of respective colors are respectively arrayed on the separate substrates.

When growing semiconductor light emitting devices on a sapphire substrate, the light permeable region may be obtained by transferring the devices onto a light permeable substrate such as a glass substrate or a plastic substrate, thinly polishing or grinding a sapphire substrate or another crystal growth substrate such as a silicon substrate for improving the light permeability of the substrate, or forming an opening portion or a thinned portion for light transmission by etching. A lens or another optical member can be interposed between substrates. In this case, the lens or another optical member may serve as a spacer between the substrates.

When transferring light emitting devices to a substrate such as a glass substrate or a plastic substrate, or thinly polishing or grinding a sapphire substrate or another substrate, a rigidity of the substrate tends to be lost. However, a flexibility of the substrate is rather improved, to easily solve a problem associated with cracking or camber of the substrate caused during heat-treatment thereof.

The display unit according to an embodiment of the present invention can be used as a white light or mixed-color light illumination unit by arraying a number of semiconductor light emitting devices allowing emission of light of three primary colors or two or more colors and injecting the same current in each of light emission regions of the devices. The display unit according to an embodiment of the present invention is not limited to that including light emitting devices allowing emission of light of red, blue, and green, but may be configured as that including light emitting devices allowing emission of light of two colors or four or more colors.

The display unit according to an embodiment of the present invention can be driven by the same point-sequence or line-sequence manner as that used for driving an active matrix type liquid crystal display unit. Semiconductor light emitting devices having different emission wavelengths may be of different device structures. For example, as a blue or green light emitting diode, a gallium nitride based double-hetero structure multi-layer crystal grown on a sapphire substrate can be used, and as a red light emitting diode, an aluminum gallium arsenide or indium aluminum gallium phosphide based double-hetero structure multi-layer crystal grown on a gallium arsenide substrate can be used. Three light emitting diodes having different emission wavelengths constitute each of pixels, and in this case, the different emission wavelengths are not limited to those for emission of light of red, blue and green but may be those for emission of light of other colors. The semiconductor light emitting device according to an embodiment of the present invention is not limited to a light emitting diode but may be a semiconductor laser device having a specific resonator.

First Embodiment

A display unit according to this embodiment will be described with reference to FIGS. 1 to 4. The display unit in this embodiment includes a display portion having a structure that pixels, each of which is composed of three semiconductor light emitting devices allowing emission of light of red, blue and green, are arrayed in the vertical and horizontal directions, that is, in a matrix.

FIG. 1 is a plan view showing a configuration of a one pixel portion of the display unit according to this embodiment. Referring to FIG. 1, a red light emitting diode 11R, a blue light emitting diode 11B, and a green light emitting diode 11G are arrayed such as to be obliquely offset from each other in each of the vertical direction (V-direction in FIG. 1) and the horizontal direction (H-direction in FIG. 1). Each of the light emitting diodes 11R, 11B and 11G is fabricated by forming a first conductive type cladding layer, an active layer, and a second conductive type cladding layer on a GaN based nitride semiconductor layer. These devices are formed on the same sapphire substrate 10 by the same processing steps. Each of the light emitting diodes 11R, 11B and 11G is formed into an approximately hexagonal pyramid shape. It is to be noted that light emitted from each of these devices is emerged in the direction from a front surface to a rear surface of the figure.

Six dummy devices 12R are formed at points which are separated radially from the red light emitting diode 11R in six directions, and more specifically, formed at corners of a hexagonal shape centered at the red light emitting diode 11R. In other words, the red light emitting diode 11R is positioned at the center of the hexagonal shape having the six corners at which the dummy devices 12R are located. A magnesium-doped GaN layer of the red light emitting diode 11R is connected to an approximately rectangular p-side electrode 15. The p-side electrode 15 is integrated with or electrically connected to a thin, stripe shaped wiring layer 18 extending in the horizontal direction. Similarly, six dummy devices 13B are formed at points which are separated radially from the blue light emitting diode 11B in six directions, and more specifically, formed at corners of a flattened hexagonal shape (one pair of opposed sides longer than another pair of opposed sides) centered at the blue light emitting diode 11B. In other words, the blue light emitting diode 11B is positioned at the center of the flattened hexagonal shape having the six corners at which the dummy devices 13B are located. Unlike the red light emitting diode 11R and the green light emitting diode 11G, the blue light emitting diode 11B is formed into a stripe shape. A magnesium-doped GaN layer of the blue light emitting diode 11B is connected to an approximately rectangular p-side electrode 16. The p-side electrode 16 is integrated with or electrically connected to a thin, stripe shaped wiring layer 19 extending in the horizontal direction. Similarly, six dummy devices 14G are formed at points which are separated radially from the green light emitting diode 11G in six directions, and more specifically, formed at corners of a hexagonal shape centered at the green light emitting diode 11G. In other words, the green light emitting diode 11G is positioned at the center of the hexagonal shape having the six corners at which the dummy devices 14G are located. A magnesium-doped GaN layer of the green light emitting diode 11G is connected to an approximately rectangular p-side electrode 17. The p-side electrode 17 is integrated with or electrically connected to a thin, stripe shaped wiring layer 20 extending in the horizontal direction.

Figure 2:
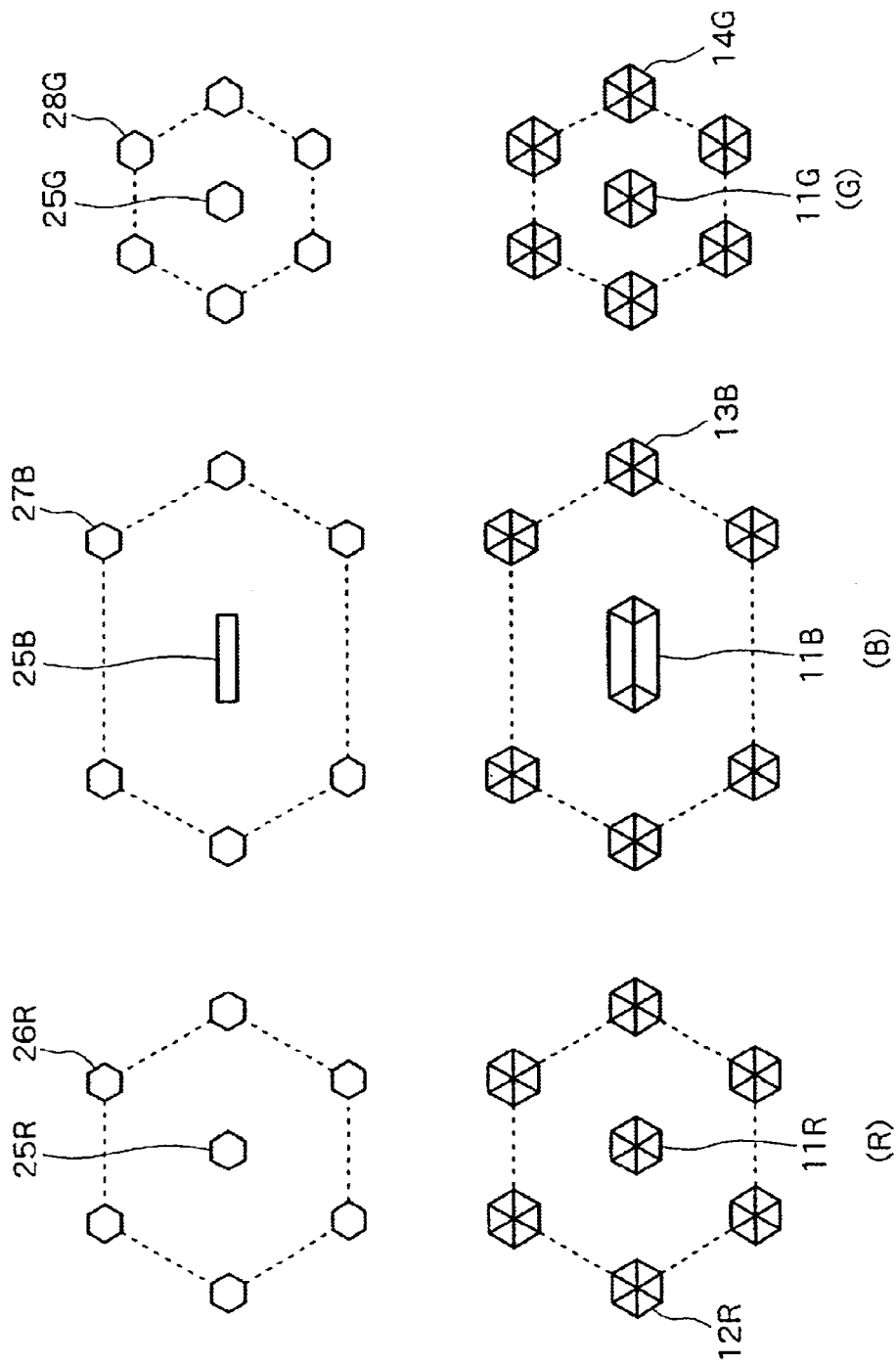
FIG. 2 is a plan view showing a pattern of a selection mask for each light emitting diode of the display unit according to the first embodiment (upper side) and a plane pattern of the light emitting diode (lower side).

The dummy devices 12R, 13B and 14G will be described in detail below. The dummy devices 12R (13B or 14G) are disposed around the light emitting diode 11R (11B or 11G) for setting a spacing factor of the light emitting diode 11R (11G or 11G). Since a wavelength of light emitted from the light emitting diode 11R (11B or 11G) is controlled by adjusting the spacing factor of the light emitting diode 11R (11B or 11G), the wavelength of light emitted from the light emitting diode 11R (11B or 11G) can be positively controlled by disposing the dummy devices 12R (13B or 14G) around the light emitting diode 11R (11B or 11G). FIG. 2 shows a selective growth mask used for each of the red, blue and green light emitting diodes, and a pattern of each of the red, blue and green light emitting diodes and dummy devices formed by selective growth. Each selective growth mask is shown on the upper side, and the pattern of each of the light emitting diodes and the dummy devices is shown on the lower side.

Referring to FIG. 2, a mask for red shown on the left side designated by character (R) has, at its center, an opening portion 25R for selective growth of the red light emitting diode 11R and also has, at corners of a hexagonal shape centered at the opening portion 25R, six opening portions 26R for selective growth of the dummy devices 12R. A size of each of the opening portions 25R and 26R may be set in a range of about 0.1 μm to about 10 μm, and may be formed into a polygonal shape such as an approximately hexagonal shape, a circular shape, or an elliptical shape. A distance between each of the opening portions 26R for forming the dummy devices 12R and the opening portion 25R for forming the red light emitting diode 11R may be typically set to about 20 μm. As a result, a size of the hexagonal shape formed by the six opening portions 26R becomes about 40 μm. By using such a mask for red, the hexagonal shaped red light emitting diode 11R and the dummy devices 12R are formed by selective growth from the opening portions 25R and 26R of the mask for red, respectively.

Referring to FIG. 2, a mask for blue shown at the central portion designated by character (B) has, at its center, an approximately rectangular shaped opening portion 25B for selective growth of the blue light emitting diode 11B and also has, at corners of a flattened hexagonal shape centered at the opening portion 25B, six opening portions 27B for selective growth of the dummy devices 13B. Like the size of each of the opening portions 26R and the opening portion 25R, a size of each of the opening portions 27B may be set in a range of about 0.1 μm to about 10 μm. A size of the approximately rectangular shaped opening portion 25B may be typically set to a value being about two to ten times the size of the opening portion 25R. A distance between each of the opening portions 27B for forming the dummy devices 13B and the opening portion 25B for forming the blue light emitting diode 11B may be set as follows. Namely, a distance between each of the opening portions 27B and an end portion, closer to the opening portion 27B, of the rectangular shaped opening portion 25B may be set to about 20 μm. As a result, a longitudinal size of the flattened hexagonal shape formed by the six opening portions 27B becomes a value obtained by adding the longitudinal size of the opening portion 25B to about 40 μm. By using such a mask for blue, the hexagonal shaped blue light emitting diode 11B and the dummy devices 13B are formed by selective growth from the opening portions 25B and 27B of the mask for blue, respectively.

Referring to FIG. 2, a mask for green shown on the right side designated by character (G) has, at its center, an opening portion 25G for selective growth of the green light emitting diode 11G and also has, at corners of a hexagonal shape centered at the opening portion 25G, six opening portions 28G for selective growth of the dummy devices 14G. A size of each of the opening portions 25G and 28G may be set in a range of about 0.1 μm to about 10 μm, and may be formed into a polygonal shape such as an approximately hexagonal shape, a circular shape, or an elliptical shape. A distance between each of the opening portions 28G for forming the dummy devices 14G and the opening portion 25G for forming the green light emitting diode 11G may be typically set to about 10 μm. As a result, a size of the hexagonal shape formed by the six opening portions 28G becomes about 20 μm. By using such a mask for green, the hexagonal shaped green light emitting diode 11G and the dummy devices 14G are formed by selective growth from the opening portions 25G and 28G of the mask for green, respectively.

Since the spacing factors of the light emitting diodes 11R, 11B and 11G are set to be different from each other by providing the dummy devices 12R, 13B and 14G, which are different from each other in terms of size, shape and/or location, around the light emitting diodes 11R, 11B and 11G respectively, emission wavelengths of the light emitting diodes 11R, 11B and 11G are different from each other. The red light emitting diode 11R typically has an energy gap of about 2.2 eV and emits light having a wavelength of about 620 nm. The blue light emitting diode 11B typically has an energy gap of about 2.7 eV and emits light having a wavelength of about 470 nm. The green light emitting diode 11G typically has an energy gap of about 2.5 eV and emits light having a wavelength of about 520 nm. According to this embodiment, the light emitting diodes 11R, 11B and 11G are formed on the same sapphire substrate 10 in such a manner that the light emitting diodes 11R, 11B and 11G have the same layer structure, and the dummy devices 12R, 13B and 14G are disposed around the light emitting diodes 11R, 11B and 11G, respectively, so as to make the emission wavelengths of the light emitting diodes 11R, 11B and 11G different from each other. The present invention, however, is not limited thereto but may be configured such that one or two of light emitting diodes for red, blue and green have different layer structures, and dummy devices be provided around the remaining one or two light emitting diodes, respectively.

Figure 3:
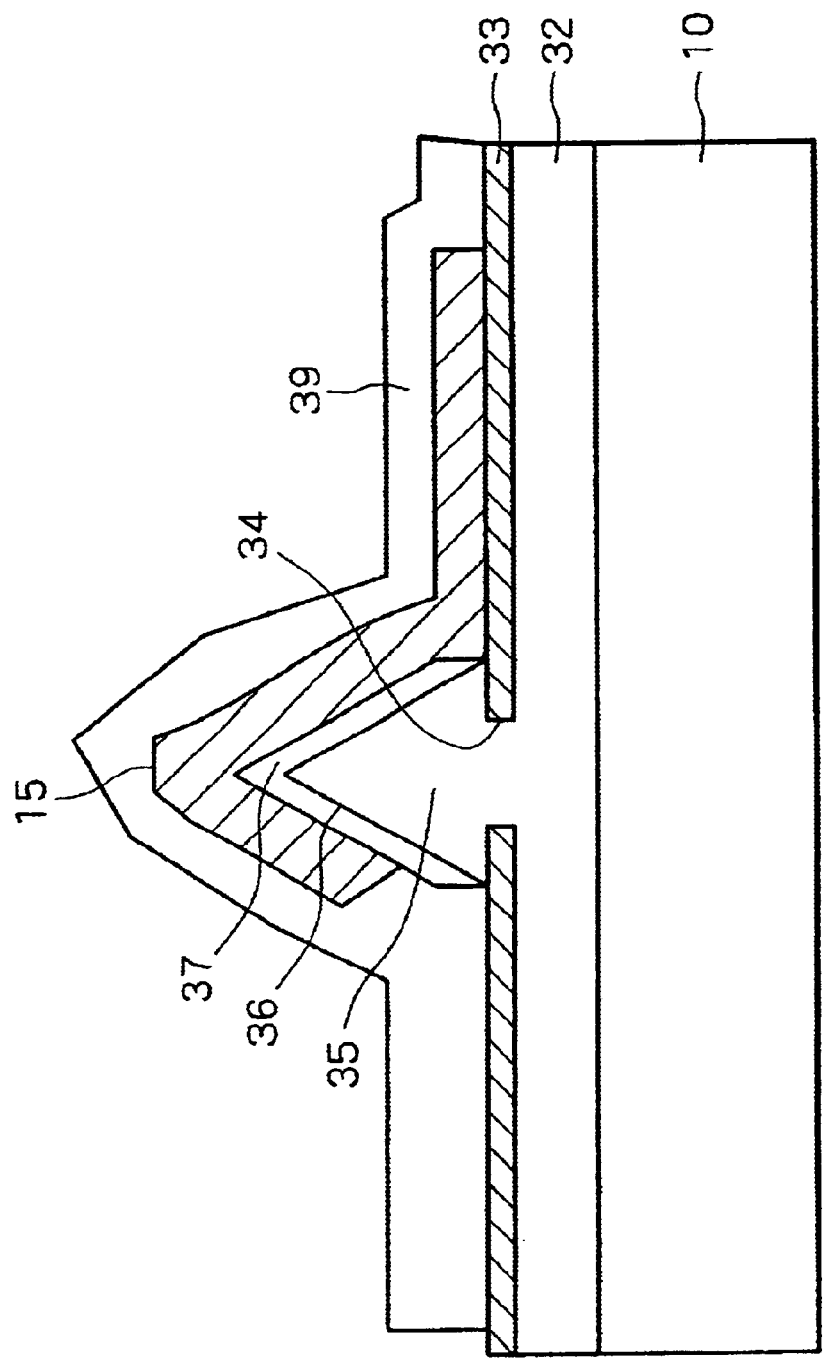
FIG. 3 is a sectional view taken on line III—III of FIG. 1, showing a red light emitting diode of the display unit according to the first embodiment.
Figure 4:
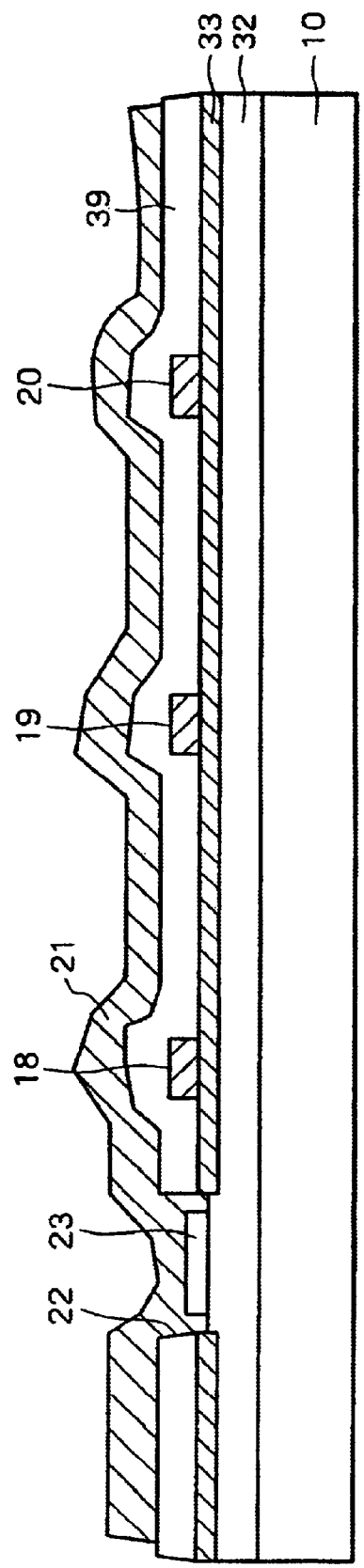
FIG. 4 is a sectional view taken on line IV—IV of FIG. 1, showing the red light emitting diode of the display unit according to the first embodiment.

A structure of each of the light emitting diodes for red, blue and green and a structure of a wiring portion associated therewith will be described with reference to FIGS. 3 and 4. FIG. 3 is a sectional view taken on line III—III of FIG. 1, showing a sectional structure of the red light emitting diode 11R. The red light emitting diode 11R, the blue light emitting diode 11B and the green light emitting diode 11G have the same layer structure except for portions subjected to control of emission wavelengths by the dummy devices 12R, 13B and 14G (for example, impurity concentrations, crystal structures, and the like). Referring to FIG. 3, the red light emitting diode 11R is configured as a GaN based light emitting diode. The red light emitting diode 11R is fabricated such that an under growth layer 32 typically composed of an AlN buffer layer and a silicon-doped GaN semiconductor layer is formed on the sapphire substrate 10 with the (C+)-plane of sapphire taken as a principal plane thereof, and a hexagonal pyramid shaped GaN layer 35 is formed thereon by selective growth. To be more specific, a selection mask 33 composed of a silicon oxide film is formed on the under growth layer 32, an opening portion 34 is formed in the selection mask 33, and the hexagonal pyramid shaped GaN layer 35 is formed by selective growth from the opening portion 34. The opening portion 34 is equivalent to the opening portion 25R formed in the mask shown in FIG. 2. The hexagonal pyramid shaped GaN layer 35 is formed by selective growth from the opening portion 34 formed in the selection mask 33 by the MOCVD process or the like.

In the case of growing the GaN layer 35 on the sapphire substrate 10 with the C-plane of sapphire taken as the principal plane thereof, the GaN layer 35 is formed into the hexagonal pyramid shape covered with (1-101) planes called the S-planes. The conductive type of the GaN layer 35 is taken as an n-type by doping silicon into the GaN layer 35. The GaN layer 35 is grown from the opening portion 34 formed in the selection mask 33, and one conductive layer will be formed in self-alignment on planes grown from the S-planes as the tilt planes of the GaN layer 35. It is to be noted that the GaN layer 35 is grown in self-alignment in such a manner as to be terminated on the selection mask 33 composed of the insulating film used for selective growth.

The tilt plane portions, that is, the S-plane portions of the GaN layer 35 function as a cladding layer constituting part of a double-hetero structure. An InGaN layer 36 as an active layer is formed to cover the GaN layer 35, and a magnesium-doped GaN layer 37 is formed on the InGaN layer 36. The magnesium-doped GaN layer 37 also functions as a cladding layer constituting part of the double-hetero structure. The magnesium-doped GaN layer 37 is grown in self-alignment, that is, extends along the tilt planes (S-planes) toward the selection mask 33 formed of the insulating film and is terminated on the selection mask 33. The terminated point of the magnesium-doped GaN layer 37 corresponds to the peripheral end portion of the light emitting device. Accordingly, in the case of fabricating the display unit, the GaN layer 35 as the cladding layer, the InGaN layer 36 as the active layer, and the magnesium-doped GaN layer 37 as the cladding layer are not required to be subjected to device isolation. In other words, each of the light emitting devices for forming the display unit can be arrayed in self-alignment at the position corresponding to each opening portion 34 formed in the selection mask 33. A thickness of the InGaN layer 36 as the active layer is typically set to about 3 nm, and a thickness of the magnesium-doped GaN layer 37 is typically set to about 20 nm.

A p-side electrode 15 is formed on the magnesium-doped GaN layer 37. The p-side electrode 15 typically has a stacked layer structure of Ni/Pt/Au or Ni(Pd)/Pt/Au formed by vapor-deposition. As one example of the stacked layer structure of the p-side electrode 15, an Ni layer having a thickness of about 1 nm, a Pt layer having a thickness of about 10 nm, and an Au layer having a thickness of about 100 nm are stacked in this order. The p-side electrode 15 is connected to the wiring layer 18 extending in the horizontal direction.

An n-side electrode 23 formed on the side opposed to the p-side electrode 15 is taken as a common electrode. As shown in FIG. 4, the n-side electrode 23 having a stacked layer structure of Ti/Al/Pt/Au is formed in an opening portion 22 formed in the selection mask 33 by vapor-deposition. The n-side electrode 23 is connected to the under growth layer 32, and is electrically connected to the first conductive type cladding layer of the hexagonal pyramid shaped GaN layer 35 formed on the under growth layer 32 by selective growth. The n-side electrode 23 is connected to a wiring layer 21 extending, on the surface side of the n-side electrode 23, in the vertical direction, to receive supply of a current given to the light emitting diode.

According to the display unit having the above-described configuration in this embodiment, at least the periphery of the device is surrounded by the planes grown from the tilt planes, and the conductive layers, that is, the GaN layer 35 as the cladding layer, the InGaN layer 36 as the active layer, and the magnesium-doped GaN layer 37 as the cladding layer are formed in self-alignment in such a manner as to be terminated on the selection mask 33 as the insulating film used for selective grow. As a result, at the time of formation of electrodes, device isolation is not required or easily formed, so that it is possible to reduce the number of steps of fabricating the display unit. Also, according to the display unit in this embodiment, the emission of light of multicolors colors can be realized by making use of the emission wavelength control functions of the dummy devices 12R, 13B and 14G. Further, the emission of light of multi-colors can be realized just by changing the arrangement patterns of the dummy devices of the selection masks while forming the light emitting devices having the same layer structure on the same sapphire substrate 10. Consequently, as compared with a display unit formed by combining light emitting devices formed by different fabrication processes, it is possible to significantly simplify the fabrication steps and to enhance the positional accuracy of the light emitting devices of the display unit.

Second Embodiment

Figure 5:
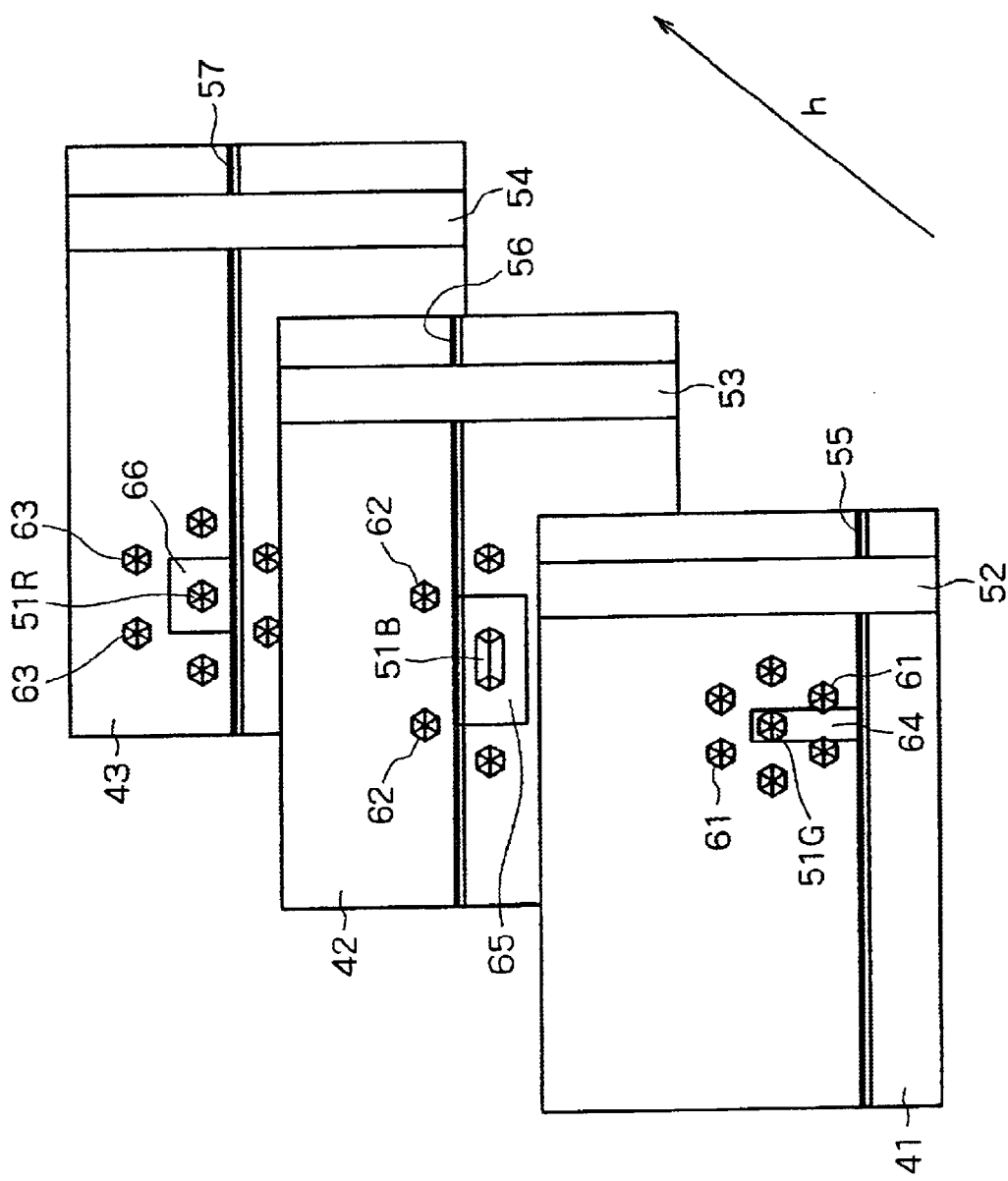
FIG. 5 is an exploded perspective view showing one pixel portion of a display unit according to a second embodiment of the present invention.

A display unit according to this embodiment will be described with reference to FIG. 5. The display unit in this embodiment is fabricated by forming semiconductor light emitting devices for green, semiconductor light emitting devices for blue, and semiconductor light emitting devices for red on a sapphire substrate 41, 42 and 43, respectively, and sticking the sapphire substrates 41, 42 and 43 to each other. Referring to FIG. 5, green light emitting devices 51G are formed on the sapphire substrate 41, blue light emitting devices 51B are formed on the sapphire substrate 42, and red light emitting devices 51R are formed on the sapphire substrate 43.

Only one light emitting diode is shown on each of the sapphire substrates 41, 42 and 43 in FIG. 5. However, in actuality, a number of light emitting diodes are formed on each of the sapphire substrates 41, 42 and 43 in a matrix, and in the display unit formed by sticking the sapphire substrates 41, 42 and 43 to each other, pixels, each of which is composed of the three light emitting diodes for allowing emission of light of red, blue and green, are arrayed in the vertical and horizontal directions, that is, in a matrix. Each of the light emitting diodes 51R, 51B and 51G is fabricated by forming a first conductive type cladding layer, an active layer, and a second conductive type cladding layer on a GaN based nitride semiconductor layer, and is formed into an approximately hexagonal pyramid shape. It is to be noted that light emitted from each of these devices is emerged in the direction "h" in FIG. 5.

On the sapphire substrate 43, six dummy devices 63 are formed at points which are separated radially from the red light emitting diode 51R in six directions, and more specifically, formed at corners of a hexagonal shape centered at the red light emitting diode 51R. In other words, the red light emitting diode 51R is positioned at the center of the hexagonal shape having the six corners at which the dummy devices 63 are located. A GaN layer on the surface side of the red light emitting diode 51R is connected to an approximately rectangular p-side electrode 66. The p-side electrode 66 is integrated with or electrically connected to a thin, stripe shaped wiring layer 57 extending in the horizontal direction. Similarly, on the sapphire substrate 42, six dummy devices 62 are formed at points which are separated radially from the blue light emitting diode 51B in six directions, and more specifically, formed at corners of a flattened hexagonal shape (one pair of opposed sides longer than another pair of opposed sides) centered at the blue light emitting diode 51B. In other words, the blue light emitting diode 51B is positioned at the center of the flattened hexagonal shape having the six corners at which the dummy devices 62 are located. Unlike the red light emitting diode 51R and the green light emitting diode 51G, the blue light emitting diode 51B is formed into a stripe shape. A GaN layer on the surface side of the blue light emitting diode 51B is connected to an approximately rectangular p-side electrode 65. The p-side electrode 65 is integrated with or electrically connected to a thin, stripe shaped wiring layer 56 extending in the horizontal direction. Similarly, on the sapphire substrate 41, six dummy devices 61 are formed at points which are separated radially from the green light emitting diode 51G in six directions, and more specifically, formed at corners of a hexagonal shape centered at the green light emitting diode 51G. In other words, the green light emitting diode 51G is positioned at the center of the hexagonal shape having the six corners at which the dummy devices 61 are located. A GaN layer on the surface side of the green light emitting diode 51G is connected to an approximately rectangular p-side electrode 64. The p-side electrode 64 is integrated with or electrically connected to a thin, stripe shaped wiring layer 55 extending in the horizontal direction. It is to be noted that structures and functions of the dummy devices 63, 62 and 61 are substantially the same as those of the dummy devices 12R, 13B and 14G used for the display unit according to the first embodiment, and therefore, the overlapped description thereof is omitted.

According to this embodiment, to obtain the display unit allowing emission of light of multi-colors, the sapphire substrates 41, 42 and 43, each of which allows emission of light of only a single color, are stacked to each other. For this purpose, each of the sapphire substrates 41, 42 and 43 is required to allow light to pass therethrough. For example, at least two, on the light emergence side in the direction "h", of the stacked substrates, that is, the substrates 42 and 43 are each required to allow light to pass therethrough. More specifically, the substrate 42 is required to allow light emitted from the light emitting diodes on the substrate 41 to pass therethrough, and the substrate 43 is required to allow both light emitted from the light emitting diodes on the substrate 41 and light emitted from the light emitting diodes on the substrate 42 to pass therethrough. Each of the sapphire substrates 41, 42 and 43 is generally excellent in light permeability and allows light to pass therethrough. To enhance the light permeability of each of the sapphire substrates 41, 42 and 43, a back surface side of the sapphire substrate may be thinned by grinding or polishing, or opening portions allowing light to pass therethrough may be formed in the sapphire substrate by etching. As the substrate in this embodiment, there may be used a substrate other than the sapphire substrate. For example, a red light emitting diode may be formed on a GaAs substrate, and each of blue and green light emitting diodes may be formed on the sapphire substrate. Alternatively, three substrates, or two substrates required to allow light to pass therethrough may be configured as plastic or glass substrates. In this case, light emitting diodes may be transferred on these plastic or glass substrates.

In the case of stacking the substrates to each other, as described above, light emerges from the light emitting diodes while passing through the substrates. Accordingly, the display unit fabricated by stacking the substrates to each other is manufactured such that the light emitting diodes on one substrate are not overlapped to those on the other substrates, and a light permeable region having a size of at least 1 $\mu$m or more is formed in each region between two of a number of the light emitting diodes arrayed on each substrate for allowing light emitted from the light emitting diodes on the back surface side to pass through the light permeable regions. Since each of the sapphire substrates 41, 42 and 43 has the light permeability as described above, by broadening each gap as the light permeable region between two of the light emitting diodes on each substrate, light emitted from the light emitting diodes on the back surface side easily emerges outwardly via the gaps between devices as the light permeable regions.

The wiring layers 52, 53 and 54 for supplying currents are formed on the sapphire substrates 41, 42 and 43 in such a manner as not to be overlapped to the light emitting diodes but to be located at the same position for easy wiring when giving a common potential thereto. Since each of the wiring layers 52, 53 and 54 is formed of a thin metal film and thereby has a light shielding property, a total area occupied by each of the wiring layers 52, 53 and 54 is widened, thereby reducing the degree of freedom in the design of the layout of the light emitting diodes. According to this embodiment, since the wiring layers 52, 53 and 54 on the sapphire substrates 41, 42 and 43 are located at the same position, it is possible to increase the degree of freedom in the design of the layout of the light emitting diodes.

Third Embodiment

A display unit according to this embodiment will be described with reference to FIGS. 6 to 9. Like the display unit according to the first embodiment, the display unit according to this embodiment includes a display portion having a structure that pixels, each of which is composed of three semiconductor light emitting devices allowing emission of light of red, blue and green, are arrayed in the vertical and horizontal directions, that is, in a matrix.

Figure 6:
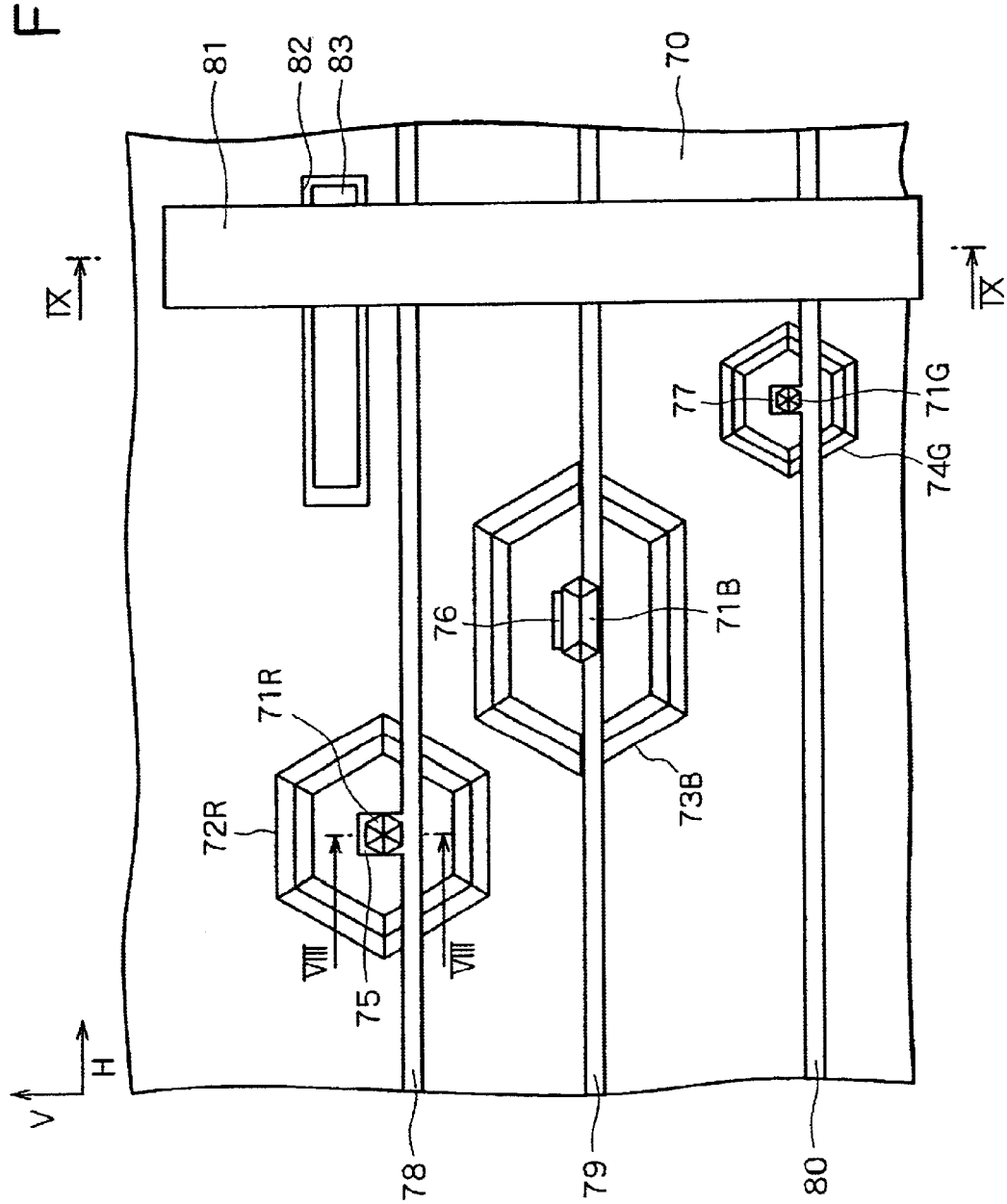
FIG. 6 is a plan view showing one pixel portion of a display unit according to a third embodiment of the present invention.

FIG. 6 is a plan view showing a configuration of a one pixel portion of the display unit according to this embodiment. Referring to FIG. 6, a red light emitting diode 71R, a blue light emitting diode 71B, and a green light emitting diode 71G are arrayed in such a manner as to be obliquely offset from each other in each of the vertical direction (V-direction in FIG. 6) and the horizontal direction (H-direction in FIG. 6). Each of the light emitting diodes 71R, 71B and 71G is fabricated by forming a first conductive type cladding layer, an active layer, and a second conductive type cladding layer on a GaN based nitride semiconductor layer. These devices are formed on the same sapphire substrate 70 by the same processing steps. Each of the light emitting diodes 71R, 71B and 71G is formed into an approximately hexagonal pyramid shape. It is to be noted that light emitted from each of these devices emerges in the direction from a front surface to a rear surface of the figure.

A dummy device 72R is formed into the shape which extends along six sides of a hexagonal shape centered at the red light emitting diode 71R. In other words, the red light emitting diode 71R is positioned at the center of the hexagonal shape having the six sides along which the dummy device 72R extends. A magnesium-doped GaN layer of the red light emitting diode 71R is connected to an approximately rectangular p-side electrode 75. The p-side electrode 75 is integrated with or electrically connected to a thin, stripe shaped wiring layer 78 extending in the horizontal direction. Similarly, a dummy device 73B is formed into the shape which extends along six sides of a flattened hexagonal shape (one pair of opposed sides longer than another pair of opposed sides) centered at the blue light emitting diode 71B. In other words, the blue light emitting diode 71B is positioned at the center of the flattened hexagonal shape having the six sides along which the dummy device 73B extends. Unlike the red light emitting diode 71R and the green light emitting diode 71G, the blue light emitting diode 71B is formed into a stripe shape. A magnesium-doped GaN layer of the blue light emitting diode 71B is connected to an approximately rectangular p-side electrode 76. The p-side electrode 76 is integrated with or electrically connected to a thin, stripe shaped wiring layer 79 extending in the horizontal direction. Similarly, a dummy device 74G is formed into the shape which extends along six sides of a hexagonal shape centered at the green light emitting diode 71G. In other words, the green light emitting diode 71G is positioned at the center of the hexagonal shape having the six sides along which the dummy device 74G extends. A magnesium-doped GaN layer of the green light emitting diode 71G is connected to an approximately rectangular p-side electrode 77. The p-side electrode 77 is integrated with or electrically connected to a thin, stripe shaped wiring layer 80 extending in the horizontal direction.

Figure 7:
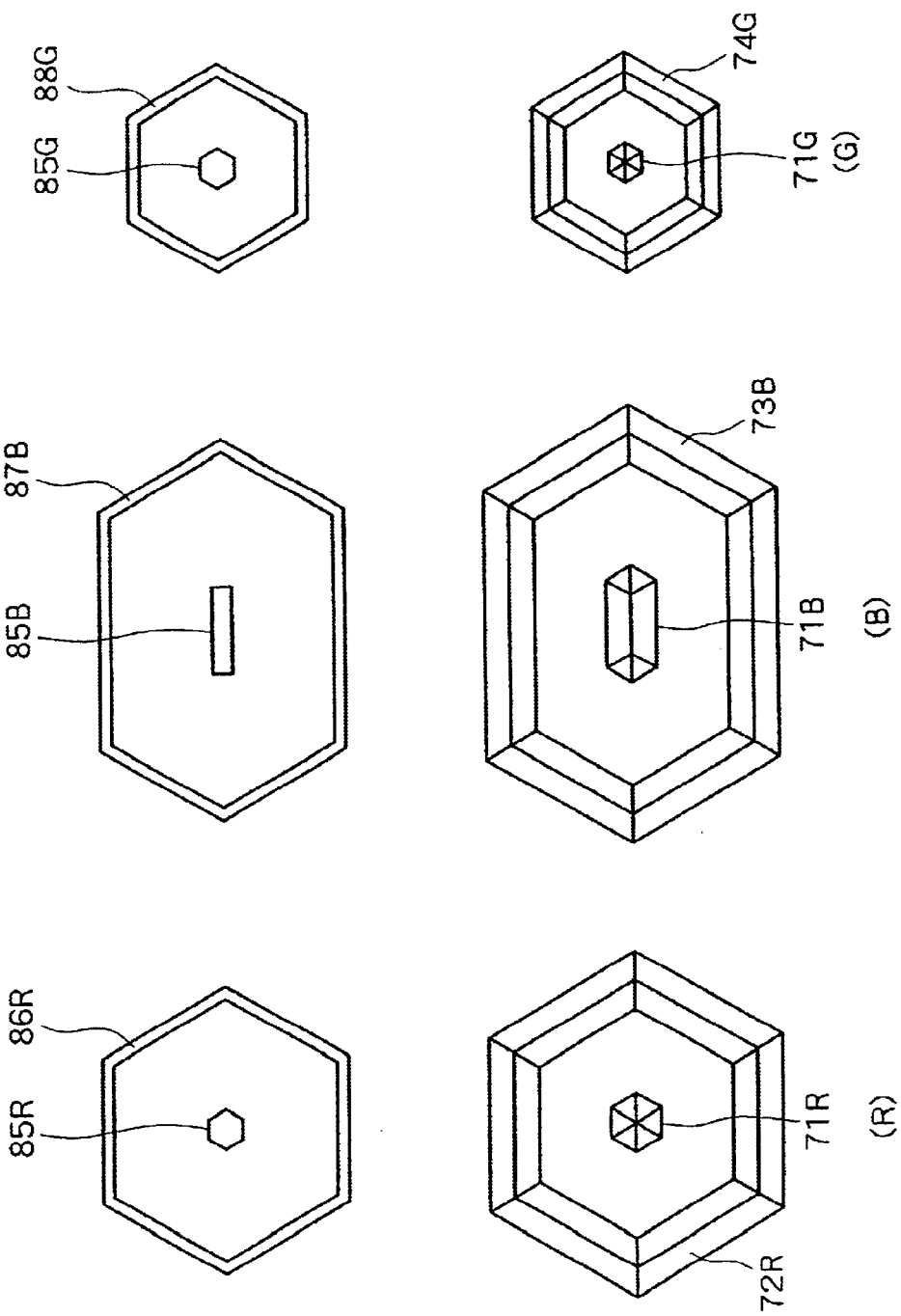
FIG. 7 is a plan view showing a pattern of a selection mask for each light emitting diode of the display unit according to the third embodiment (upper side) and a plane pattern of the light emitting diode (lower side).

The dummy devices 72R, 73B and 74G will be described in detail below. The dummy device 72R (73B or 74G) is disposed around the light emitting diode 71R (71B or 71G) for setting a spacing factor of the light emitting diode 71R (71G or 71G). Since a wavelength of light emitted from the light emitting diode 71R (71B or 71G) is controlled by adjusting the spacing factor of the light emitting diode 71R (71B or 71G), the wavelength of light emitted from the light emitting diode 71R (71B or 71G) can be positively controlled by disposing the dummy device 72R (73B or 74G) around the light emitting diode 71R (71B or 71G). FIG. 7 shows a selective growth mask used for each of the red, blue and green light emitting diodes, and a pattern of each of the red, blue and green light emitting diodes and a dummy device formed by selective growth. In this, each selective growth mask is shown on the upper side, and the pattern of each of the light emitting diodes and the dummy devices is shown on the lower side.

Referring to FIG. 7, a mask for red shown on the left side designated by character (R) has, at its center, an opening portion 85R for selective growth of the red light emitting diode 71R and also has, at its periphery, an opening portion 86R for selective growth of the dummy device 72R. The opening portion 86R is formed in the mask into the shape which extends along six sides of a hexagonal shape centered at the opening portion 85R. A size of the opening portion 85R may be set in a range of about 0.1 $\mu$m to about 10 $\mu$m, and be formed into a polygonal shape such as an approximately hexagonal shape, a circular shape, or an elliptical shape. A distance between the opening portion 86R for forming the dummy device 72R and the opening portion 85R for forming the red light emitting diode 71R may be typically set to about 20 $\mu$m. As a result, a size of the hexagonal shape formed by the opening portion 86R becomes about 40 $\mu$m. By using such a mask for red, the hexagonal shaped red light emitting diode 71R and the dummy device 72R extending along the six sides of the hexagonal shape centered at the light emitting diode 71R are formed by selective growth from the opening portions 85R and 86R of the mask for red, respectively. The light emitting diode 71R positioned at the center is protected by the dummy device 72R.

Referring to FIG. 7, a mask for blue shown at the central portion designated by character (B) has, at its center, an approximately rectangular shaped opening portion 85B for selective growth of the blue light emitting diode 71B and also has, at its periphery, an opening portion 87B for selective growth of the dummy device 73B. The opening portion 87B is formed in the mask into the shape which extends along six sides of a flattened hexagonal shape centered at the opening portion 85B. A size of the rectangular opening portion 85B may be typically set to a value being about two to ten times the size of the opening portion 85R. A distance between the opening portion 87B for forming the dummy device 73B and the opening portion 85B for forming the blue light emitting diode 71B may be set as follows. Namely, a distance between the opening portion 87B and an end portion, closer to the opening portion 87B, of the rectangular shaped opening portion 85B may be set to about 20 $\mu$m. As a result, a longitudinal size of the flattened hexagonal shape formed by the opening portion 87B extending along the six sides of the flattened hexagonal shape becomes a value obtained by adding the longitudinal size of the opening portion 85B to about 40 $\mu$m. By using such a mask for blue, the hexagonal shaped blue light emitting diode 71B and the dummy device 73B are formed by selective growth from the opening portions 85B and 87B of the mask for blue, respectively.

Referring to FIG. 7, a mask for green shown on the right side designated by character (G) has, at its center, an opening portion 85G for selective growth of the green light emitting diode 71G and also has, at its periphery, an opening portion 88G for selective growth of the dummy device 74G. The opening portion 88G is formed in the mask into the shape which extends along six sides of a hexagonal shape centered at the opening portion 85G. A size of the opening portion 85G may be set in a range of about 0.1 $\mu$m to about 10 $\mu$m, and be formed into a polygonal shape such as an approximately hexagonal shape, a circular shape, or an elliptical shape. A distance between the opening portion 88G for forming the dummy device 74G and the opening portion 85G for forming the green light emitting diode 71G may be typically set to about 10 $\mu$m. As a result, a size of the hexagonal shape formed by the opening portion 88G extending along the six sides of the hexagonal shape becomes about 20 $\mu$m. By using such a mask for green, the hexagonal shaped green light emitting diode 71G and the dummy device 74G are formed by selective growth from the opening portions 85G and 88G of the mask for green, respectively.

Like the setting of the spacing factors of the light emitting diodes 11R, 11B and 11G by the dummy devices 12R, 13B and 14G, the spacing factors of the light emitting diodes 71R, 71B and 71G are set by the dummy devices 72R, 73B and 74G, whereby emission wavelengths of the light emitting devices 71R, 71B and 71G are made different from each other. According to this embodiment, the light emitting diodes 71R, 71B and 71G are formed on the same sapphire substrate 70 in such a manner that the light emitting diodes 71R, 71B and 71G have the same layer structure and the dummy devices 72R, 73B and 74G are disposed around the light emitting diodes 71R, 71B and 71G, respectively, so as to make the emission wavelengths of the light emitting diodes 71R, 71B and 71G different from each other. The present invention, however, is not limited thereto but may be configured such that one or two of light emitting diodes for red, blue and green have different layer structures, and dummy devices may be provided around the remaining one or two light emitting diodes, respectively.

Figure 8:
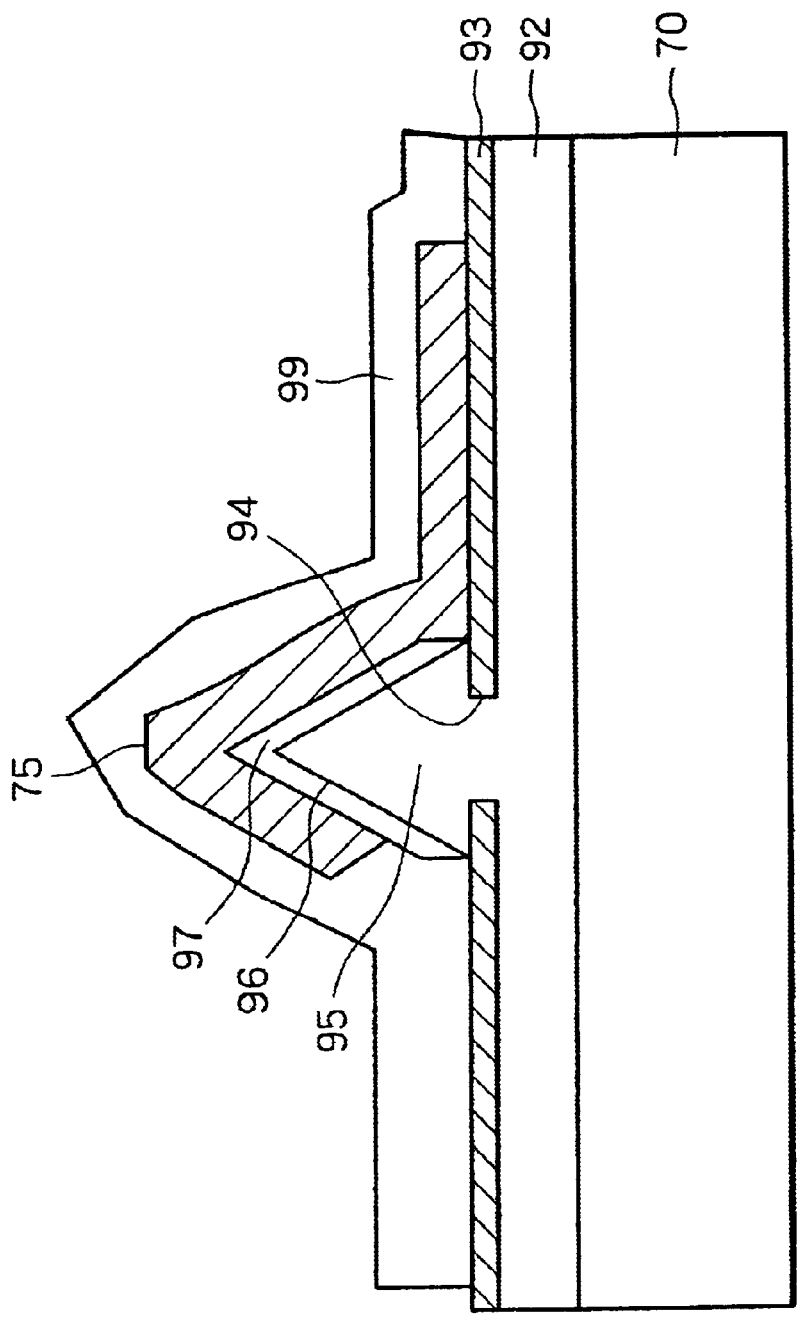
FIG. 8 is a sectional view taken on line VIII—VIII of FIG. 6, showing a red light emitting diode of the display unit according to the third embodiment.
Figure 9:
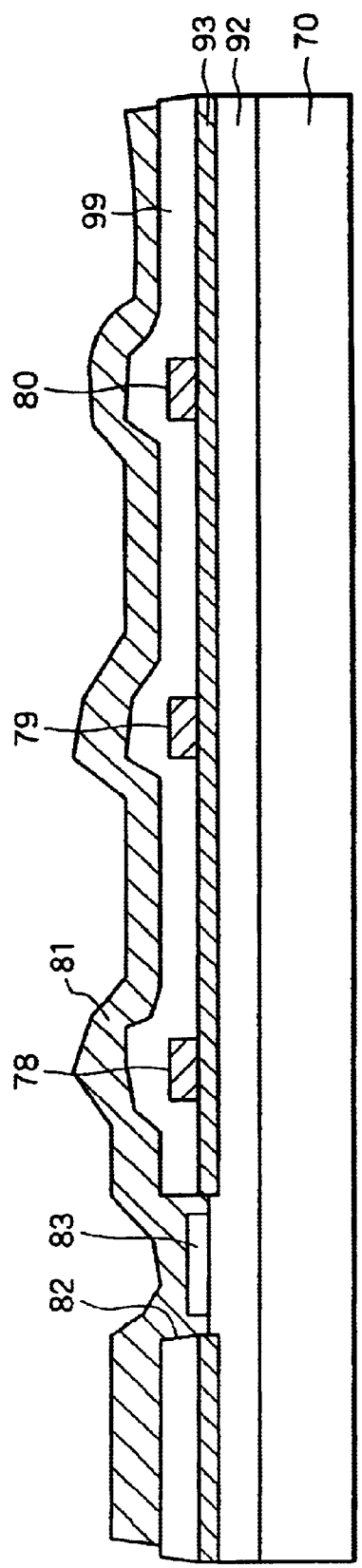
FIG. 9 is a sectional view taken on line IX—IX of FIG. 6, showing the red light emitting diode of the display unit according to the third embodiment.

A structure of each of the light emitting diodes for red, blue and green and a structure of a wiring portion associated therewith will be described with reference to FIGS. 8 and 9. FIG. 8 is a sectional view taken on line VIII—VIII of FIG. 6, showing a sectional structure of the red light emitting diode 71R. The red light emitting diode 71R, the blue light emitting diode 71B and the green light emitting diode 71G have the same layer structure except for portions subjected to control of emission wavelengths by the dummy devices 72R, 73B and 74G (for example, impurity concentrations, crystal structures, and the like). Referring to FIG. 8, the red light emitting diode 71R is configured as a GaN based light emitting diode having a structure in which an under growth layer 92 typically composed of an AlN buffer layer and a silicon-doped GaN semiconductor layer is formed on the sapphire substrate 70 with the (C+)-plane of sapphire taken as a principal plane thereof, and a hexagonal pyramid shaped GaN layer 95 is formed thereon by selective growth. To be more specific, a selection mask 93 composed of a silicon oxide film is formed on the under growth layer 92, an opening portion 94 is formed in the selection mask 93, and the hexagonal pyramid shaped GaN layer 95 is selectively grown from the opening portion 94. The opening portion 94 is equivalent to the opening portion 85R formed in the mask shown in FIG. 7. The hexagonal pyramid shaped GaN layer 95 is formed by selective growth from the opening portion 94 formed in the selection mask 93 by the MOCVD process or the like.

When growing the GaN layer 95 on the sapphire substrate 70 with the C-plane of sapphire taken as the principal plane thereof, the GaN layer 95 is formed into the hexagonal pyramid shape covered with the (1-101) planes called the S-planes. The conductive type of the GaN layer 95 is taken as an n-type by doping silicon into the GaN layer 95. The GaN layer 95 is grown from the opening portion 94 formed in the selection mask 93 such as to have the S-planes as the tilt planes, and one conductive layer will be formed in self-alignment on planes grown from the S-planes as the tilt planes of the GaN layer 95. It is to be noted that the GaN layer 95 is grown in self-alignment such as to be terminated on the selection mask 93 as the insulating film used for selective growth. The tilt plane portions, that is, the S-plane portions of the GaN layer 95 function as a cladding layer constituting part of a double-hetero structure. An InGaN layer 96 as an active layer is formed to cover the GaN layer 95, and a magnesium-doped GaN layer 97 is formed on the InGaN layer 96. The magnesium-doped GaN layer 97 also functions as a cladding layer constituting part of the double-hetero structure. The magnesium-doped GaN layer 97 is grown in self-alignment, that is, extends along the tilt planes (S-planes) toward the selection mask 93 composed of the insulating film and is terminated on the selection mask 93. The terminated point of the magnesium-doped GaN layer 97 corresponds to the peripheral end portion of the light emitting device. Accordingly, when fabricating the display unit, the GaN layer 95 as the cladding layer, the InGaN layer 96 as the active layer, and the magnesium-doped GaN layer 97 as the cladding layer are not required to be subjected to device isolation. In other words, each of the light emitting devices for forming the display unit can be arrayed in self-alignment at the position corresponding to each opening portion 94 formed in the selection mask 93. A thickness of the InGaN layer 96 as the active layer is typically set to about 3 nm, and a thickness of the magnesium-doped GaN layer 97 is typically set to about 20 nm.

A p-side electrode 75 is formed on the magnesium-doped GaN layer 97. The p-side electrode 75 typically has a stacked layer structure of Ni/Pt/Au or Ni(Pd)/Pt/Au formed by vapor-deposition. As one example of the stacked layer structure of the p-side electrode 75, an Ni layer having a thickness of about 1 nm, a Pt layer having a thickness of about 10 nm, and an Au layer having a thickness of about 100 nm are stacked in this order. The p-side electrode 75 is connected to the wiring layer 78 extending in the horizontal direction.

An n-side electrode 83 formed on the side opposed to the p-side electrode 75 is taken as a common electrode. As shown in FIG. 9, the n-side electrode 83 having a stacked layer structure of Ti/Al/Pt/Au is formed in an opening portion 82 formed in the selection mask 93 by vapor-deposition. The n-side electrode 83 is connected to the under growth layer 92, and is electrically connected to the first conductive type cladding layer of the hexagonal pyramid shaped GaN layer 95 formed on the under growth layer 92 by selective growth. The n-side electrode 83 is connected to a wiring layer 81 extending, on the surface side of the n-side electrode 83, in the vertical direction, to receive supply of a current given to the light emitting diode.

According to the display unit having the above-described configuration in this embodiment, at least the periphery of the device is surrounded by the planes grown from the tilt planes, and the conductive layers, that is, the GaN layer 95 as the cladding layer, the InGaN layer 96 as the active layer, and the magnesium-doped GaN layer 97 as the cladding layer are formed in self-alignment in such as to be terminated on the selection mask 93 as the insulating film used for selective growth. As a result, at the time of formation of electrodes, device isolation is not required or easily formed. Thus, it is possible to reduce the number of steps needed for fabricating the display unit. Also, according to the display unit in this embodiment, the emission of light of multi-colors can be realized by making use of the emission wavelength control functions of the dummy devices 72R, 73B and 74G each extending in line. Further, the emission of light of multi-colors can be realized just by changing the arrangement patterns of the dummy devices of the selection masks while forming the light emitting devices having the same layer structure on the same sapphire substrate 70. Consequently, as compared with a display unit formed by combining light emitting devices formed by different fabrication processes, it is possible to significantly simplify the fabrication steps and to enhance the positional accuracy of the light emitting devices of the display unit.

Fourth Embodiment

A display unit according to this embodiment will be described with reference to FIGS. 10 to 15. The display unit in this embodiment is fabricated by forming semiconductor light emitting devices for red, semiconductor light emitting devices for blue, and semiconductor light emitting devices for green on sapphire substrates 100R, 100B and 100G, respectively, and sticking the sapphire substrates 100R, 100B and 100G to each other.

Figure 10:
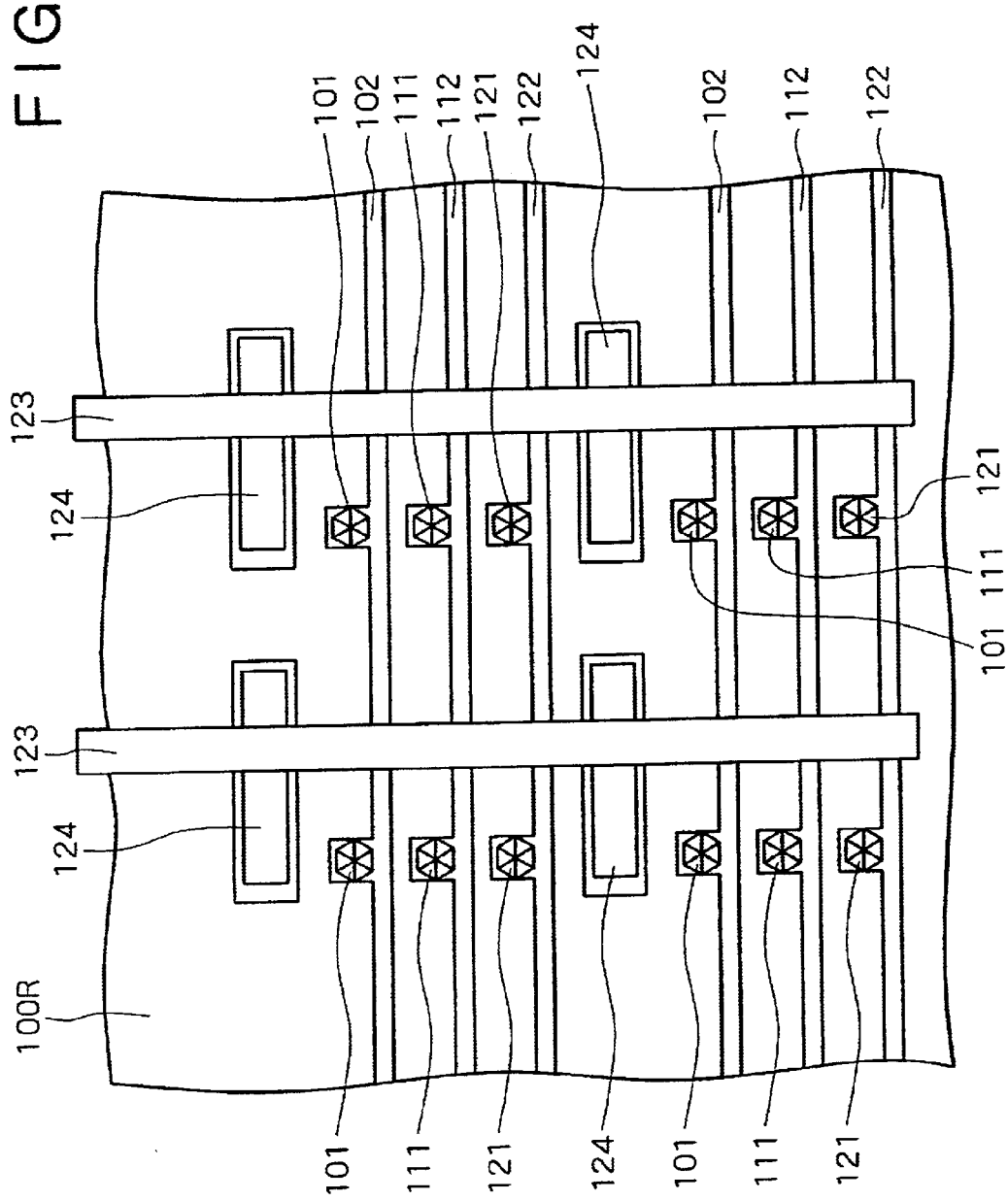
FIG. 10 is a plan view showing a device layout of one pixel portion of a display unit according to a fourth embodiment of the present invention.

FIG. 10 is a plan view showing, from above, a stack of the three sapphire substrates 100R, 100B and 100G. Each of a blue light emitting diode 101, a green light emitting diode 111, and a red light emitting diode 121 is fabricated by forming a first conductive type cladding layer, an active layer, and a second conductive type cladding layer on a GaN based nitride semiconductor layer. Also, each diode has an approximately hexagonal pyramid shape formed by selective growth. A structure of each of the light emitting diodes 101, 111, 121 is substantially the same as that of the light emitting diode 11R in the first embodiment, respectively. To obtain emission of light of blue, green and red, doped amounts of indium of active layers and the like of the light emitting diodes 101, 111, and 121 are controlled.

Figure 11:
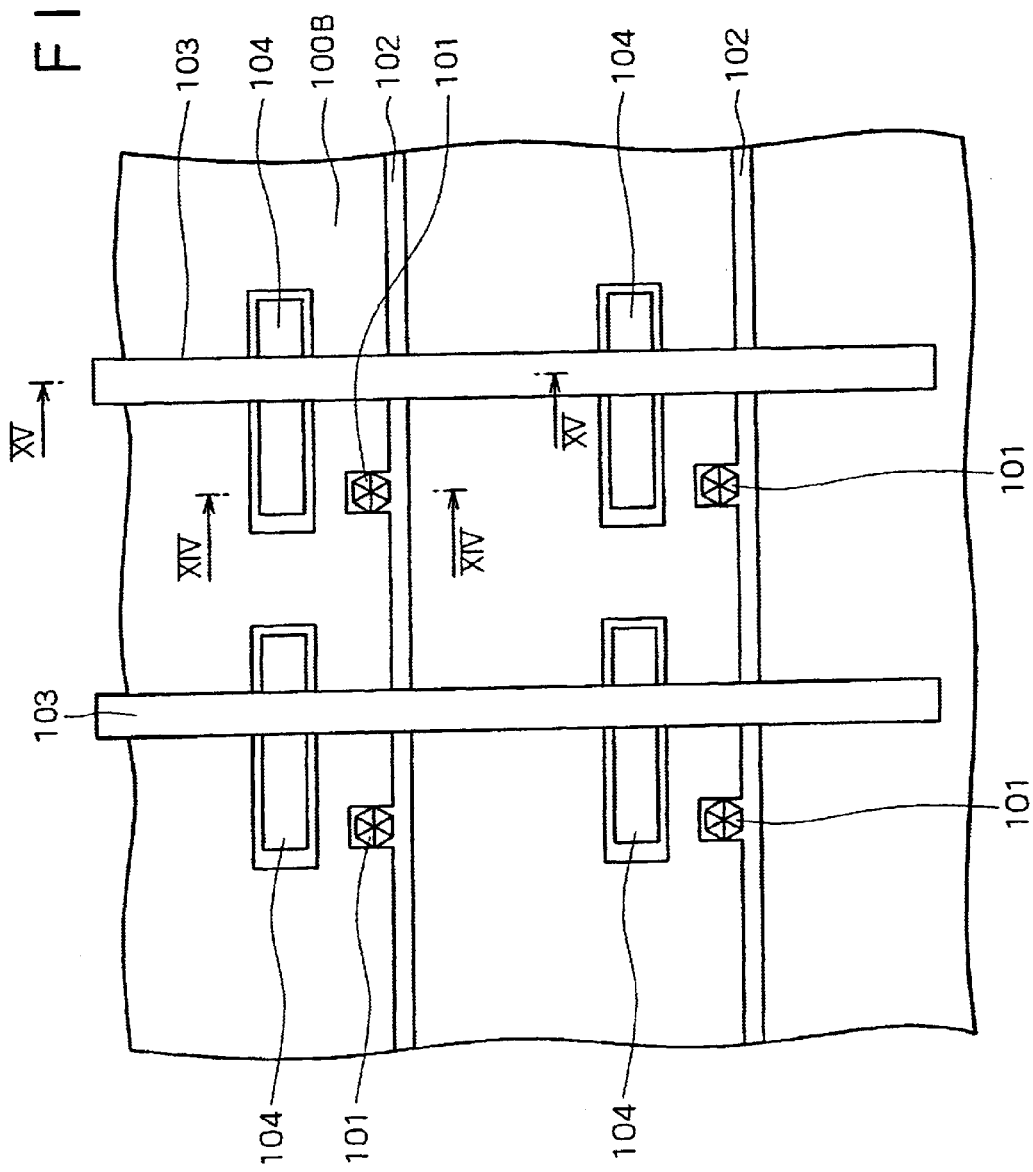
FIG. 11 is a plan view showing a layout of blue light emitting diodes of the display unit according to the fourth embodiment.
Figure 12:
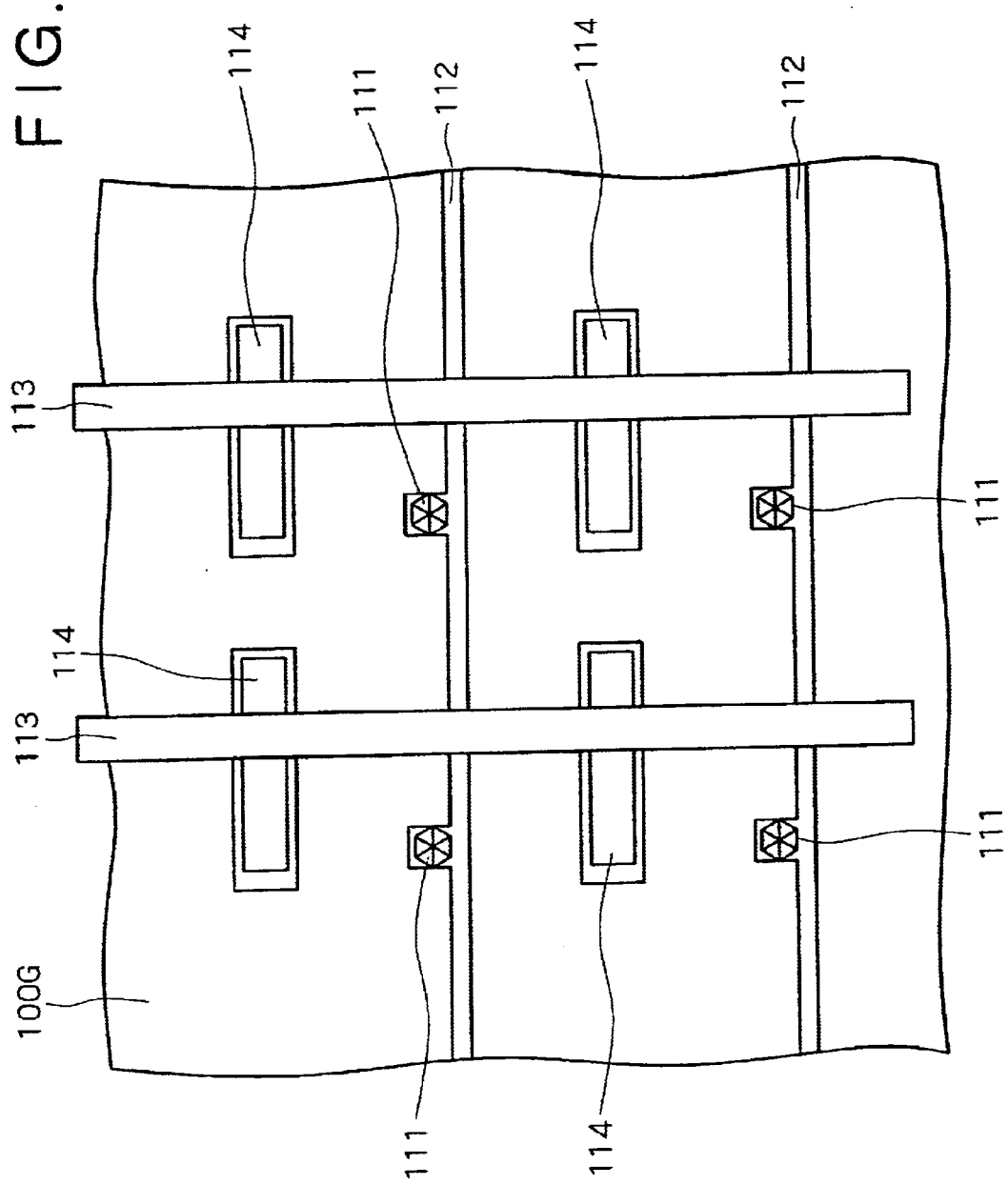
FIG. 12 is a plan view showing a layout of green light emitting diodes of the display unit according to the fourth embodiment.
Figure 13:
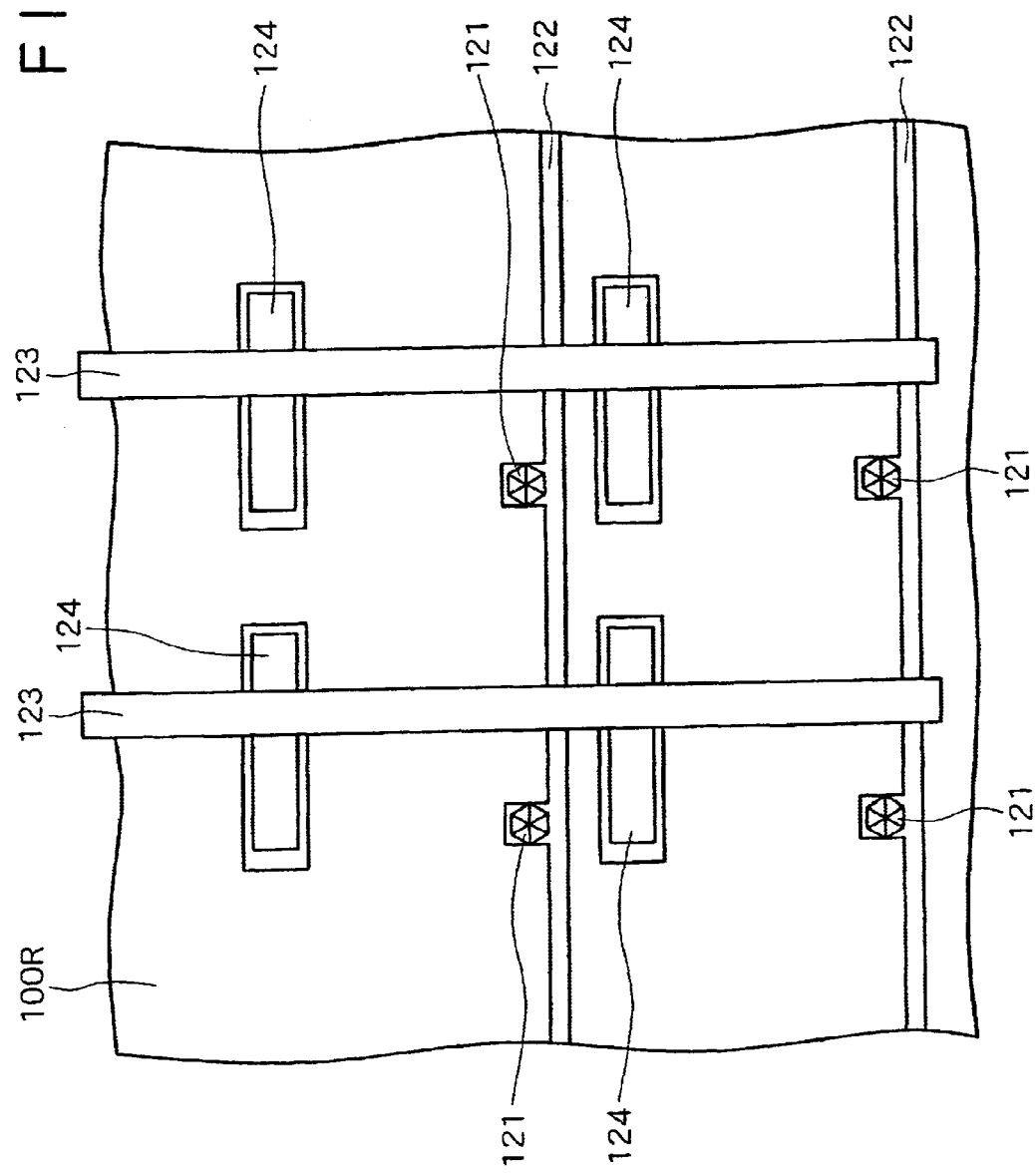
FIG. 13 is a plan view showing a layout of red light emitting diodes of the display unit according to the fourth embodiment.

FIGS. 11 to 13 are plan views showing the sapphire substrates 100B, 100G and 100R, respectively, wherein FIG. 11 shows the sapphire substrate 100B on which the blue light emitting devices 101 are formed, FIG. 12 shows the sapphire substrate 100G on which the green light emitting diodes 111 are formed, and FIG. 13 shows the sapphire substrate 100R on which the red light emitting diodes 121 are formed. Referring to FIG. 11, on the sapphire substrate 100B, the blue light emitting diodes 101 are arrayed in a matrix, and a number of horizontal wiring lines 102 extending in the horizontal direction and a number of vertical wiring lines 103 extending in the direction perpendicular to the horizontal wiring lines 102 are formed. The horizontal wiring lines 102 are connected to p-side electrodes of the blue light emitting diodes 101. N-side electrodes 104 of the blue light emitting diodes 101 are formed in opening portions formed in a selection mask, and are connected to the vertical wiring lines 103. The n-side electrodes 104 are provided for the blue light emitting devices 101 in a one-to-one relationship. However, as described in the previous embodiments, they may be configured as one common electrode.

Referring to FIG. 12, on the sapphire substrate 100G, the green light emitting diodes 111 are arrayed in a matrix, and a number of horizontal wiring lines 112 extending in the horizontal direction and a number of vertical wiring lines 113 extending in the direction perpendicular to the horizontal wiring lines 112 are formed. The arrangement pitch of the green light emitting diodes 111 is the same as that of the blue light emitting diodes 101. However, the arrangement of the green light emitting diodes 111 is offset from that of the blue light emitting diodes 101 by a distance equivalent to one device in the vertical direction in the figure. The horizontal wiring lines 112 are connected to p-side electrodes of the green light emitting diodes 111. N-side electrodes 114 of the green light emitting diodes 111 are formed in opening portions formed in a selection mask, and are connected to the vertical wiring lines 113. The n-side electrodes 114 are provided for the green light emitting devices 111 in a one-to-one relationship. However, as described in the previous embodiments, they may be configured as one common electrode.

Referring to FIG. 13, on the sapphire substrate 100R, the red light emitting diodes 121 are arrayed in a matrix, and a number of horizontal wiring lines 122 extending in the horizontal direction and a number of vertical wiring lines 123 extending in the direction perpendicular to the horizontal wiring lines 122 are formed. The arrangement pitch of the red light emitting diodes 121 is the same as that of the blue light emitting diodes 101. However, the arrangement of the red light emitting diodes 121 is offset from that of the green light emitting diodes 111 by a distance equivalent to one device in the vertical direction in the figure. The horizontal wiring lines 122 are connected to p-side electrodes of the red light emitting diodes 121. N-side electrodes 124 of the red light emitting diodes 121 are formed in opening portions formed in a selection mask, and are connected to the vertical wiring lines 123. The n-side electrodes 124 are provided for the red light emitting devices 121 in a one-to-one relationship. However, as described in the previous embodiments, they may be configured as one common electrode.

The vertical wiring lines 103 on the sapphire substrate 100B having the blue light emitting diodes 101, the vertical wiring lines 113 on the sapphire substrate 100G having the green light emitting diodes 111, and the vertical wiring lines 123 on the sapphire substrate 100R having the red light emitting diodes 121 are located at the same positions in the horizontal direction. Similarly, the n-side electrodes 104 on the sapphire substrate 100B, the n-side electrodes 114 on the sapphire substrate 100G, and the n-side electrodes 124 on the sapphire substrate 100R are located at the same positions in the horizontal and vertical directions. With this configuration, since the vertical wiring lines 103, 113 and 123 are overlapped to each other and the n-side electrodes 104, 114 and 124 are overlapped to each other, it is possible to facilitate wiring when giving a common potential. Further, since the wiring lines are located at the same positions, it is possible to enhance the degree of freedom in design of the layout of the light emitting diodes.

Figure 14:
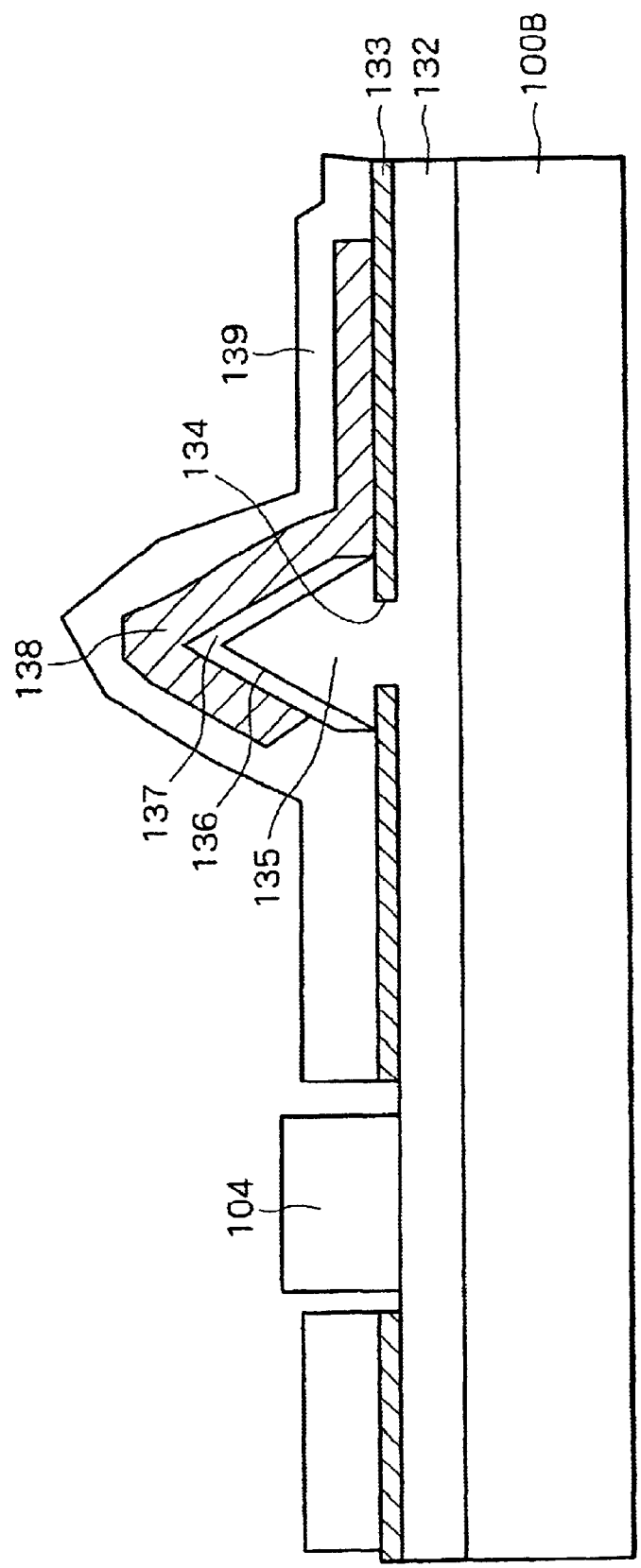
FIG. 14 is a sectional view taken on line XIV—XIV of FIG. 11, showing the blue light emitting diode of the display unit according to the fourth embodiment.
Figure 15:
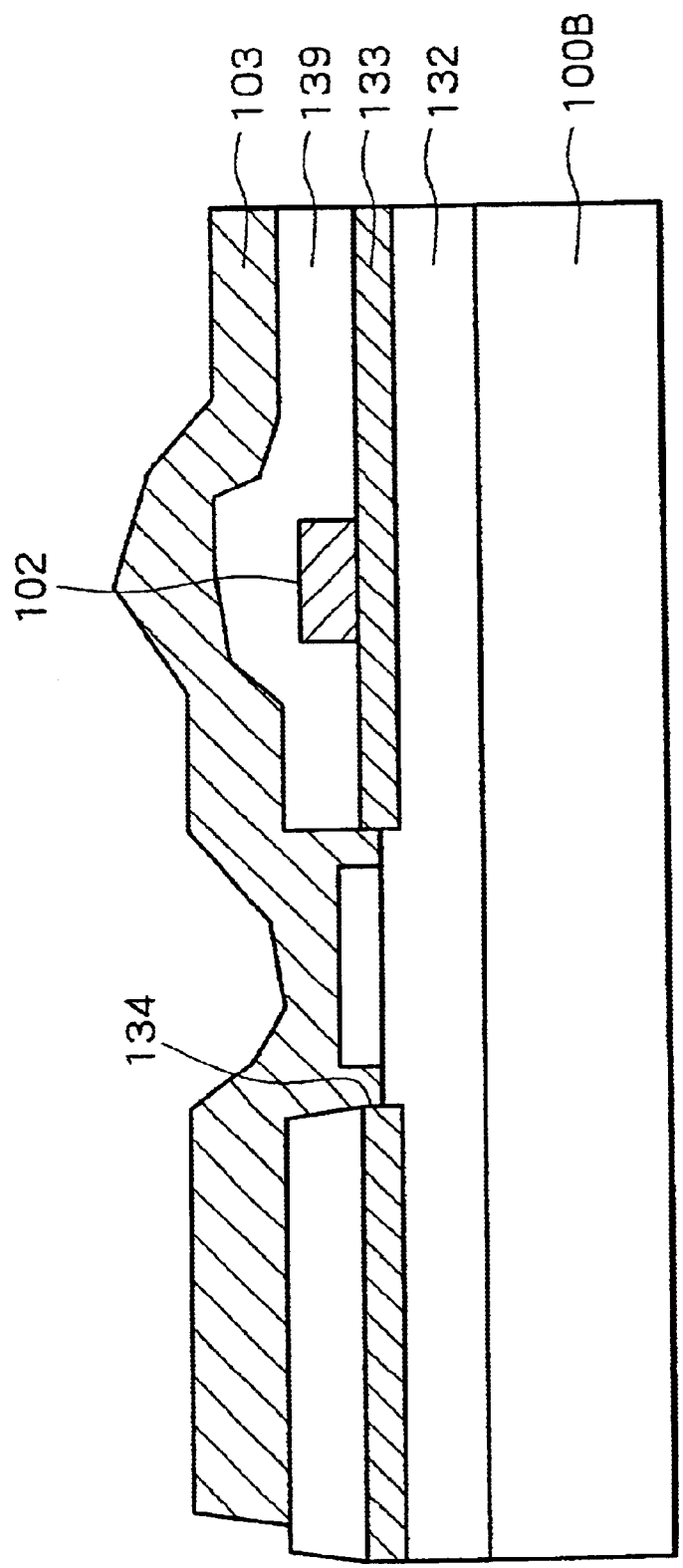
FIG. 15 is a sectional view taken on line XV—XV of FIG. 11, showing the blue light emitting diode of the display unit according to the third embodiment.

A structure of each of the light emitting diodes for red, blue and green and a structure of a wiring portion associated therewith will be described with reference to FIGS. 14 and 15. FIG. 14 is a sectional view taken on line XIV—XIV of FIG. 11, showing a sectional structure of the blue light emitting diode 101. The blue light emitting diode 101 is configured as a GaN based light emitting diode. The blue light emitting diode 101 is configured such that an under growth layer 132 typically composed of an AlN buffer layer and a silicon-doped GaN semiconductor layer is formed on the sapphire substrate 100B with the (C+)-plane of sapphire taken as a principal plane thereof, and a hexagonal pyramid shaped GaN layer 135 is formed thereon by selective growth. To be more specific, a selection mask 133 composed of a silicon oxide film is formed on the under growth layer 132, an opening portion 134 is formed in the selection mask 133, and the hexagonal pyramid shaped GaN layer 135 is selectively grown from the opening portion 134. The opening portion 134 is equivalent to the opening portion 25R formed in the mask shown in FIG. 2. The hexagonal pyramid shaped GaN layer 135 is formed by selective growth from the opening portion 134 formed in the selection mask 133 by the MOCVD process or the like.

When growing the GaN layer 135 on the sapphire substrate 100B with the C-plane of sapphire taken as the principal plane thereof, the GaN layer 135 is formed into the hexagonal pyramid shape covered with the (1-101) planes called the S-planes. The conductive type of the GaN layer 135 is taken as an n-type by doping silicon into the GaN layer 135. The GaN layer 135 is grown from the opening portion 134 formed in the selection mask 133 in such a manner as to have the S-planes as the tilt planes, and one conductive layer will be formed in self-alignment on planes grown from the S-planes as the tilt planes of the GaN layer 135. It is to be noted that the GaN layer 135 is grown in self-alignment in such a manner as to be terminated on the selection mask 133 as the insulating film used for selective growth. The tilt plane portions, that is, the S-plane portions of the GaN layer 135 function as a cladding layer constituting part of a double-hetero structure. An InGaN layer 136 as an active layer is formed to cover the GaN layer 135, and a magnesium-doped GaN layer 137 is formed on the InGaN layer 136. The magnesium-doped GaN layer 137 also functions as a cladding layer constituting part of the double-hetero structure. The magnesium-doped GaN layer 137 is grown in self-alignment, that is, extends along the tilt planes (S-planes) toward the selection mask 133 composed of the insulating film and is terminated on the selection mask 133. The terminated point of the magnesium-doped GaN layer 137 corresponds to the peripheral end portion of the light emitting device. Accordingly, when fabricating the display unit, the GaN layer 135 as the cladding layer, the InGaN layer 136 as the active layer, and the magnesium-doped GaN layer 137 as the cladding layer are not required to be subjected to device isolation. In other words, each of the light emitting devices for forming the display unit can be arrayed in self-alignment at the position corresponding to each opening portion 134 formed in the selection mask 133. A thickness of the InGaN layer 136 as the active layer is typically set to about 3 nm, and a thickness of the magnesium-doped GaN layer 137 is typically set to about 20 nm.

A p-side electrode 138 is formed on the magnesium-doped GaN layer 137. The p-side electrode 138 typically has a stacked layer structure of Ni/Pt/Au or Ni(Pd)/Pt/Au formed by vapor-deposition. As one example of the stacked layer structure of the p-side electrode 138, an Ni layer having a thickness of about 1 nm, a Pt layer having a thickness of about 10 nm, and an Au layer having a thickness of about 100 nm are stacked in this order. The p-side electrode 138 is connected to the wiring layer 102 extending in the horizontal direction.

An n-side electrode 104 formed on the side opposed to the p-side electrode 138 is taken as a common electrode. As shown in FIG. 15, the n-side electrode 104 having a stacked layer structure of Ti/Al/Pt/Au is formed in an opening portion 134 formed in the selection mask 133 by vapor-deposition. The n-side electrode 104 is connected to the under growth layer 132, and is electrically connected to the first conductive type cladding layer of the hexagonal pyramid shaped GaN layer 135 formed on the under growth layer 132 by selective growth. The n-side electrode 104 is connected to a wiring layer 103 extending, on the surface side of the n-side electrode 104, in the vertical direction, to receive supply of a current given to the light emitting diode.

According to the display unit having the above-described configuration in this embodiment, at least the periphery of the device is surrounded by the planes grown from the tilt planes, and the conductive layers, that is, the GaN layer 135 as the cladding layer, the InGaN layer 136 as the active layer, and the magnesium-doped GaN layer 137 as the cladding layer are formed in self-alignment such as to be terminated on the selection mask 133 as the insulating film used for selective growth. As a result, at the time of formation of electrodes, device isolation is not required or easily formed, thereby reducing the number of steps needed for fabricating the display unit. Also, according to this embodiment, it is possible to fabricate a display unit having light emitting devices arrayed at a high positional accuracy.

Fifth Embodiment

Hereinafter, a display unit according to a fifth embodiment will be described with reference to FIGS. 16 to 46. The display unit according to this embodiment has a structure that three substrates, on which three kinds of light emitting diodes allowing emission of red, blue and green are arrayed, respectively, are stacked to each other. It is to be noted that the following description of this embodiment is focused on a stacked structure of three substrates and a transfer method of devices (light emitting diodes) to each substrate.

Figure 16:
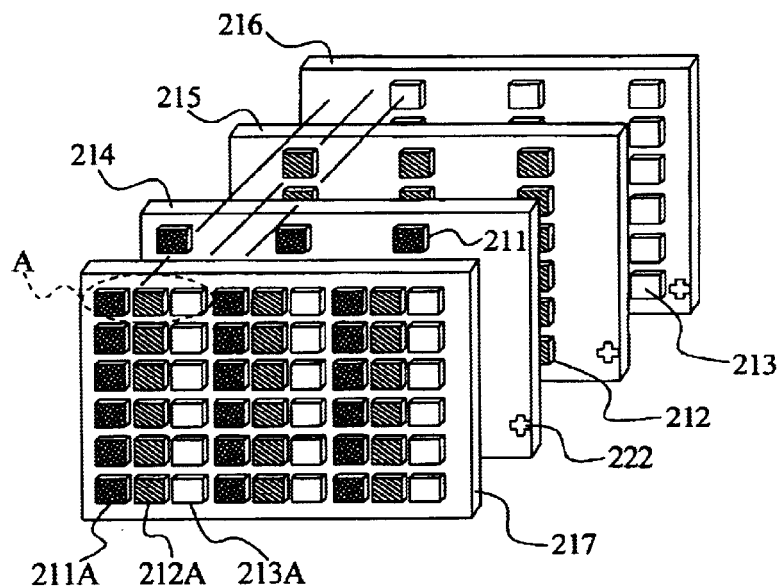
FIG. 16 is an exploded perspective view showing a pixel array of a display unit of the present invention, wherein light emitting diodes of three colors are mounted on separate substrates and the substrates are stacked to each other.
Figure 17:
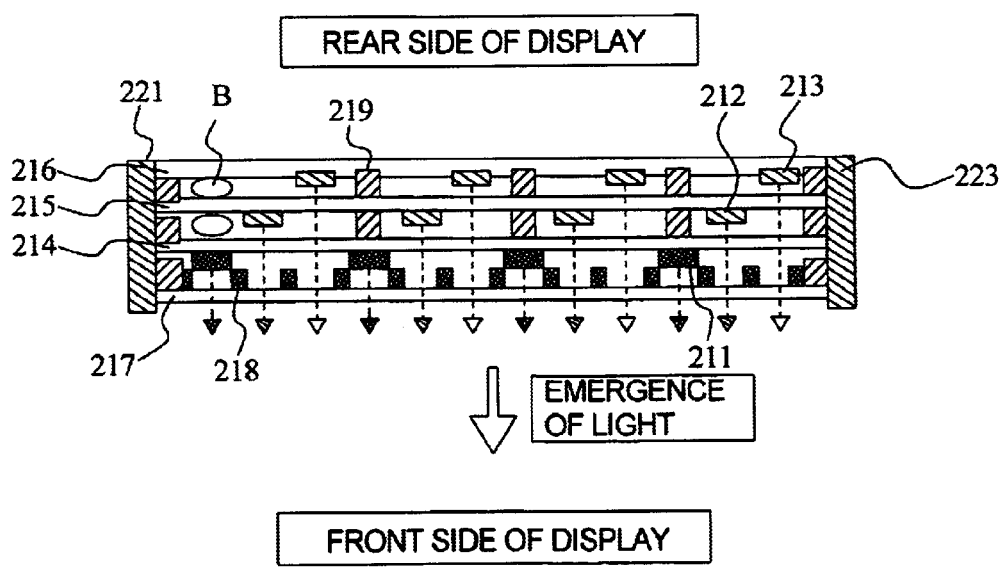
FIG. 17 is a sectional view showing the display unit of the present invention shown in FIG. 16.

A method of arraying light emitting diodes in the display unit according to this embodiment and a configuration of the display unit will be described first. FIG. 16 is an exploded perspective view showing an array of pixels of the display unit according to this embodiment, wherein the display unit is configured by transferring light emitting diodes 211, 212, and 213 of three colors (red, green, and blue) to three substrates 214, 215 and 216, respectively and stacking the substrates 214, 215, and 216 to each other. FIG. 17 is a sectional view showing a configuration of the display unit shown in FIG. 16, wherein the light emitting diodes 211, 212, and 213 of red, blue, and green, which are in the forms of resin molded chips (to be described later), are mounted on the substrates 214, 215 and 216, respectively. The light emitting diodes on each substrate are not arrayed in a simple matrix, that is, not arrayed such as to be spaced from each other in the horizontal and vertical directions at equal intervals, but arrayed in a number of rows spaced from each other at intervals of at least two rows. Each light permeable region is formed between two of the number of rows of the light emitting diodes on each substrate, and as will be apparent from FIG. 16, the number of rows of the light emitting diodes (for example, 211) disposed on the substrate (for example, 214) located on the front side in the light emergence direction are offset in the horizontal direction from the number of the light emitting diodes (for example, 212) disposed on the substrate (for example, 215) on the rear side (back side) in the light emergence direction by one row in order to allow transmission of light emitted from the light emitting diodes (for example, 212) disposed on the substrate (for example, 215) on the rear side through the light permeable regions on the substrate (for example, 214) on the front side. In the figures, the blue light emitting diode substrate 216, the green light emitting diode substrate 215, and the red light emitting diode substrate 214 are stacked in this order from the back side of the display unit, and an overall protective substrate 217 provided with a black filter is disposed on the front surface side of the red light emitting diode substrate 214. As shown by a portion A surrounded by a broken line in FIG. 16, each of pixel units 211A, 212A, and 213A is configured by a combination of light emitting diodes of three colors, and accordingly, a positional relationship between two of the three substrates is required to be set with some degree of accuracy. To meet such a requirement, alignment marks 222 are provided on the substrates 214, 215, and 216 for preventing a positional deviation between two of the three substrates by carrying out the positional adjustment using the alignment marks 222 during the production process. The array of the light emitting diodes on each substrate is not limited to that shown in the figures but may be configured in any manner insofar as only the light emitting diodes of one color allocated to the substrate remain (i.e., the light emitting diodes of the other two colors are removed) from the array of the light emitting diodes, which array allows the three colors of blue, green, and red to be disposed adjacently to each other and to form one pixel on the black filter.

Referring to FIG. 17, to hold a gap between adjacent two of the black filter 217 and the substrates 214, 215, and 216, each spacer 219 can be disposed in such a gap therebetween. The substrates 214, 215, and 216 are fixed to each other by using ultraviolet ray curing type (UV resin) made adhesives 221 and 223. As shown in FIG. 17, spaces through which light does not pass (spaces B in FIG. 17), which are for example located on back sides of the light emitting diodes 211 and 212, can be used as arrangement spaces for various members such as drivers (drive circuits).

Figure 18:
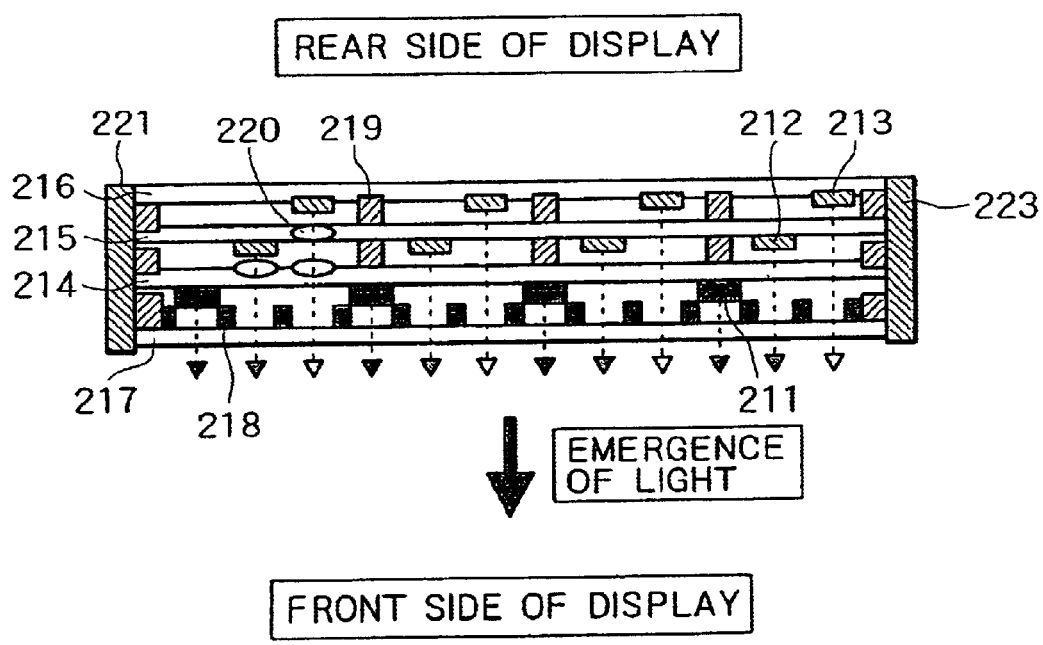
FIG. 18 is a sectional view of the display unit shown in FIG. 17, wherein condenser lenses are interposed in the display unit.
Figure 19:
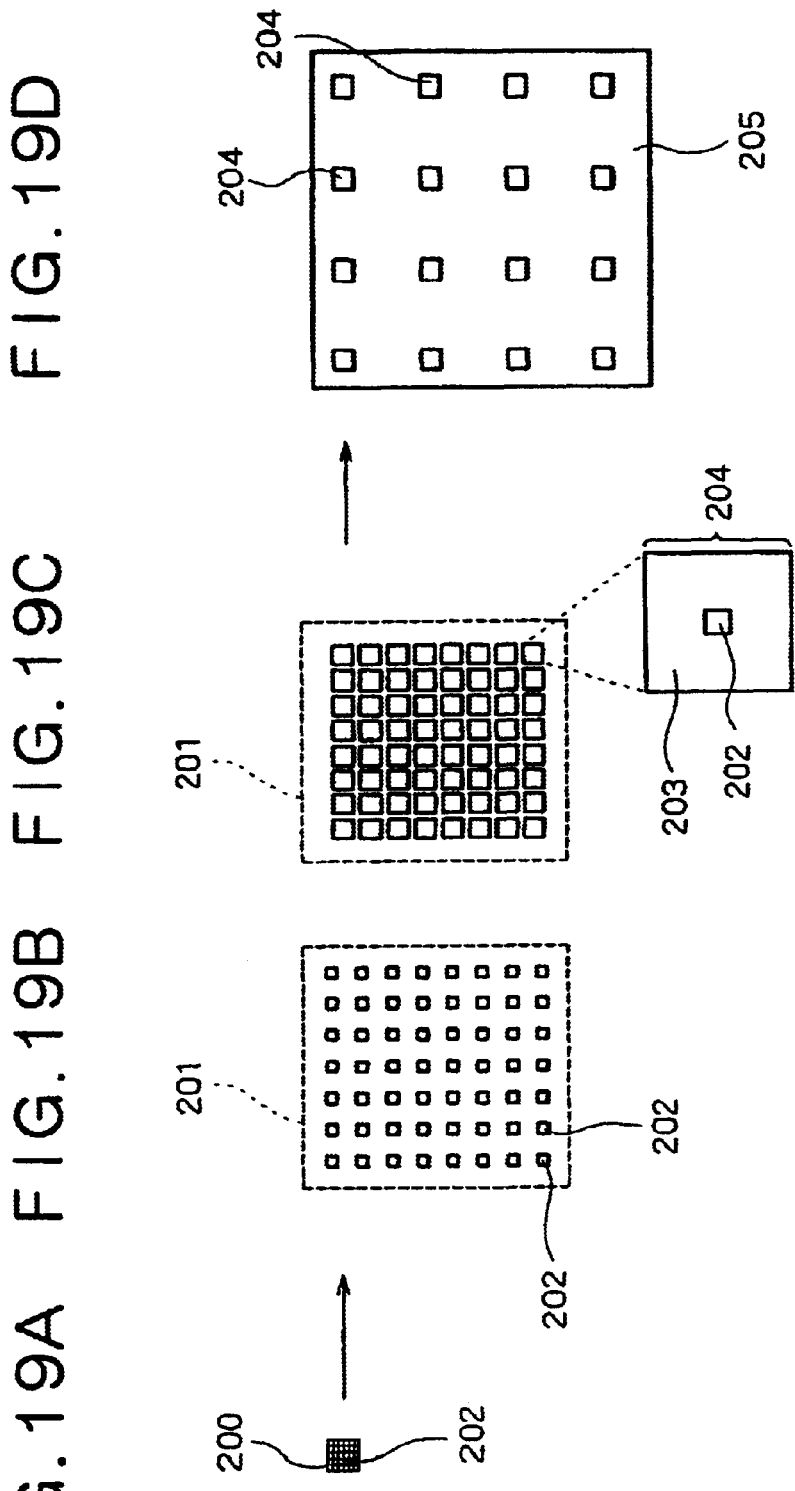
FIGS. 19A to 19D are views showing basic steps of a two-step enlarged transfer method used in a fifth embodiment of the present invention.

Lenses or other optical members can be interposed in the substrates. FIG. 18 shows an example in which condenser lenses 220 are arranged in the substrates. In this example, condenser lenses 220 are provided in the substrates 215 and 216 on which green and blue light emitting diodes are mounted, respectively, in order to prevent lowering of a transmittance (intensity of illumination) by reflection or divergency of light from the front side substrates 214 and 215. The lenses or other optical members may be arranged so as to serve as spacers between adjacent two of the substrates. In place of the condenser lenses 220, optical parts such as diffraction grating members may be arranged in order to prevent lowering of a transmittance by reflectance or divergency of light which has passed through the overlapped front side substrate.

The pixels 211A, 212A, and 213A of three colors, which correspond to the light emitting diodes 211, 212, and 213 of three colors, are projected from the front surface protective substrate 217 provided with the black filter, to thereby enable color display. The black filter is not necessarily disposed on the front surface protective substrate 217 but may be disposed on another substrate.

In general, when producing an image display unit by using light emitting diodes, the light emitting diodes must be arrayed such as to be spaced from each other. According to this embodiment, light emitting diodes on each substrate are not arrayed in a simple matrix, that is, not arrayed in such a manner as to be spaced from each other in the horizontal and vertical directions at equal intervals, but arrayed in a number of rows spaced from each other at intervals of at least two rows. To array light emitting diodes on each substrate while spacing them from each other as described above, various methods have been known. Of these methods, a two-step enlarged transfer method will be described below. According to the two-step enlarged transfer method, devices are enlargedly transferred in two steps. To be more specific, devices formed on a first substrate at a high degree of integration are transferred to a temporarily holding member such as to be spaced from each other with an array pitch larger than that of the devices arrayed on the first substrate, and then the devices held on the temporarily holding member are transferred to a second substrate such as to be spaced from each other with an array pitch larger than that of the devices held on the temporarily holding member. It is to be noted that the two-step enlarged transfer method is described for illustrative purposes only, and according to the present invention, the enlarged transfer method may be performed in multiple steps such as three or more steps, depending on a required enlargement degree of devices, that is, a ratio of an array pitch of devices on a final substrate to that of the devices on an initial substrate.

FIGS. 19A to 19D are views showing basic steps of the two-step enlarged transfer method. First, devices 202 such as light emitting devices are densely formed on a first substrate 200 shown in FIG. 19A. By densely forming devices on a substrate, the number of devices to be produced for each substrate can be increased, thereby reducing the cost of final products. As the first substrate 200, there can be used a substrate on which devices can be formed, such as a semiconductor wafer, a glass substrate, a quartz glass substrate, a sapphire substrate, and a plastic substrate. The devices 202 may be directly formed on the first substrate 200, or may be formed on another substrate once and arrayed on the first substrate 200.

As shown in FIG. 19B, the devices 202 are transferred from the first substrate 200 to a temporarily holding member 201 shown by a broken line in the figure and held on the temporarily holding member 201. On the temporarily holding member 201, the adjacent two of the devices 202 are spaced from each other, so that the devices 202 are arrayed in a matrix as a whole shown in the figure. To be more specific, the devices 202 are transferred on the temporarily holding member 201 in such a manner as to be enlargedly spaced from each other not only in the X direction but also in the Y direction (perpendicular to the X direction). The enlargement ratio of the array pitch of the devices 202 on the temporarily holding member 201 to the array pitch of the devices 202 on the first substrate 200 is not particularly limited but may be determined in consideration of formation of resin molded portions and formation of electrode pads in the subsequent steps. The devices 202 can all be transferred from the first substrate 200 to the temporarily holding member 201 such as to be enlargedly spaced from each other. In this case, a size of the temporarily holding member 201 along each of the X direction and the Y direction may be equal to or more than a value obtained by multiplying the number of the devices 202 arrayed in each of the X direction and the Y direction by the enlarged pitch of the devices 202 arrayed on the temporarily holding member 201. It is to be noted that part of the devices 202 on the first substrate 200 may be transferred to the temporarily holding member 201 such as to be enlargedly spaced from each other.

After such a first transfer step, as shown in FIG. 19C, covering of the device 202 with a resin and formation of an electrode pad are performed for each of the devices 202 which are enlargedly spaced from each other on the temporarily holding member 201. The covering of each device 202 with a resin is performed for easy formation of each electrode pad and easy handling of the device 202 in the subsequent second transfer step. As will be described later, final wiring will be performed after the second transfer step. Accordingly, each electrode pad is formed into a relatively large size to avoid causing a wiring failure in the final wiring step performed after the second transfer step. It is to be noted that the electrode pads are not shown in FIG. 19C. By covering each device 202 with a resin 203, a resin molded chip 204 is formed. The device 202 is located at an approximately central portion of the resin molded chip 204 in a plan view. However, the device 202 may be located at a position offset from the central portion to one side or to a corner of the resin molded chip 204.

The second transfer step is performed as shown in FIG. 19D. In the second transfer step, the devices 202 in the forms of the resin molded chips 204, arrayed in the matrix on the temporarily holding member 201, are transferred to a second substrate 205 such as to be more enlargedly spaced from each other. Even in the second transfer step, the adjacent two of the devices 202 in the forms of the resin molded chips 204 are spaced from each other, and the devices 202 are arrayed in a matrix as shown in the figure as a whole. To be more specific, the devices 202 are transferred such as to be enlargedly spaced from each other not only in the X direction but also in the Y direction. If positions of the devices 202 arrayed in the second transfer step correspond to positions of pixels of a final product such as an image display unit, then a pitch of the devices 202 arrayed in the second transfer step is about an integer multiple of an original pitch of the devices 202 arrayed on the first substrate 200. Assuming that an enlargement ratio of the array pitch of the devices 202 held on the temporarily holding member 201 to the array pitch of the devices 202 arrayed on the first substrate 200 is taken as "n" and an enlargement ratio of the array pitch of the devices 202 arrayed on the second substrate 205 to the array pitch of the devices 202 held on the temporarily holding member 201 is taken as "m", a total magnification E (that is, the above-described about an integer multiple) is expressed by E=n×m.

The devices 202 in the forms of the resin molded chips 204, arrayed on the second substrate 205 such as to be enlargedly spaced from each other, are then subjected to wiring. At this time, wiring is performed with care taken not to cause a connection failure by making use of the previously formed electrode pads and the like. If the devices 202 are light emitting devices such as light emitting diodes, then wiring to p-electrodes and n-electrodes is performed in this wiring step.

In the two-step enlarged transfer shown in FIGS. 19A to 19D, formation of each electrode pad and the like can be performed by making use of the enlarged space between adjacent two of the devices 202 arrayed on the temporarily holding member 201 by first transfer, and after second transfer, wiring can be performed while suppressing the occurrence of a connection failure as much as possible by making use of the previously formed electrode pads. Accordingly, it is possible to improve the production yield of the image display unit. Further, the two-step enlarged transfer method according to this embodiment includes the two steps in each of which the devices are enlargedly spaced from each other. By performing a number of such enlarged transfer steps, the number of transfer can be actually reduced. For example, assuming that an enlargement ratio of the array pitch of the devices arrayed on the temporarily holding member 201 to the array pitch of the devices arrayed on the first substrate 200 is taken as 2 (n=2) and an enlargement ratio of the array pitch of the devices arrayed on the second substrate 205 to the array pitch of the devices arrayed on the temporarily holding member 201 is taken as 2 (m=2), the total transfer magnification becomes 2×2=4. Accordingly, when transferring the devices from the first substrate 200 to the second substrate 205 at the total transfer magnification (2×2=4) by a one-step transfer method, the number of transfer (alignment) from the first substrate 200 to the second substrate 205 becomes a square of the total transfer magnification, that is, 16 (=4×4) times. On the contrary, according to the two-step enlarged transfer method, the number of transfer (alignment) is obtained by simply adding a square of the enlargement ratio of 2 in the first transfer step to a square of the enlargement ratio of 2 in the second transfer step, and therefore, the number of transfer becomes 8(=4+4). In other words, letting the enlargement ratios in the first and second steps be "n" and "m", respectively, according to the two-step enlarged transfer method, to achieve the total transfer magnification of n×m, the total number of transfer becomes $(n^2+m^2)$ times. Meanwhile, according to the one-step transfer method, to achieve the same transfer magnification of n×m, the number of transfer becomes $(n+m)^2=n^2+2\ nm+m^2$. As a result, according to the two-step enlarged transfer method, the number of transfer can be made smaller than that in the one-step transfer method by 2 nm times, thereby correspondingly saving time and cost required for the transfer step. In particular, such an effect becomes larger in the case of transferring the devices from the first substrate 200 to the second substrate 205 at a higher transfer magnification.

Figure 20:
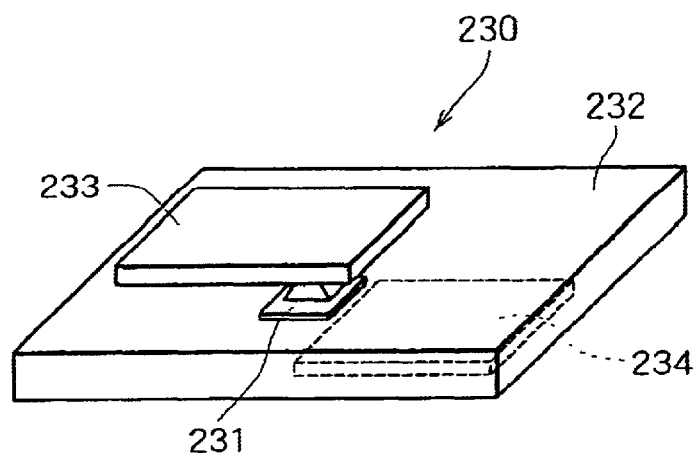
FIG. 20 is a schematic perspective view of a resin molded chip.
Figure 21:
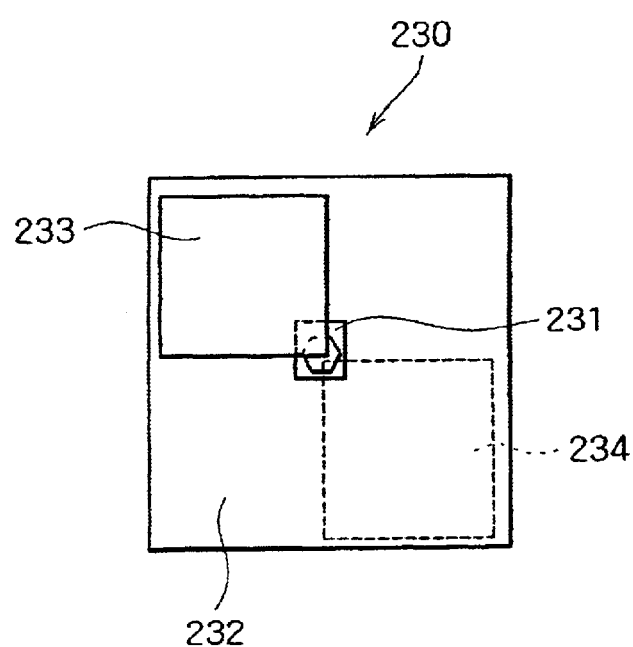
FIG. 21 is a plan view of the resin molded chip.

In the second transfer step, the device (light emitting diode) 202 is treated as the resin molded chip 204, and is transferred from the temporarily holding member 201 to the second substrate 205. The resin molded chips will be described below with reference to FIGS. 20 and 21. The resin molded chip, designated by reference numeral 230 in FIGS. 20 and 21, is obtained by covering each of light emitting devices 231, which are spaced from each other, with a resin 232. Such a resin molded chip 230 can be used when transferring the device 231 from the temporarily holding member to the second substrate. The resin molded chip 230 is formed into an approximately flat plate shape having an approximately square shaped principal plane. The shape of the resin molded chip 230 is that of the resin 232 molded to cover the device 231. To be more specific, the resin molded chips 230 are produced by coating the surface of the temporarily holding member with a non-hardened resin so as to cover the devices 231 therewith, hardening the resin, and cutting the hardened resin 232 into square chips by dicing or the like.

Electrode pads 233 and 234 are formed on front and back surfaces of the approximately flat plate like resin 232 of the resin molded chip 230, respectively. These electrode pads 233 or 234 are produced by forming a conductive layer made from a metal or polysilicon as a material of the electrode pads 233 or 234 overall on the surface of the resin 232, and patterning the conductive layer into specific electrode shapes by photolithography. These electrode pads 233 and 234 are formed so as to be connected to a p-electrode and an n-electrode of the device 231, and a via-hole is formed in the resin 232 as needed. The reason why the electrode pads 233 and 234 are offset from each other in the horizontal direction is to prevent the electrode pads 233 and 234 from being overlapped to each other when forming a contact hole from above at the time of forming final wiring. The shape of each of the electrode pads 233 and 234 is not limited to a square shape but may be any other shape.

Since the resin molded chip 230 formed by covering the device 231 with the resin 232 is flattened, the electrode pads 233 and 234 can be accurately formed on the flattened surfaces of the resin 232 of the resin molded chip 230 such as to extend to a region wider than the size of the device 231. Thus, the handling of the resin molded chip 230 at the time of transfer in the second transfer step, which is carried out by an attracting jig, may be facilitated. As will be described later, since final wiring is performed after the second transfer step, a wiring failure can be prevented by performing wiring using the electrode pads 233 and 234 having relatively large sizes.

Figure 22:
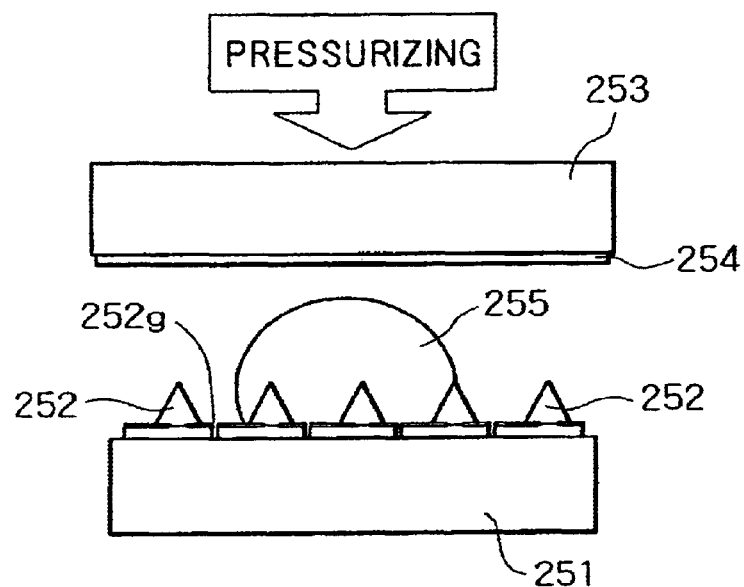
FIG. 22 is a schematic sectional view showing a step of joining a first temporarily holding member to a first substrate.

A procedure of producing an image display unit by arraying light emitting devices in accordance with the two-step enlarged transfer method will be described below. As light emitting devices, GaN based light emitting diodes may be used. As shown in FIG. 22, a number of light emitting diodes 252 are densely formed on a principal plane of a first substrate 251. A size of the light emitting diode 252 can be made as fine as a size having one side of about 20 $\mu$m. The first substrate 251 is made from a material, having a high transmittance against a wavelength of a laser beam to be emitted to the light emitting diode 252, for example, sapphire. The light emitting diode 252 is already provided with a p-electrode and the like but is not subjected to final wiring yet. Grooves 252g for device isolation are formed to allow the light emitting diodes 252 to be isolated from each other. The grooves 252g are formed, for example, by reactive ion etching.

The light emitting diodes 252 on the first substrate 251 are transferred to a first temporarily holding member 253. As the first temporarily holding member 253, a glass substrate, a quartz glass substrate, a plastic substrate, or the like may be used. In this embodiment, the temporarily holding member 253 is configured as a quartz glass substrate. A peeling layer 254 functioning as a releasing layer is formed on the first temporarily holding member 253. The peeling layer 254 can be configured as a fluorine coat, or a layer made from a silicone resin, a water soluble adhesive (for example, polyvinyl alcohol: PVA), polyimide, or the like. In this embodiment, the peeling layer 254 is configured as a layer made from polyimide.

Figure 23:
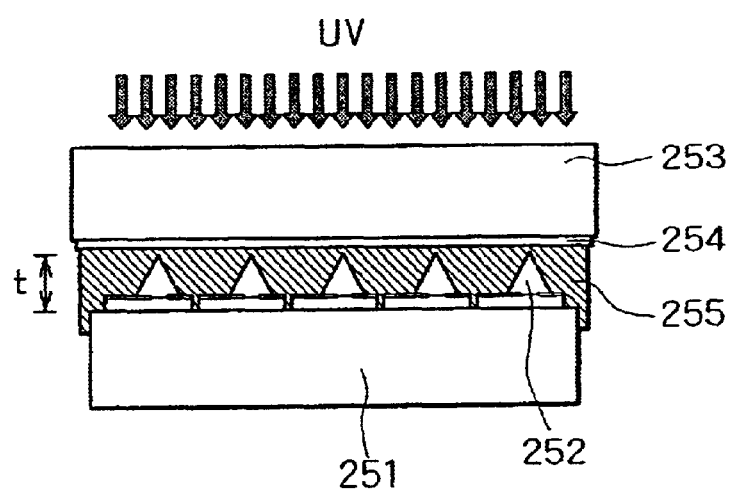
FIG. 23 is a schematic sectional view showing a step of hardening an UV-curing adhesive.

Before transfer, as shown in FIG. 22, the first substrate 251 is coated with an adhesive (for example, ultraviolet ray curing type adhesive) 255 in an amount sufficient to cover the light emitting diodes 252, and the first temporarily holding member 253 is overlapped to the first substrate 251 such as to be supported by the light emitting diodes 252. In such a state, as shown in FIG. 23, the adhesive 255 is irradiated, from the back side of the first temporarily holding member 253, with ultraviolet rays (UV), to be thereby cured. The first temporarily holding member 253, which is the quartz glass substrate, passes through the ultraviolet rays, thereby allowing the adhesive 255 to be quickly cured.

At this time, since the first temporarily holding member 253 is supported by the light emitting diodes 252, a gap between the first substrate 251 and the first temporarily holding member 253 is determined by a height of the light emitting diodes 252. By curing the adhesive 255 in the state that the first temporarily holding member 253 is overlapped to the first substrate 251 such as to be supported by the light emitting diodes 252 as shown in FIG. 23, a thickness "t" of the adhesive 255 is determined by the gap between the first substrate 251 and the first temporarily holding member 253, that is, the height of the light emitting diodes 252. In other words, the light emitting diodes 252 on the first substrate 251 serve as a spacer allowing formation of the adhesive layer having a specific thickness between the first substrate 251 and the first temporarily holding member 253. According to this embodiment, since the thickness of the adhesive layer is determined by the height of the light emitting diodes 252 (as described above), it is possible to form the adhesive layer having a specific thickness without strictly controlling a pressure applied to the adhesive 255.

Figure 24:
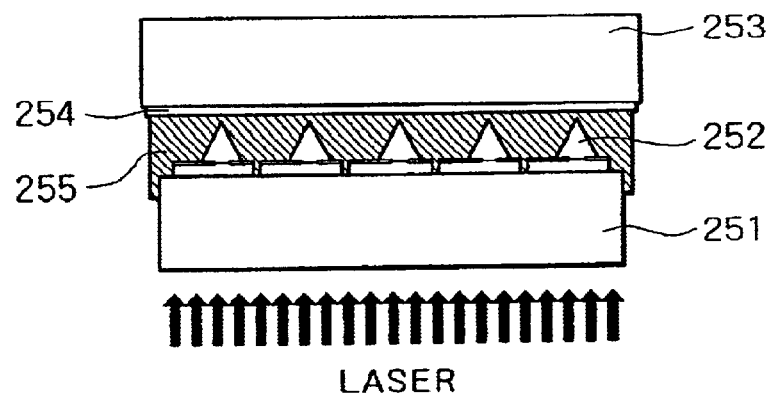
FIG. 24 is a schematic sectional view showing a step of performing laser abrasion.

After curing the adhesive 255, as shown in FIG. 24, the light emitting diodes 252 are irradiated with a laser beam from a back surface of the first substrate 251, to be peeled from the first substrate 251 by laser abrasion. Since the GaN based light emitting diode 252 is decomposed into gallium (Ga) and nitrogen at a boundary between the GaN layer and sapphire, the light emitting diode 252 can be relatively simply peeled. As the laser beam used for irradiation of the light emitting diode 252, an excimer laser beam, a harmonic YAG laser beam, or the like is used. The light emitting diodes 252 are peeled from the first substrate 251 at the boundary between the GaN layer and the first substrate 251 by laser abrasion, and are transferred to the first temporarily holding member 253 in a state being buried in the adhesive 255.

Figure 25:
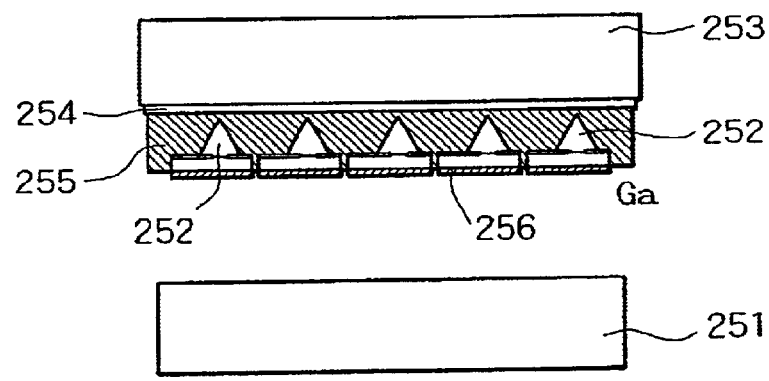
FIG. 25 is a schematic sectional view showing a step of separating the first substrate from the first temporarily holding member.
Figure 26:
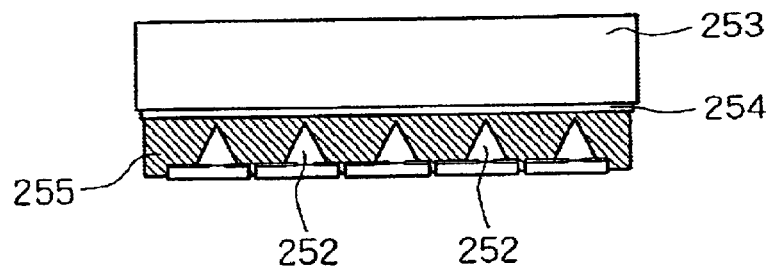
FIG. 26 is a schematic sectional view showing a step of removing gallium (Ga).
Figure 27:
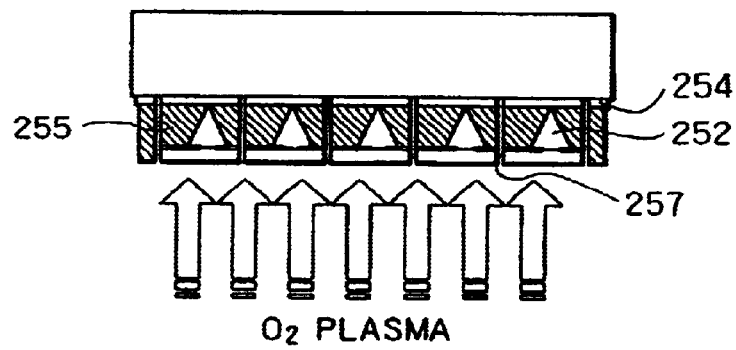
FIG. 27 is a schematic sectional view showing a step of forming device isolation grooves.

FIG. 25 shows a state that the first substrate 251 is removed by the above-described peeling. At this time, since the GaN based light emitting diodes 252 are peeled from the first substrate 251 made from sapphire by laser abrasion, gallium (Ga) 256 is precipitated on the peeled plane. Such deposited gallium (Ga) must be removed by etching. As shown in FIG. 26, gallium (Ga) 256 is removed by wet etching using a water solution containing NaOH, diluted nitric acid, or the like. As shown in FIG. 27, the peeled plane is further cleaned by oxygen plasma ($O_2$ plasma), and dicing grooves 257 are formed in the adhesive layer by dicing the adhesive 255, to isolate the light emitting diodes 252 from each other. The light emitting diodes 252 are then selectively separated from the first temporarily holding member 253. The dicing process can be performed by a usual blade. If a narrow cut-in-depth of about 20 $\mu$m or less is required, the above cutting may be performed by laser. The cut-in-depth is dependent on a size of the light emitting diode 252 covered with the adhesive 255 within a pixel of an image display unit. As one example, the grooves are formed by irradiation using an excimer laser beam, to form a shape of each chip.

Figure 28:
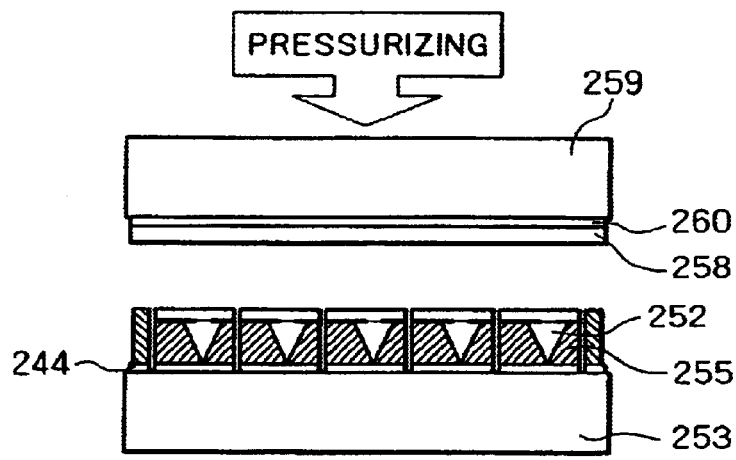
FIG. 28 is a schematic sectional view showing a step of joining a second temporarily holding member to the first temporarily holding member.

The selective separation of the light emitting diodes 252 is performed as follows. First, as shown in FIG. 28, the cleaned light emitting diodes 252 are coated with a thermoplastic resin type adhesive 258, and a second temporarily holding member 259 is overlapped to the adhesive 258. Like the first temporarily holding member 253, the second temporarily holding member 259 may be configured as a glass substrate, a quartz glass substrate, a plastic substrate or the like. In this embodiment, the second temporarily holding member 259 is configured as a quartz glass substrate. A peeling layer 260 made from polyimide is formed on a surface of the second temporarily holding member 259.

Figure 29:
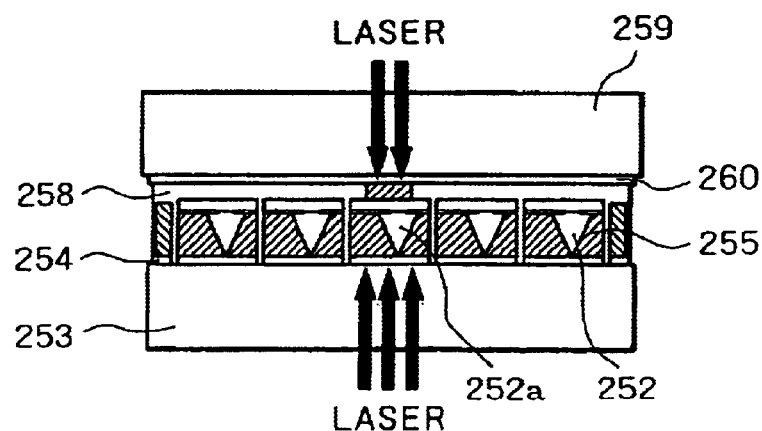
FIG. 29 is a schematic sectional view showing a step of performing selective laser abrasion and UV exposure.
Figure 30:
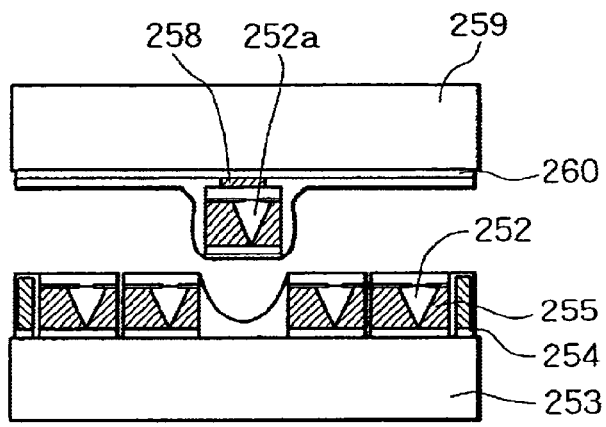
FIG. 30 is a schematic sectional view showing a step of selectively separating light emitting diodes from the second temporarily holding member.

As shown in FIG. 29, a position, corresponding to a light emitting diode 252a to be transferred, of the first temporarily holding member 253 is irradiated, from a back side of the first temporarily holding member 253, with a laser, to peel the light emitting diode 252a from the first temporarily holding member 253 by laser abrasion. At the same time, a position, corresponding to the light emitting diode 252a to be transferred, of the second temporarily holding member 259 is irradiated, from a back side of the second temporarily holding member 259, with visual or infrared laser rays, to temporarily melt and cure an irradiated portion of the thermoplastic resin type adhesive 258. As a result, when the second temporarily holding member 259 is peeled from the first temporarily holding member 253, only the light emitting diode 252a to be transferred is selectively separated from the first temporarily holding member 253 (as shown in FIG. 30) and is transferred to the second temporarily holding member 259.

Figure 31:
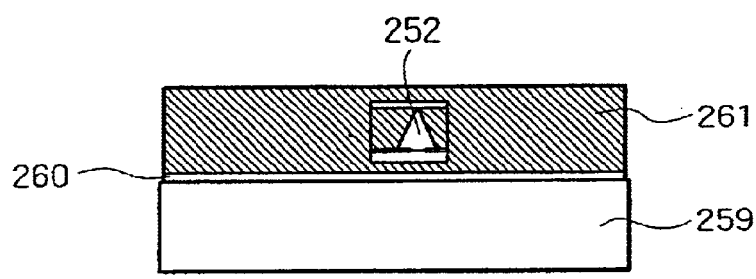
FIG. 31 is a schematic sectional view showing a step of burying the light emitting diode with a resin.
Figure 32:
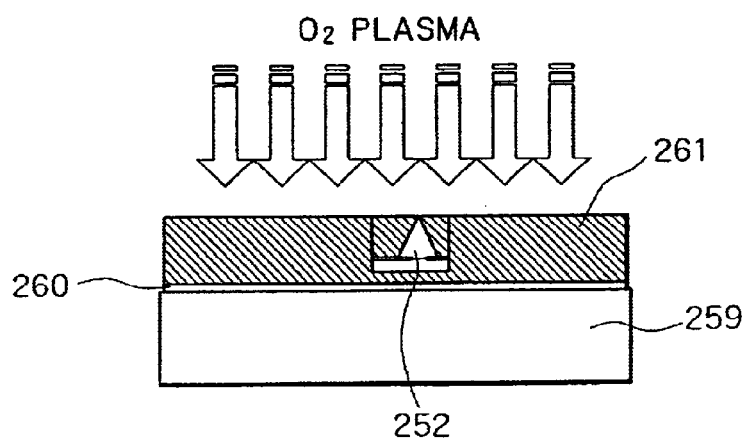
FIG. 32 is a schematic sectional view showing a step of reducing a thickness of a resin layer.
Figure 33:
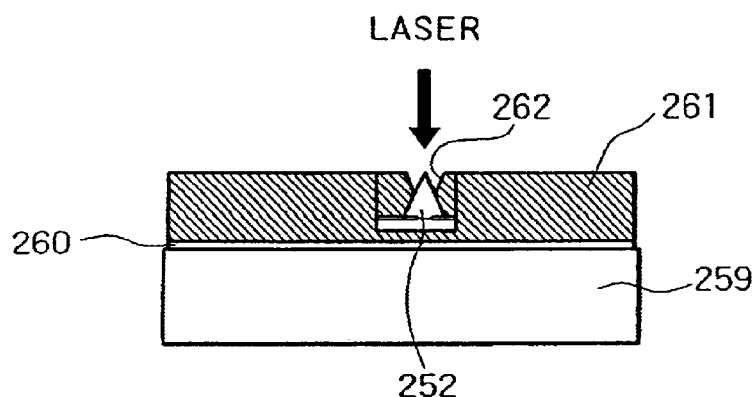
FIG. 33 is a schematic sectional view showing a step of forming via-holes.

After selective separation of the light emitting diode 252, as shown in FIG. 31, a resin is applied to cover the transferred light emitting diode 252, to form a resin layer 261. Subsequently, as shown in FIG. 32, a thickness of the resin layer 261 is reduced by oxygen plasma or the like until an upper surface of the light emitting diode 252 is exposed, and as shown in FIG. 33, a via-hole 262 is formed at a position, corresponding to the light emitting diode 252, of the resin layer 261 by laser irradiation. The formation of the via-hole 262 may be performed by irradiation of an excimer laser beam, a harmonic YAG laser beam, a carbon dioxide laser beam, or the like. A diameter of the via-hole 262 is typically set to a value ranging from about 3 $\mu$m to about 7 $\mu$m.

Figure 34:
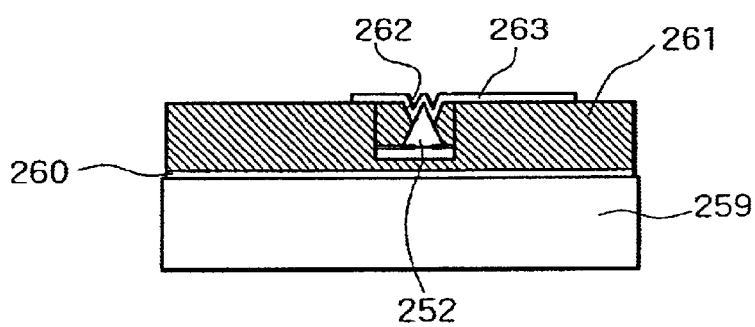
FIG. 34 is a schematic sectional view showing a step of forming an anode side electrode pad.

An anode side electrode pad 263 to be connected to a p-electrode of the light emitting diode 252 is formed through the via-hole 262. The anode side electrode pad 263 is typically made from N/Pt/Au. FIG. 34 shows a state after the light emitting diode 252 is transferred to the second temporarily holding member 259. The anode electrode (p-electrode) side via-hole 262 is formed and then the anode side electrode pad 263 is formed.

Figure 35:
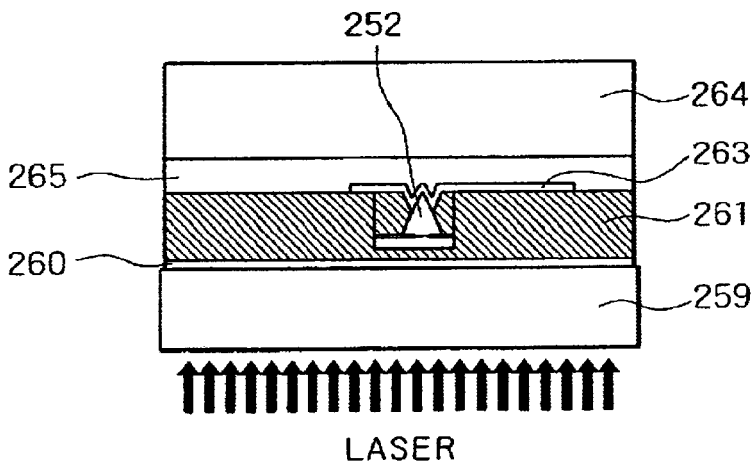
FIG. 35 is a schematic sectional view showing a step of performing laser abrasion.
Figure 36:
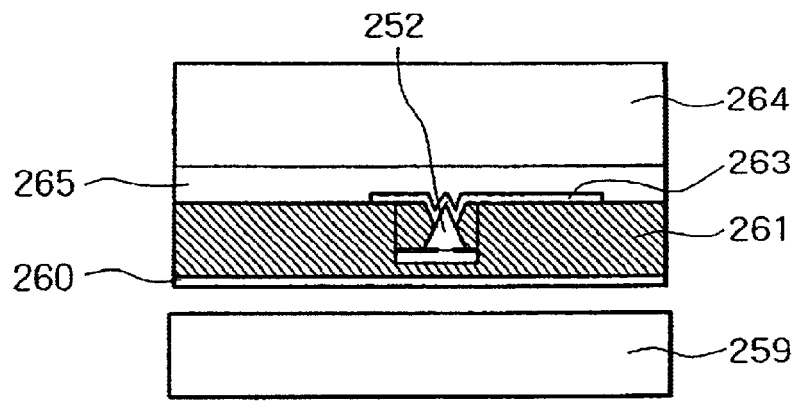
FIG. 36 is a schematic sectional view showing a step of separating the second temporarily holding member from a third temporarily holding member.

After formation of the anode side electrode pad 263, the light emitting diode 252 is transferred to a third temporarily holding member 264 for forming a cathode side electrode on a surface, opposed to the anode side electrode pad 263, of the light emitting diode 252. The third temporarily holding member 264 is typically made from quartz glass. Before transfer, as shown in FIG. 35, an adhesive 265 is applied to cover the light emitting diode 252 provided with the anode side electrode pad 263 and the resin layer 261, and then the third temporarily holding member 264 is stuck on the adhesive 265. In such a state, laser irradiation is performed from a back side of the second temporarily holding member 259, so that peeling by laser abrasion occurs at a boundary between the second temporarily holding member 259 made from quartz glass and the peeling layer 260 made from polyimide on the second temporarily holding member 259. As a result, the light emitting diode 252 and the resin layer 261 formed on the peeling layer 260 are transferred to the third temporarily holding member 264. FIG. 36 shows a state where the second temporarily holding member 259 is separated.

Figure 37:
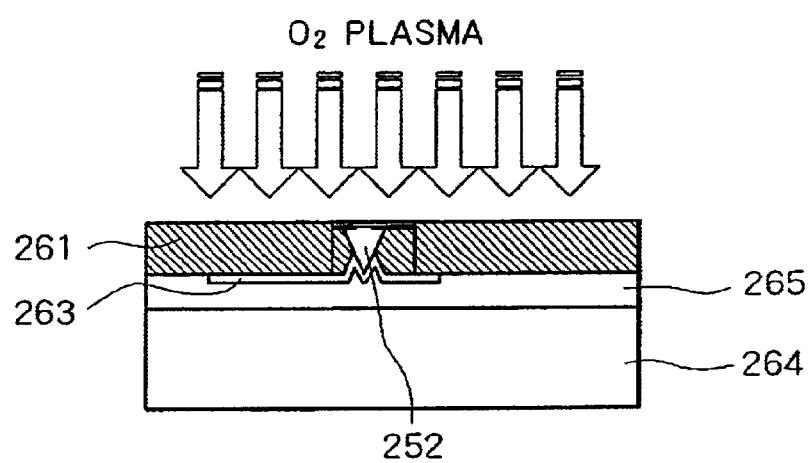
FIG. 37 is a schematic sectional view showing a step of exposing a contact semiconductor layer.
Figure 38:
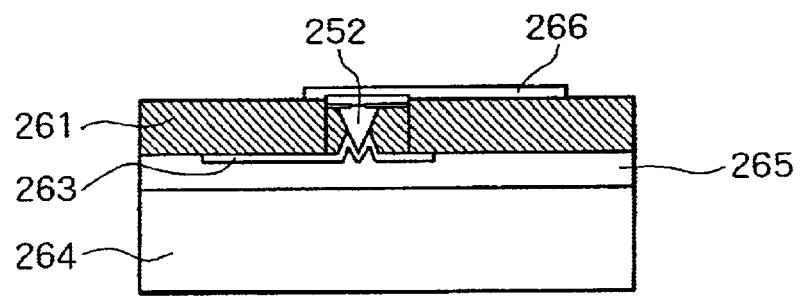
FIG. 38 is a schematic sectional view showing a step of forming a cathode side electrode pad.

The formation of the cathode side electrode will be performed as follows. After the above-described transfer step, as shown in FIG. 37, the peeling layer 260 and the excess resin layer 261 are removed by $O_2$ plasma until a contact semiconductor layer (n-electrode) of the light emitting diode 252 is exposed. In the state where the light emitting diode 252 is held by the adhesive 265 of the third temporarily holding member 264, a back side of the light emitting diode 252 is taken as the n-electrode side (cathode electrode side). As shown in FIG. 38, an electrode pad 266 is formed so as to be electrically connected to the back surface of the light emitting diode 252.

The electrode pad 266 is then patterned. At this time, a size of the cathode side electrode pad is typically set to about 60 $\mu$m square. As the electrode pad 266, Ti/Al/Pt/Au may be used. If the electrode pad 266 is required as a transparent electrode, it may be made from ITO or a ZnO based material or the like. When using a transparent electrode, even if the electrode covers a large area of the light emitting diode 252, it does not block light emission. Accordingly, in this case, the size of the electrode can be increased with a rough patterning accuracy, thereby facilitating the patterning process.

Figure 39:
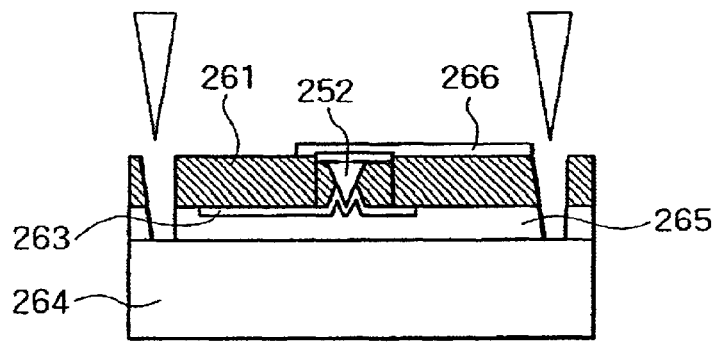
FIG. 39 is a schematic sectional view showing a step of performing laser dicing.

The light emitting diode 252 buried both in the resin layer 261 and the adhesive 265 is then isolated in the form of a resin molded chip, for example, by laser dicing. FIG. 39 shows the step of isolating the light emitting diode 252 by laser dicing. The laser dicing, which uses a linear laser beam, is performed so as to cut the resin layer 261 and the adhesive 265 until the third temporarily holding member 264 is exposed. Each light emitting diode 252 is isolated in the form a resin molded chip having a specific size by laser dicing, and is subjected to the mounting step (to be described later).

Figure 40:
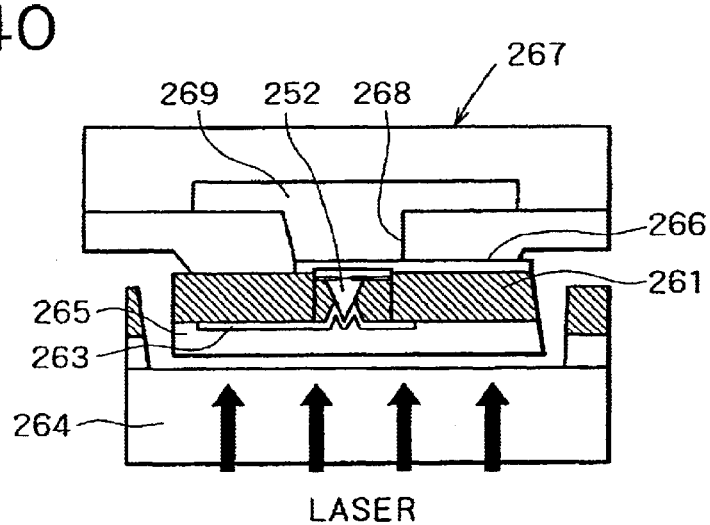
FIG. 40 is a schematic sectional view showing a step of selectively picking up the light emitting device by using an attracting device.

In the mounting step, the light emitting diode 252 (resin molded chip) is peeled from the third temporarily holding member 264 by combination of mechanical mechanism (a mechanism for attracting the device by vacuum suction) and laser abrasion. FIG. 40 shows a state that one of the light emitting diodes 252 arrayed on the third temporarily holding member 264 is picked up by an attracting device 267. The attracting device 267 has attracting holes 268 opened in a matrix corresponding to a pixel pitch of an image display unit in order to collectively attract a number of the light emitting diodes 252. To be more specific, the attracting holes 268, each having an opening diameter of about 100 $\mu$m, are arranged in a matrix with a pitch of 600 $\mu$m, and the attracting device 267 can collectively attract 300 pieces of the light emitting diodes 252. The portion of the attracting hole 268 may be produced from Ni by electro-casting. Alternatively, the attracting hole 268 may be formed in a plate made from a metal such as a stainless steel (SUS) by etching. An attracting chamber 269 is formed at the depth of the attracting hole 268. The control of the pressure in the attracting chamber 269 into a negative pressure allows the attracting device 267 to attract the light emitting diode 252. Since each light emitting diode 252 is currently covered with the resin layer 261 whose surface is nearly flat, the selective attraction of the light emitting diode 252 by the attracting device 267 can be facilitated.

Figure 41:
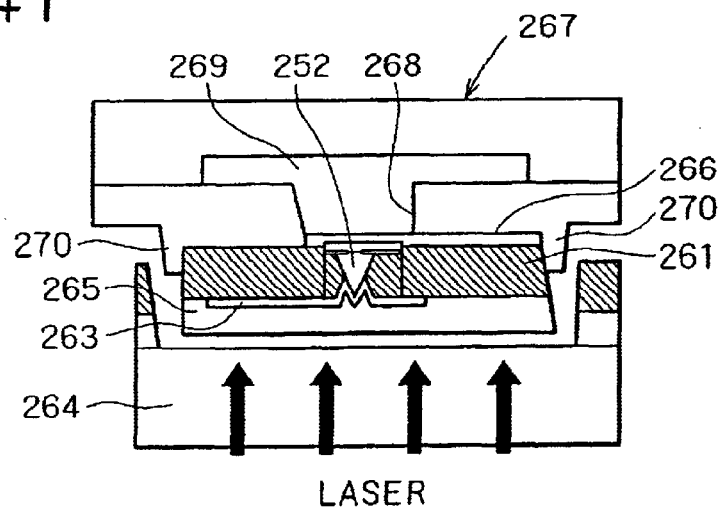
FIG. 41 is a schematic sectional view showing one example of the attracting device provided with a mechanism for preventing a positional deviation of the device.

To stably hold the light emitting diode 252 (resin molded chip) at a specific position at the time of attraction of the device 252 by vacuum suction, a mechanism preventing a positional deviation of the device 252 is preferably formed on the attracting device 267. FIG. 41 shows one example of the attracting device 267 provided with a mechanism 270 for preventing a positional deviation of the device 252. In this example, the device positional deviation preventing mechanism 270 is configured as a positioning pin which is in contact with a peripheral plane of the resin molded chip. By the contact of the mechanism 270 with the peripheral plane (the cut plane of the resin layer 262 cut by laser dicing) of the resin molded chip, the attracting device 267 is accurately positioned to the resin molded chip (i.e., the light emitting diode 252). The cut plane of the resin layer 261 cut by laser dicing is not a perfectly vertical plane but is a vertical plane having a taper of about 5° to about 10°. Accordingly, the positioning pin (that is, the device positional deviation preventing mechanism 270) may be set to have the same taper. With this configuration, even if a slight positional deviation occurs between the attracting device 267 and the light emitting diode 252, such a positional deviation can be readily corrected.

The peeling of the light emitting diode 252 can be smoothly performed by combination of the attraction of the device 252 by the attracting device 267 and peeling of the resin molded chip by laser abrasion. The laser abrasion is performed by irradiation of a laser beam from a back side of the third temporarily holding member 264. By such laser abrasion, peeling occurs at a boundary between the third temporarily holding member 264 and the adhesive 265.

Figure 42:
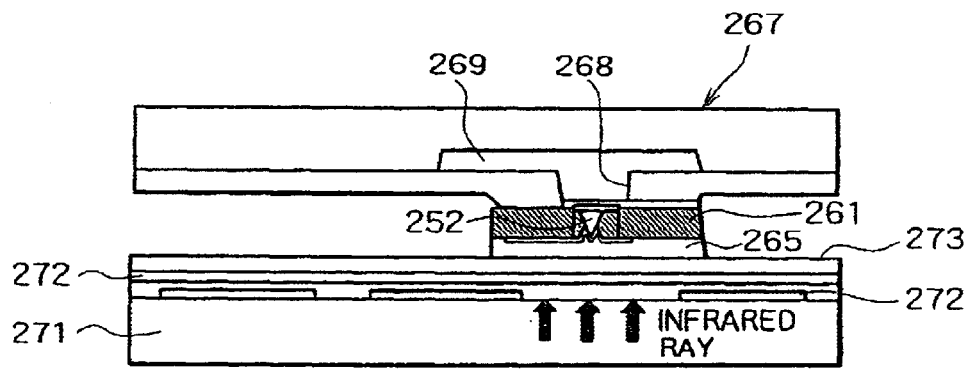
FIG. 42 is a schematic sectional view showing a step of transferring the light emitting diode to a second substrate.

FIG. 42 is a view showing a state when the light emitting diode 252 is transferred to a second substrate 271. The second substrate 271 is a wiring substrate having a wiring layer 272. An adhesive layer 273 is previously formed on the second substrate 271 for mounting the light emitting diode 252. By hardening a portion, corresponding to the light emitting diode 252, of the adhesive layer 273, the light emitting diode 252 can be fixedly arrayed on the second substrate 271. At the time of this mounting, the pressure of the attracting chamber 269 of the attracting device 267 becomes high, thereby releasing the attraction of the light emitting diode 252 to the attracting device 267. The adhesive layer 273 is made from an UV-curing type adhesive, a thermosetting adhesive, a thermoplastic adhesive, or the like. In addition, the light emitting diodes 252 thus arrayed on the second substrate 271 are spaced from each other with an array pitch larger than an array pitch of the light emitting diodes 252 held on the third temporarily holding member 264. An energy for hardening the resin of the adhesive layer 273 is given from the back side of the second substrate 271. A portion, corresponding to the light emitting diode 252, of the adhesive layer 273 may be hardened by irradiation of ultraviolet rays if the adhesive layer 273 is made from an UV-curing type adhesive, or by heating using infrared rays if the adhesive layer 273 is made from a thermosetting adhesive. If the adhesive layer 273 is made from a thermoplastic adhesive, the adhesive is melted by irradiation of infrared rays or a laser beam, or the like, thereby bonding the light emitting diode 252 thereto.

Figure 43:
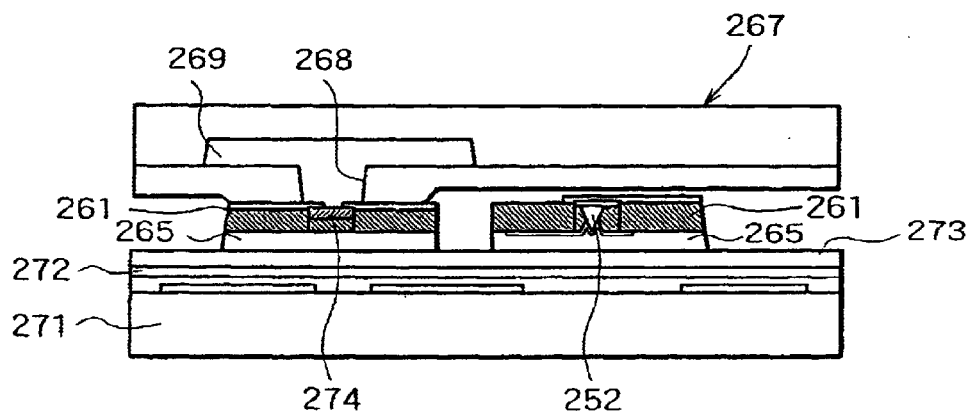
FIG. 43 is a schematic sectional view showing a step of transferring another kind of light emitting diode to the second substrate.

FIG. 43 is a view showing a process of arraying light emitting diodes 274 of two colors on the second substrate 271. By mounting the light emitting diodes of a number of colors on the second substrate 271 at positions separated from each other such as to correspond to the colors by using the attracting device 267 shown in FIGS. 40 and 41, a pixel composed of the light emitting diodes of the number of colors can be formed with a fixed pixel pitch. The shapes of the light emitting diodes 252 and 274 are not necessarily identical to each other. In the example shown in FIG. 43, the red light emitting diode 274, which has a planar structure having no hexagonal pyramid shaped GaN layer, is different in shape from the other light emitting diodes 252. However, in this stage, each of the light emitting diodes 252 and 274 has been already covered with the resin layer 261 and the adhesive 265 to be thus formed into a resin molded chip, and therefore, the light emitting diodes 252 and 274 can be handled in the same manner irrespective of the difference in device structure.

Figure 44:
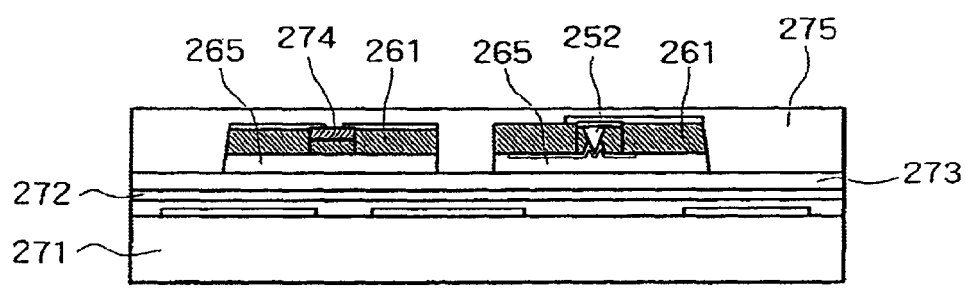
FIG. 44 is a schematic sectional view showing a step of forming an insulating layer.
Figure 45:
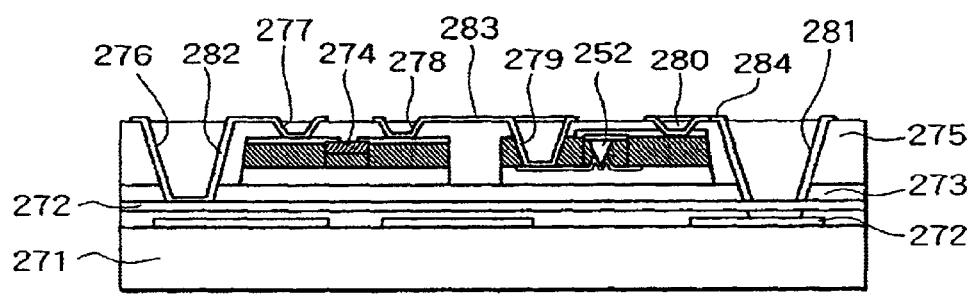
FIG. 45 is a schematic sectional view showing a step of forming wiring.

As shown in FIG. 44, an insulating layer 275 is formed such as to cover the light emitting diodes 252 and 274 which are in the forms of the resin molded chips. The insulating layer 275 may be made from a transparent epoxy type adhesive, an UV-curing type adhesive, polyimide, or the like. The formation of the insulating layer 275 is followed by formation of wiring. FIG. 45 is a view showing a wiring forming step, in which openings 276, 277, 278, 279, 280, and 281 are formed in the insulating layer 275, and wiring portions 282, 283, and 284 for connecting electrode pads for anodes and cathodes of the light emitting diodes 252 and 274 to the wiring layer 272 of the second substrate 271 are formed. Since the areas of the electrode pads of the light emitting diodes 252 and 274 are large, the shapes of the openings, that is, via-holes can be made large. As a result, the positioning accuracy of each via-hole may be made rough as compared with a via-hole directly formed in each light emitting diode. For example, since each of the electrode pads has a size of about 60 μm square as described above, the via-hole having a diameter of about 20 μm can be formed. The via-holes are of three kinds connected to the wiring substrate, the anode electrode, and the cathode electrode. The depth of each via-hole is optimized by controlling a pulse number of a laser beam depending on the kind of via-hole.

Figure 46:
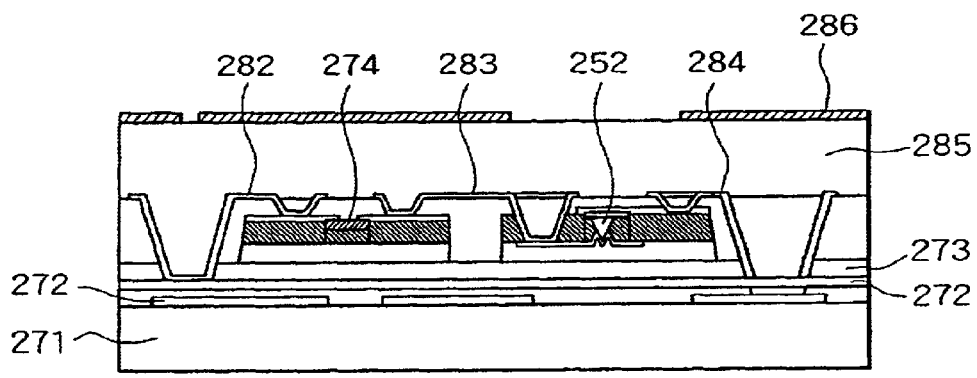
FIG. 46 is a schematic sectional view showing a step of forming a protective layer and a black mask.

As shown in FIG. 46, a protective layer 285 is formed on the wiring, followed by formation of a black mask 286, to accomplish a panel of an image display unit. The protective layer 285 may be made from the same transparent epoxy adhesive or the like as that used for the insulating layer 276 shown in FIG. 40. The protective layer 285 is heated to be hardened, to perfectly cover the wiring. After that, a driver IC is connected to the wiring at the end portion of the panel, thereby producing a drive panel.

In the above-described method of arraying light emitting devices, since the light emitting diodes 252 are enlargedly spaced from each other when they are held by the temporarily holding members 259 and 264, the relatively large electrode pads 263 and 266 and the like can be provided by making use of the enlarged pitch of the devices 252. Since the wiring is performed by making use of the relatively large electrode pads 263 and 266, even if the size of the final unit is significantly large as compared with the device size, the wiring can be easily formed. Also, according to the method of arraying light emitting devices in this embodiment, since each of the light emitting diodes 252 is covered with the hardened resin layer 261, the electrode pads 263 and 266 can be accurately formed on the flattened surfaces of the resin layer 261 and can extend to a region wider than the device size. Thus, the handling of the electrode pads 263 and 266 is facilitated by using the attracting jig in the second transfer step.

In the above embodiment, the display unit is fabricated by a combination of light emitting diodes allowing emission of light of red, blue and green. However, the display unit can be fabricated by a combination of light emitting diodes allowing emission of light of other colors, for example, two colors or four or more colors. The light emitting devices of the present invention are not limited to light emitting diodes but may be semiconductor laser devices, or a combination of semiconductor laser devices and light emitting diodes (LEDs). For example, dummy devices for controlling emission wavelengths may be formed for semiconductor laser devices. The purpose of provision of dummy devices is not limited to control of emission wavelengths. For example, dummy devices may be provided for protecting devices. The stacking order of substrates on which semiconductor light emitting diodes of respective colors are mounted can be freely changed.

As described above, according to an embodiment of the display unit of the present invention, since one conductive layer is formed in self-alignment on planes grown from the tilt planes, at the time of formation of electrodes, device isolation is eliminated or easily formed. As a result, it is possible to reduce the number of steps needed for fabricating the display unit. Also, since emission wavelengths of light emitting devices are controlled by dummy devices, the light emitting devices having a number of emission wavelengths can be formed on the same base body by the same fabrication process. Further, a full-color display unit having a large screen and a high resolution can be realized by forming devices of each of emission wavelengths on one of separate substrates such that the devices on the separate substrates are offset from each other, and stacking the separate substrates to each other in the light emergence direction.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A display unit, comprising:
   a plurality of semiconductor light emitting devices arrayed on a base body;
   wherein each of said plurality of semiconductor light emitting devices is formed by selective growth and has a structure such that at least a periphery thereof is surrounded by planes grown from tilt planes tilted from a principal plane of said base body; and
   one conductive layer is formed in self-alignment on the planes grown from said tilt planes.

2. A display unit according to claim 1, wherein at least one of the planes grown from said tilt planes formed by said selective growth in each of said plurality of semiconductor light emitting devices includes an S-plane and a plane substantially equivalent thereto.

3. A display unit according to claim 1, wherein said one conductive layer is formed in self-alignment such as to be terminated on an insulating film used as a mask for said selective growth.

4. A display unit, comprising:
   a plurality of semiconductor light emitting devices; and
   a dummy device, formed together with each of said semiconductor light emitting devices, for determining an emission wavelength of said semiconductor light emitting device.

5. A display unit according to claim 4, wherein said dummy device is disposed around each of said semiconductor light emitting devices.

6. A display unit according to claim 4, wherein an emission wavelength of each of said semiconductor light emitting devices is changed depending on a distance between said semiconductor light emitting device and said dummy device.

7. A display unit according to claim 4, wherein an emission wavelength of each of said semiconductor light emitting devices is changed depending on a shape of said semiconductor light emitting device.

8. A display unit according to claim 4, wherein each of said semiconductor light emitting devices is made from a nitride based semiconductor.

9. A display unit according to claim 4, wherein said nitride based semiconductor is a GaN based semiconductor.

10. A display unit according to claim 4, wherein said semiconductor light emitting devices are formed on one of a sapphire substrate and a silicon substrate.

11. A display unit, comprising:
    at least two kinds of semiconductor light emitting devices having different emission wavelengths, which are formed from a common crystal growth layer formed on a common surface of a base body;
    wherein electrodes on said base body side form a common electrode;
    wherein an emission wavelength of one of said semiconductor light emitting devices is different from that of another of said semiconductor light emitting devices based on at least one of a difference between said two semiconductor light emitting devices in positional relationship between said semiconductor light emitting device and a dummy device and a difference between said two semiconductor light emitting devices in shape of said semiconductor light emitting device.

12. A display unit, comprising:
    a plurality of semiconductor light emitting devices arrayed on a base body;
    wherein each semiconductor light emitting device has a light permeable region that is formed in a boundary region between two of said plurality of semiconductor light emitting devices;
    wherein at least two of said base bodies are provided, and a plurality of semiconductor light emitting devices allowing emission of light of a single color are arrayed on each of said base bodies; and
    said at least two base bodies are overlapped relative to each other in a light emergence direction.

13. A display unit according to claim 12, wherein wiring portions, which are connected to said semiconductor light emitting devices on said at least two base bodies, are overlapped relative to each other in said light emergence direction.

14. A display unit according to claim 12, wherein said semiconductor light emitting devices are not overlapped relative to each other in said light emergence direction.

15. A display unit according to claim 14, wherein a circuit portion is disposed in a space formed between adjacent two of said base bodies at a position on a back side of said semiconductor light emitting device in a light emergence direction.

16. A display unit according to claim 15, wherein said circuit portion comprises a drive circuit.

17. A display unit according to claim 14, wherein an optical element is provided on said base body on a front side such as to face said semiconductor light emitting device on said base body on a rear side in said light emergence direction.

18. A display unit according to claim 16, wherein said optical element is a lens.

19. A semiconductor light emitting device, comprising:
    dummy devices, which are formed around said semiconductor light emitting device.

20. A semiconductor light emitting device according to claim 19, wherein an emission wavelength of said semiconductor light emitting device is changed depending on a distance between each of said dummy devices and said semiconductor light emitting device.

21. A semiconductor light emitting device according to claim 19, wherein an emission wavelength of said semiconductor light emitting device is changed depending on a shape of said semiconductor light emitting device.

22. A semiconductor light emitting device according to claim 19, wherein said semiconductor light emitting device is made from a nitride based semiconductor.

23. A semiconductor light emitting device according to claim 22, wherein said nitride based semiconductor is a GaN based semiconductor.

24. A semiconductor light emitting device according to claim 19, wherein said semiconductor light emitting device is formed, together with said dummy devices, on one of a sapphire substrate and a silicon substrate.

* * * * *